US012756948B2

(12) United States Patent
Imoto et al.

(10) Patent No.: US 12,756,948 B2
(45) Date of Patent: Oct. 6, 2026

(54) LIGHT DETECTION ELEMENT, ELECTRONIC DEVICE, AND MANUFACTURING METHOD OF LIGHT DETECTION ELEMENT

(71) Applicant: Sony Semiconductor Solutions Corporation, Kanagawa (JP)

(72) Inventors: Tsutomu Imoto, Kanagawa (JP); Yusuke Ikeda, Tokyo (JP); Ren Hiyoshi, Kanagawa (JP); Hirotsugu Takahashi, Kanagawa (JP); Tatsuro Inoue, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 61 days.

(21) Appl. No.: 18/998,688

(22) PCT Filed: Jul. 21, 2023

(86) PCT No.: PCT/JP2023/026705
§ 371 (c)(1),
(2) Date: Jan. 27, 2025

(87) PCT Pub. No.: WO2024/034352
PCT Pub. Date: Feb. 15, 2024

(65) Prior Publication Data
US 2026/0149893 A1 May 28, 2026

(30) Foreign Application Priority Data
Aug. 10, 2022 (JP) ................................ 2022-128513

(51) Int. Cl.
*H04N 25/47* (2023.01)
*H04N 25/707* (2023.01)
(Continued)

(52) U.S. Cl.
CPC .......... *H04N 25/47* (2023.01); *H04N 25/707* (2023.01); *H04N 25/778* (2023.01); *H04N 25/78* (2023.01); *H10F 39/12* (2025.01)

(58) Field of Classification Search
CPC .... H04N 25/47; H04N 25/707; H04N 25/778; H04N 25/78; H10F 39/12
See application file for complete search history.

(56) References Cited

U.S. PATENT DOCUMENTS

2021/0250528 A1* 8/2021 Kim .................... H03F 3/45179

FOREIGN PATENT DOCUMENTS

WO 2020100663 A1 5/2020
WO 2021261069 A1 12/2021

OTHER PUBLICATIONS

International Search Report (PCT/ISA/210), International Application No. PCT/JP2023/026705, dated Sep. 26, 2023.

* cited by examiner

*Primary Examiner* — Tony Ko
(74) *Attorney, Agent, or Firm* — Michael Best & Friedrich LLP

(57) ABSTRACT

Light detection elements with improved detection sensitivity are disclosed. In one example, a light detection element includes a light reception section that generates a charge according to an amount of received light; a voltage conversion section that acquires the charge via an input node, converts the charge into a voltage signal, and outputs the voltage signal from an output node; a signal amplification section that amplifies the voltage signal; and a comparison section that compares the amplified voltage signal with a predetermined voltage. The voltage conversion section includes an amplification circuit connected between the input node and the output node; and a feedback circuit connected between the input node and the output node, and
(Continued)

a gate insulating film of at least one transistor included in the feedback circuit is thicker than gate insulating films of transistors included in the signal amplification section and the comparison section.

18 Claims, 41 Drawing Sheets

(51) Int. Cl.
*H04N 25/778* (2023.01)
*H04N 25/78* (2023.01)
*H10F 39/12* (2025.01)

LIGHT DETECTION ELEMENT, ELECTRONIC DEVICE, AND MANUFACTURING METHOD OF LIGHT DETECTION ELEMENT

TECHNICAL FIELD

Embodiments according to the present disclosure relate to a light detection element, an electronic device, and a manufacturing method of a light detection element.

BACKGROUND ART

There is known an imaging device that, only when some event occurs in an imaging scene, acquires data of a portion in which a luminance level has changed due to the event. This type of imaging device is sometimes referred to as an event base vision sensor (EVS) (see Patent Document 1).

CITATION LIST

Patent Document

Patent Document 1: US 2021/250,528 A

SUMMARY OF THE INVENTION

Problems to be Solved by the Invention

However, in the EVS, high detection sensitivity is desired.

Therefore, the present disclosure provides a light detection element, an electronic device, and a manufacturing method of a light detection element capable of improving detection sensitivity.

Solutions to Problems

In order to solve the above problem, according to the present disclosure, provided is a light detection element including:

a light reception section that generates a charge according to an amount of received light;

a voltage conversion section that acquires the charge generated in the light reception section via an input node, converts the charge into a voltage signal, and outputs the voltage signal from an output node;

a signal amplification section that amplifies the voltage signal; and a comparison section that compares a voltage of the voltage signal amplified by the signal amplification section with a predetermined voltage, in which the voltage conversion section includes:

an amplification circuit connected between the input node and the output node; and a feedback circuit connected between the input node and the output node, and a gate insulating film of at least one transistor included in the feedback circuit is thicker than gate insulating films of transistors included in the signal amplification section and the comparison section.

A subthreshold slope of at least one transistor included in the feedback circuit is higher than subthreshold slopes of transistors included in the signal amplification section and the comparison section.

The amplification circuit may include:

a second transistor connected between the output node and a first reference voltage node and including a gate electrically connected to the input node; and a current source connected between the output node and a second reference voltage node different from the first reference voltage node, and a gate insulating film of at least one transistor included in the feedback circuit may be thicker than a gate insulating film of the second transistor.

The amplification circuit may include:

a second transistor connected between the output node and a first reference voltage node and including a gate electrically connected to the input node; and a current source connected between the output node and a second reference voltage node different from the first reference voltage node, and a subthreshold slope of at least one transistor included in the feedback circuit may be higher than a subthreshold slope of the second transistor.

The feedback circuit may include a first transistor connected between the input node and a third reference voltage node and including a gate electrically connected to the output node.

The feedback circuit may further include a third transistor connected between the input node and the first transistor, and the third transistor amplifies a voltage of a node between the first transistor and the third transistor and outputs the amplified voltage to the input node.

The amplification circuit may include:

a second transistor connected between the output node and a first reference voltage node and including a gate electrically connected to the input node; and a current source connected between the output node and a second reference voltage node different from the first reference voltage node, and a channel length of the first transistor may be shorter than a channel length of the second transistor.

A length of the gate electrode of the first transistor in a channel length direction may be shorter than a length of the gate electrode of the second transistor in the channel length direction.

The first transistor may include at least one of a source extension provided so as to extend from a source layer toward a drain layer and having an impurity concentration lower than an impurity concentration of the source layer, and a drain extension provided so as to extend from the drain layer toward the source layer and having an impurity concentration lower than an impurity concentration of the drain layer, and the source extension and the drain extension may be disposed so as to overlap the gate electrode of the first transistor when viewed from a direction substantially perpendicular to a substrate surface on which the first transistor is provided.

A first transfer transistor that is connected between the light reception section and the input node and transfers the charge generated by the light reception section to the input node may be further included, and a gate insulating film of at least one transistor included in the feedback circuit may be thicker than a gate insulating film of the first transfer transistor.

A charge accumulation section that stores a charge and a second transfer transistor that is connected between the light reception section and the charge accumulation section and transfers the charge generated by the light reception section to the charge accumulation section may be further included, and a gate insulating film of at least one transistor included in the feedback circuit may be thicker than a gate insulating film of the second transfer transistor.

The amplification circuit may include:

a second transistor connected between the output node and a first reference voltage node and including a gate electrically connected to the input node; and a current source connected between the output node and a second reference voltage node different from the first reference voltage node, and a gate insulating film of the second transistor may be thicker than gate insulating films of transistors included in the signal amplification section and the comparison section.

An end portion on a substrate side of the gate insulating film of at least one transistor included in the feedback circuit may be located closer to the substrate side than an end portion on the substrate side of a gate insulating film of a transistor included in the amplification circuit.

The amplification circuit may include:

a second transistor connected between the output node and a first reference voltage node and including a gate electrically connected to the input node; and a current source connected between the output node and a second reference voltage node different from the first reference voltage node, and the light detection element may further include:

a first semiconductor chip on which the light reception section, the feedback circuit, and the second transistor are disposed; and a second semiconductor chip stacked on the first semiconductor chip and on which the current source, the signal amplification section, and the comparison section are disposed.

A thickness of the gate insulating film of at least one transistor included in the feedback circuit may be 5 nm or more.

A threshold slope of at least one transistor included in the feedback circuit may be 100 mV/decade or more.

According to the present disclosure, an electronic device including the light detection element is provided.

According to the present disclosure, there is provided a manufacturing method of a light detection element including:

a light reception section that generates a charge according to an amount of received light;

a voltage conversion section that acquires the charge generated in the light reception section via an input node, converts the charge into a voltage signal, and outputs the voltage signal from an output node;

a signal amplification section that amplifies the voltage signal; and a comparison section that compares a voltage of the voltage signal amplified by the signal amplification section with a predetermined voltage, the voltage conversion section including:

an amplification circuit connected between the input node and the output node; and a feedback circuit connected between the input node and the output node, and a gate insulating film of at least one transistor included in the feedback circuit being thicker than gate insulating films of transistors included in the signal amplification section and the comparison section, the manufacturing method including forming the gate insulating film of at least one transistor included in the feedback circuit by local oxidation of silicon (LOCOS).

MODE FOR CARRYING OUT THE INVENTION

Hereinafter, embodiments of a light detection element, an electronic device, and a manufacturing method of the light detection element will be described with reference to the drawings. Hereinafter, the main components of the light detection element, the electronic device, and the manufacturing method of the light detection element will be mainly described, but the light detection element, the electronic device, and the manufacturing method of the light detection element may include components and functions that are not illustrated or described. The following description does not exclude the components and functions that are not illustrated or described.

Figure 1:
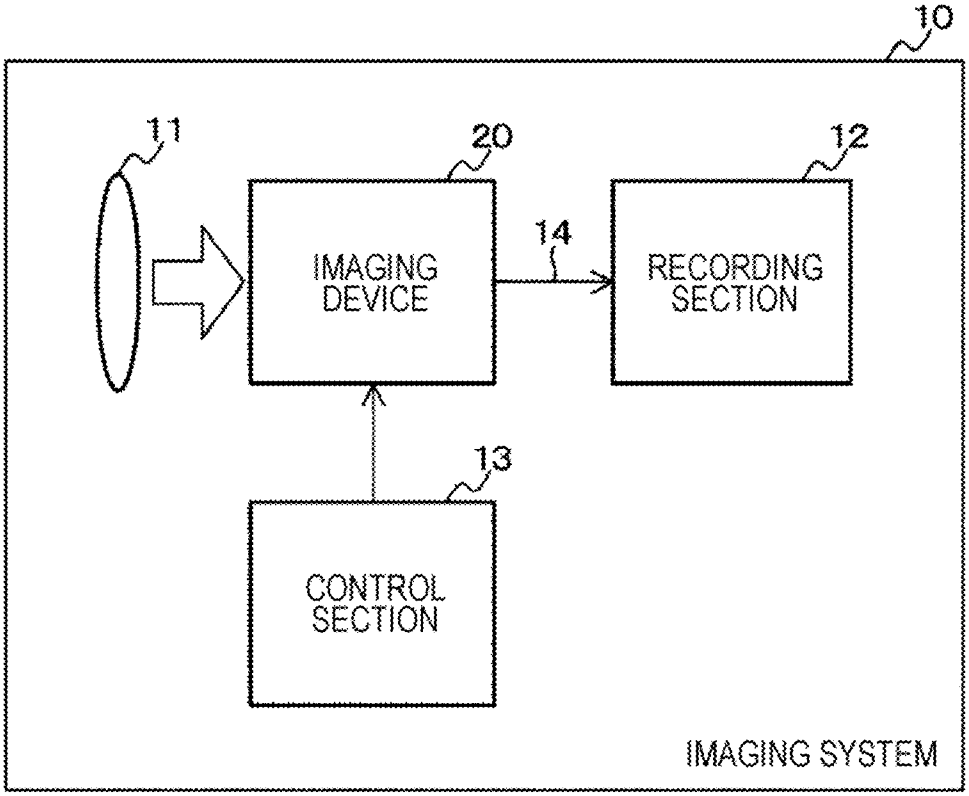
FIG. 1 is a block diagram illustrating an example of a system configuration of an imaging system to which a technology according to the present disclosure is applied.

FIG. 1 is a block diagram illustrating an example of a system configuration of an imaging system to which a technology according to the present disclosure is applied.

As illustrated in FIG. 1, an imaging system 10 to which the technology according to the present disclosure is applied includes an imaging lens 11, an imaging device 20, a recording section 12, and a control section 13. The imaging system 10 is an example of an electronic device of the present disclosure, and examples of the electronic device include a camera system mounted on an industrial robot, a vehicle-mounted camera system, and the like.

In the imaging system 10 having the above configuration, the imaging lens 11 captures incident light from a subject and forms an image on an imaging surface of the imaging device 20. The imaging device 20 photoelectrically converts the incident light captured by the imaging lens 11 in units of pixels to acquire imaging data. As the imaging device 20, an imaging device of the present disclosure described later is used.

The imaging device 20 performs predetermined signal processing such as image recognition processing on captured image data, and outputs data indicating a processing result and a detection signal (Hereinafter, it may be simply described as a "detection signal".) of an address event to be described later to the recording section 12. A generation method of the detection signal of the address event will be described later. The recording section 12 stores data supplied from the imaging device 20 via a signal line 14. The control section 13 includes, for example, a microcomputer, and controls an imaging operation in the imaging device 20.

[Imaging Device According to First Configuration Example (Arbiter Method)]

Figure 2:
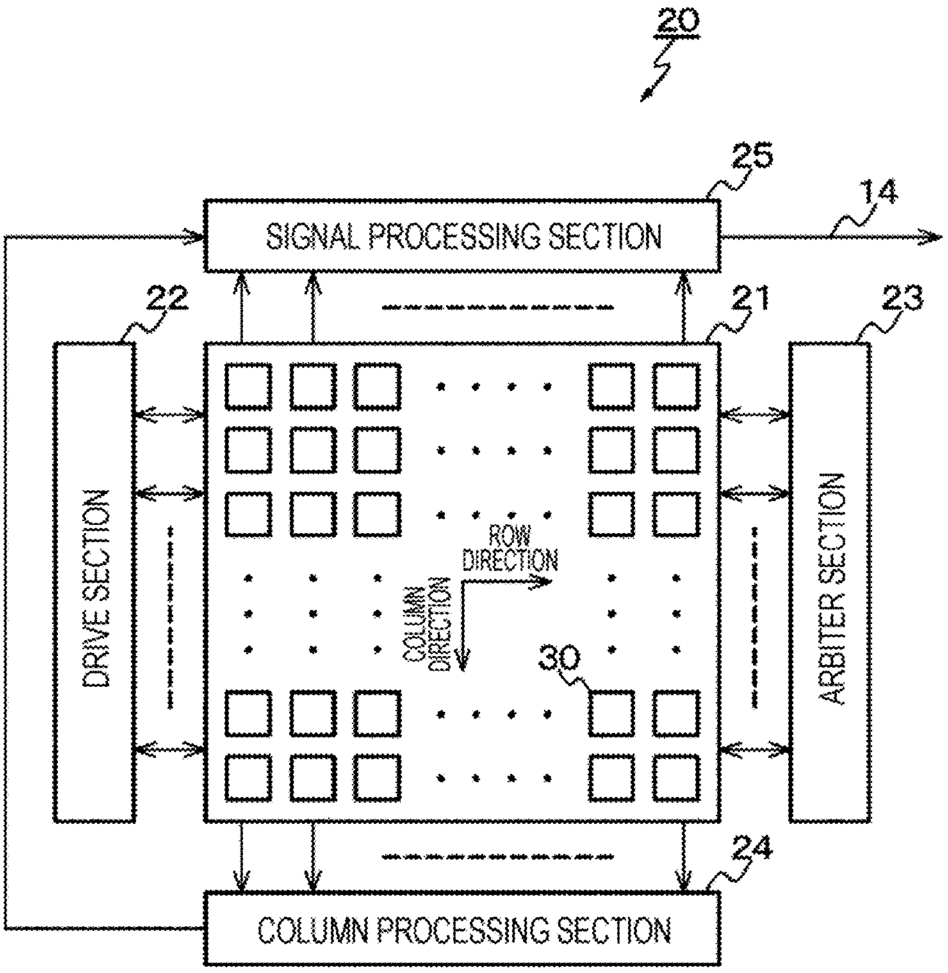
FIG. 2 is a block diagram illustrating an example of a configuration of an imaging device according to a first configuration example of the present disclosure.

FIG. 2 is a block diagram illustrating an example of a configuration of an imaging device according to a first configuration example used as the imaging device 20 in the imaging system 10 to which the technology according to the present disclosure is applied.

As illustrated in FIG. 2, the imaging device 20 according to the first configuration example as the imaging device of the present disclosure is an asynchronous imaging device called DVS, and includes a pixel array section 21, a drive section 22, an arbiter section (arbitration section) 23, a column processing section 24, and a signal processing section 25.

In the imaging device 20 having the above configuration, a plurality of pixels 30 is two-dimensionally arranged in a matrix (array) in the pixel array section 21. A vertical signal line VSL to be described later is wired for each pixel column with respect to this matrix-like pixel array.

Each of the plurality of pixels 30 generates an analog signal of a voltage corresponding to a photocurrent as a pixel signal. Furthermore, each of the plurality of pixels 30 detects the presence or absence of an address event depending on whether or not a change amount of the photocurrent exceeds a predetermined threshold value. Then, when the address event occurs, the pixel 30 outputs a request to the arbiter section 23.

The drive section 22 drives each of the plurality of pixels 30 to output a pixel signal generated in each pixel 30 to the column processing section 24.

The arbiter section 23 arbitrates a request from each of the plurality of pixels 30 and transmits a response based on an arbitration result to the pixel 30. The pixel 30 that has received the response from the arbiter section 23 supplies a detection signal (detection signal of the address event) indicating a detection result to the drive section 22 and the signal processing section 25. The reading of the detection signal from the pixel 30 can be performed by reading a plurality of rows.

The column processing section 24 includes, for example, an analog-to-digital converter, and performs processing of converting an analog pixel signal output from the pixel 30 of the column into a digital signal for each pixel column of the pixel array section 21. Then, the column processing section 24 supplies the analog-digital converted digital signal to the signal processing section 25.

The signal processing section 25 performs predetermined signal processing such as correlated double sampling (CDS) processing or image recognition processing on the digital signal supplied from the column processing section 24. Then, the signal processing section 25 supplies the data indicating a processing result and the detection signal supplied from the arbiter section 23 to the recording section 12 (see FIG. 1) via the signal line 14.

[Configuration Example of Pixel Array Section]

Figure 3:
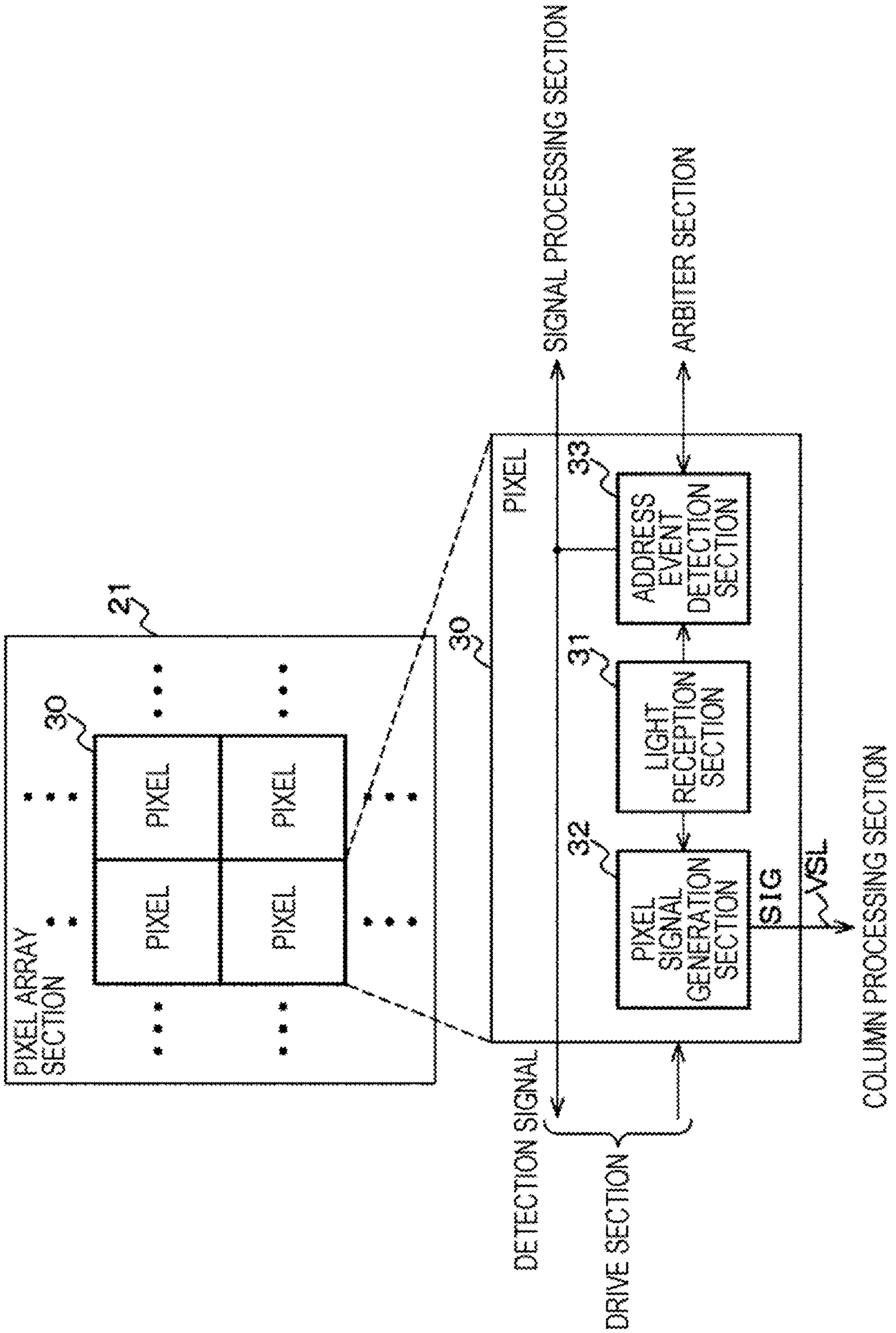
FIG. 3 is a block diagram illustrating an example of a configuration of a pixel array section.

FIG. 3 is a block diagram illustrating an example of a configuration of the pixel array section 21.

In the pixel array section 21 in which the plurality of pixels 30 is two-dimensionally arranged in a matrix, each of the plurality of pixels 30 includes a light reception section 31, a pixel signal generation section 32, and an address event detection section 33.

In the pixel 30 having the above configuration, the light reception section 31 photoelectrically converts incident light to generate a photocurrent. Then, the light reception section 31 supplies the photocurrent generated by photoelectric conversion to either the pixel signal generation section 32 or the address event detection section 33 under the control of the drive section 22 (see FIG. 2).

The pixel signal generation section 32 generates a signal of a voltage according to the photocurrent supplied from the light reception section 31 as a pixel signal SIG, and supplies the generated pixel signal SIG to the column processing section 24 (see FIG. 2) via the vertical signal line VSL.

The address event detection section 33 detects the presence or absence of an address event depending on whether or not a change amount of the photocurrent from each of the light reception sections 31 exceeds a predetermined threshold value. The address event includes, for example, an on-event indicating that the change amount of the photocurrent exceeds an upper limit threshold value and an off-event indicating that the change amount falls below a lower limit threshold value. Furthermore, the detection signal of the address event includes, for example, one bit indicating the detection result of the on-event and one bit indicating the detection result of the off-event. Note that the address event detection section 33 can be configured to detect only an on-event.

When an address event occurs, the address event detection section 33 supplies a request for requesting transmission of the detection signal of the address event to the arbiter section 23 (see FIG. 2). Then, upon receiving a response to the request from the arbiter section 23, the address event detection section 33 supplies the detection signal of the address event to the drive section 22 and the signal processing section 25.

[Example of Circuit Configuration of Pixel]

Figure 4:
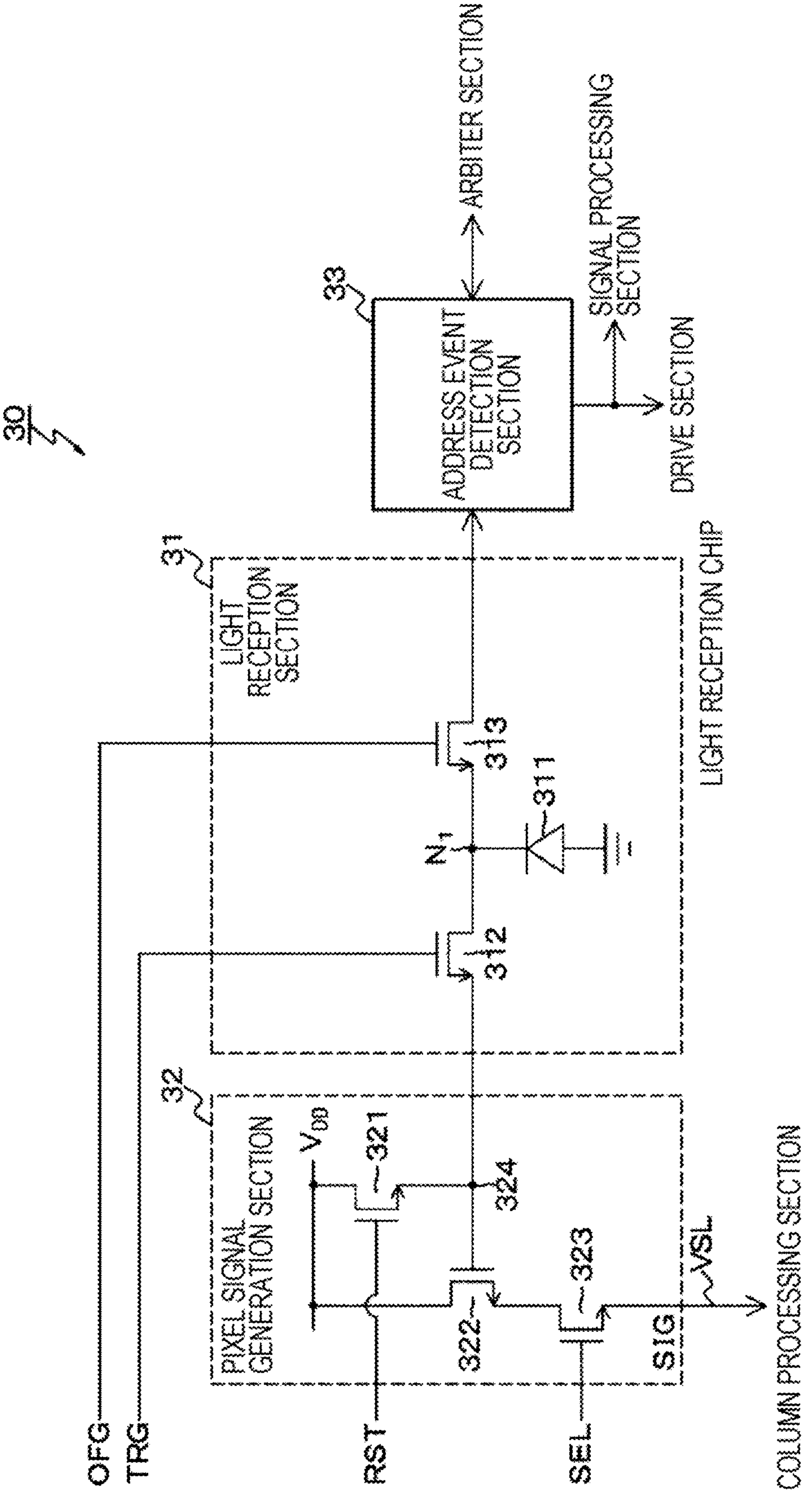
FIG. 4 is a circuit diagram illustrating an example of a circuit configuration of a pixel.

FIG. 4 is a circuit diagram illustrating an example of a circuit configuration of the pixel 30. As described above, each of the plurality of pixels 30 includes the light reception section 31, the pixel signal generation section 32, and the address event detection section 33.

In the pixel 30 having the above configuration, the light reception section 31 includes a light reception element (photoelectric conversion element) 311, a transfer transistor 312, and an over flow gate (OFG) transistor 313. For example, N-type metal oxide semiconductor (MOS) transistors are used as the transfer transistor 312 and the OFG transistor 313. The transfer transistor 312 and the OFG transistor 313 are connected in series with each other.

The light reception element 311 is connected between a connection node N1 common to the transfer transistor 312 and the OFG transistor 313, and the ground, and photoelectrically converts the incident light to generate electric charges in an amount according to the amount of the incident light.

A transfer signal TRG is supplied from the drive section 22 illustrated in FIG. 2 to a gate electrode of the transfer transistor 312. The transfer transistor 312 supplies the electric charge photoelectrically converted by the light reception element 311 to the pixel signal generation section 32 in response to the transfer signal TRG.

A control signal OFG is supplied from the drive section 22 to a gate electrode of the OFG transistor 313. In response to the control signal OFG, the OFG transistor 313 supplies an electrical signal generated by the light reception element 311 to the address event detection section 33. The electrical signal supplied to the address event detection section 33 is a photocurrent including charges.

The pixel signal generation section 32 includes a reset transistor 321, an amplification transistor 322, a selection transistor 323, and a floating diffusion layer 324. For example, N-type MOS transistors are used as the reset transistor 321, the amplification transistor 322, and the selection transistor 323.

The electric charge photoelectrically converted by the light reception element 311 is supplied from the light reception section 31 to the pixel signal generation section 32 by the transfer transistor 312. The electric charge supplied from the light reception section 31 is accumulated in the floating diffusion layer 324. The floating diffusion layer 324 generates a voltage signal having a voltage value according to an amount of accumulated electric charges. That is, the floating diffusion layer 324 converts an electric charge into a voltage.

The reset transistor 321 is connected between a power supply line of a power supply voltage VDD and the floating diffusion layer 324. A reset signal RST is supplied from the drive section 22 to a gate electrode of the reset transistor 321. The reset transistor 321 initializes (resets) the amount of electric charges in the floating diffusion layer 324 in response to the reset signal RST.

The amplification transistor 322 is connected in series with the selection transistor 323 between the power supply line of the power supply voltage VDD and the vertical signal line VSL. The amplification transistor 322 amplifies a voltage signal subjected to charge-voltage conversion by the floating diffusion layer 324.

A selection signal SEL is supplied from the drive section 22 to a gate electrode of the selection transistor 323. In response to the selection signal SEL, the selection transistor 323 outputs the voltage signal amplified by the amplification transistor 322 to the column processing section 24 (see FIG. 2) via the vertical signal line VSL as the pixel signal SIG.

In the imaging device 20 including the pixel array section 21 in which the pixels 30 having the above-described configuration are two-dimensionally arranged, when an instruction to start detection of an address event is given by the control section 13 illustrated in FIG. 1, the drive section 22 supplies the control signal OFG to the OFG transistor 313 of the light reception section 31, thereby driving the OFG transistor 313 to supply a photocurrent to the address event detection section 33.

Then, when an address event is detected in a certain pixel 30, the drive section 22 turns off the OFG transistor 313 of the pixel 30 and stops the supply of the photocurrent to the address event detection section 33. Next, the drive section 22 drives the transfer transistor 312 by supplying the transfer signal TRG to the transfer transistor 312, and transfers the charge photoelectrically converted by the light reception element 311 to the floating diffusion layer 324.

In this manner, the imaging device 20 including the pixel array section 21 in which the pixels 30 having the above-described configuration are two-dimensionally arranged outputs only the pixel signal of the pixel 30 in which the address event is detected to the column processing section 24. As a result, regardless of the presence or absence of the address event, the power consumption of the imaging device 20 and the processing amount of the image processing can be reduced as compared with the case of outputting the pixel signals of all the pixels.

Note that the configuration of the pixel 30 exemplified here is an example, and is not limited to this configuration example. For example, a pixel configuration without the pixel signal generation section 32 is also possible. In this pixel configuration, it is only required that the light reception section 31 does not include the OFG transistor 313 and the transfer transistor 312 has the function of the OFG transistor 313.

[First Configuration Example of Address Event Detection Section]

Figure 5:
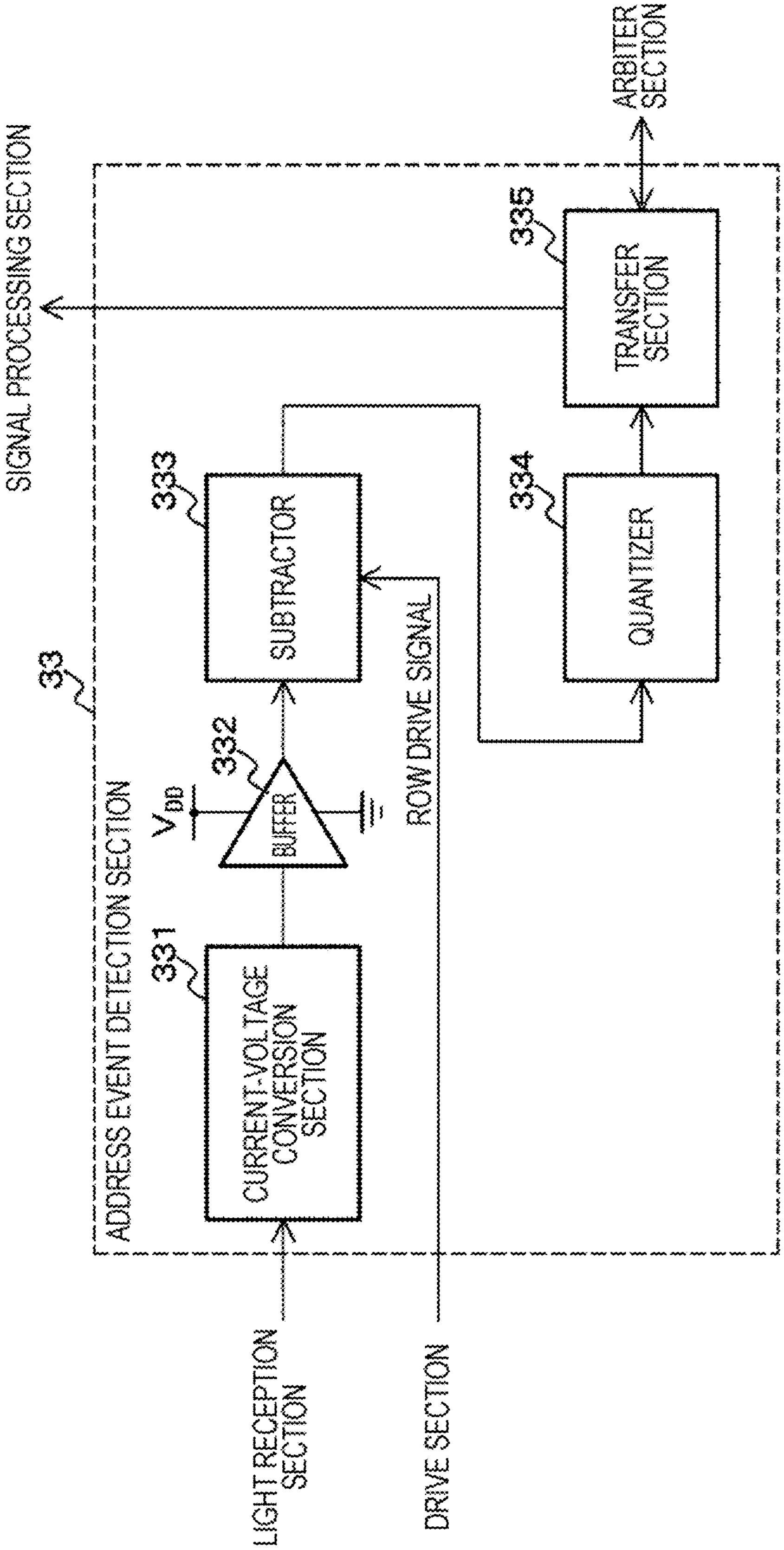
FIG. 5 is a block diagram illustrating a first configuration example of an address event detection section.

FIG. 5 is a block diagram illustrating a first configuration example of the address event detection section 33. As illustrated in FIG. 5, the address event detection section 33 according to the present configuration example includes a current-voltage conversion section 331, a buffer 332, a subtractor 333, a quantizer 334, and a transfer section 335.

The current-voltage conversion section 331 converts the photocurrent from the light reception section 31 of the pixel 30 into a logarithmic voltage signal. The current-voltage conversion section 331 supplies the converted voltage signal to the buffer 332. The buffer 332 buffers the voltage signal supplied from the current-voltage conversion section 331 and supplies the buffered voltage signal to the subtractor 333.

A row drive signal is supplied from the drive section 22 to the subtractor 333. The subtractor 333 lowers the level of the voltage signal supplied from the buffer 332 in accordance with the row drive signal. Then, the subtractor 333 supplies the voltage signal whose level has been lowered to the quantizer 334. The quantizer 334 quantizes the voltage signal supplied from the subtractor 333 into a digital signal and outputs the digital signal to the transfer section 335 as a detection signal of an address event.

The transfer section 335 transfers the detection signal of the address event supplied from the quantizer 334 to the arbiter section 23 or the like. When the address event is detected, the transfer section 335 supplies a request for requesting transmission of the detection signal of the address event to the arbiter section 23. Then, upon receiving a response to the request from the arbiter section 23, the transfer section 335 supplies the detection signal of the address event to the drive section 22 and the signal processing section 25.

Next, configuration examples of the current-voltage conversion section 331, the subtractor 333, and the quantizer 334 in the address event detection section 33 will be described.

(Configuration Example of Current-Voltage Conversion Section)

Figure 6:
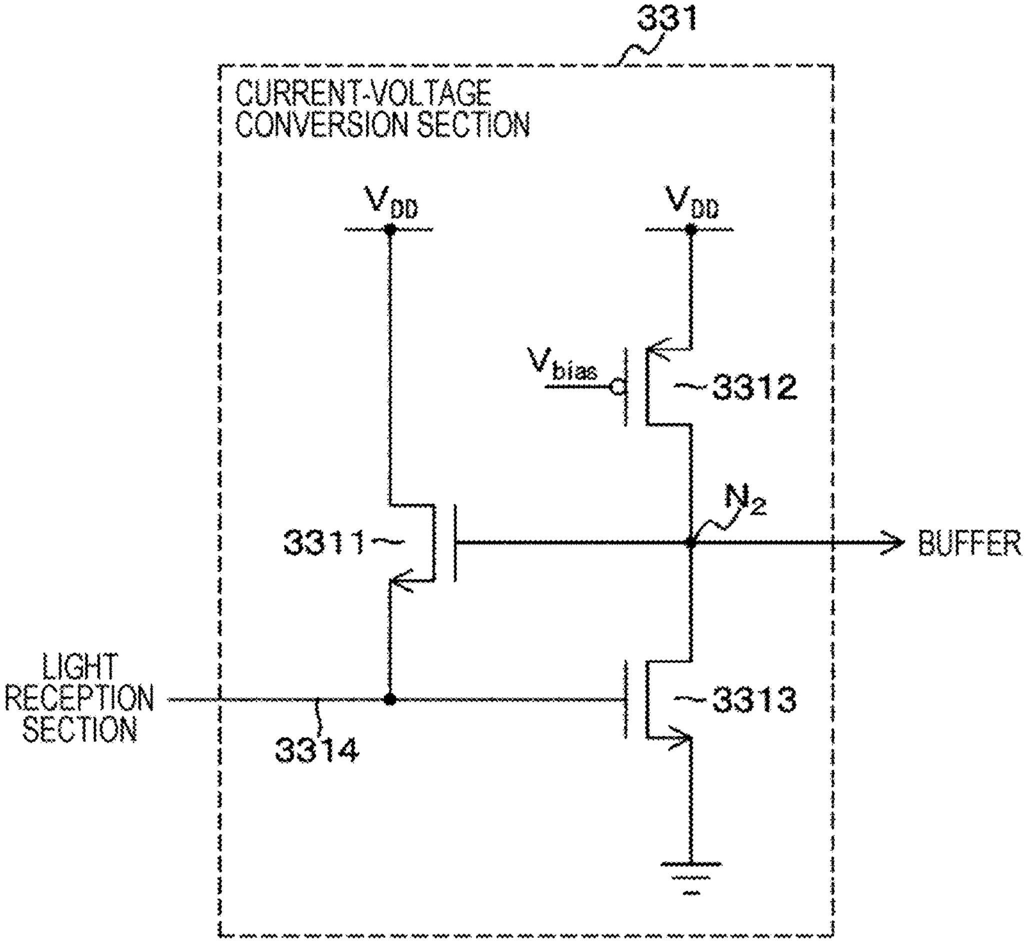
FIG. 6 is a circuit diagram illustrating an example of a configuration of a current-voltage conversion section in the address event detection section.

FIG. 6 is a circuit diagram illustrating an example of a configuration of the current-voltage conversion section 331 in the address event detection section 33. As illustrated in FIG. 6, the current-voltage conversion section 331 according to the present example has a circuit configuration including an N-type transistor 3311, a P-type transistor 3312, and an N-type transistor 3313. For example, MOS transistors are used as these transistors 3311 to 3313.

The N-type transistor 3311 is connected between the power supply line of the power supply voltage VDD and a signal input line 3314. The P-type transistor 3312 and the N-type transistor 3313 are connected in series between the power supply line of the power supply voltage VDD and the ground. Then, a common connection node N2 of the P-type transistor 3312 and the N-type transistor 3313 is connected to a gate electrode of the N-type transistor 3311 and an input terminal of the buffer 332 illustrated in FIG. 5.

A predetermined bias voltage Vbias is applied to a gate electrode of the P-type transistor 3312. As a result, the P-type transistor 3312 supplies a constant current to the N-type transistor 3313. A photocurrent is input from the light reception section 31 to a gate electrode of the N-type transistor 3313 through the signal input line 3314.

Drain electrodes of the N-type transistor 3311 and the N-type transistor 3313 are connected to a power supply side, and such a circuit is called a source follower. The photocurrent from the light reception section 31 is converted into a logarithmic voltage signal by the two source followers connected in a loop.

(Configuration Example of Subtractor and Quantizer)

Figure 7:
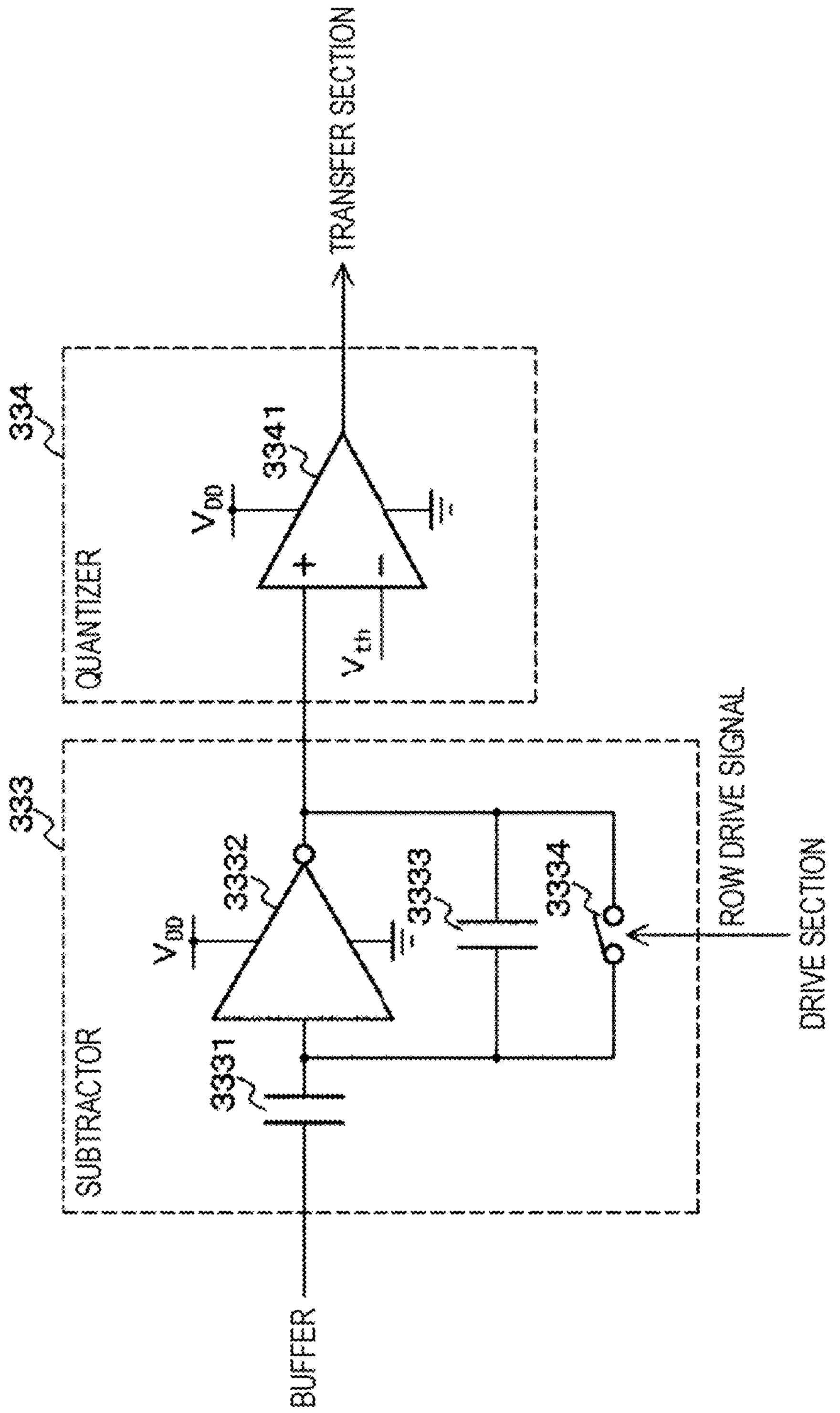
FIG. 7 is a circuit diagram illustrating an example of configurations of a subtractor and a quantizer in the address event detection section.

FIG. 7 is a circuit diagram illustrating an example of configurations of the subtractor 333 and the quantizer 334 in the address event detection section 33.

The subtractor 333 according to the present example includes a capacitive element 3331, an inverter circuit 3332, a capacitive element 3333, and a switch element 3334.

One end of the capacitive element 3331 is connected to an output terminal of the buffer 332 illustrated in FIG. 5, and the other end thereof is connected to an input terminal of the inverter circuit 3332. The capacitive element 3333 is connected in parallel to the inverter circuit 3332. The switch element 3334 is connected between both ends of the capacitive element 3333. A row drive signal is supplied from the drive section 22 to the switch element 3334 as an opening/closing control signal. The switch element 3334 turns on or off a path connecting both ends of the capacitive element 3333 according to the row drive signal. The inverter circuit 3332 inverts the polarity of the voltage signal input via the capacitive element 3331.

In the subtractor 333 having the above configuration, when the switch element 3334 is turned on (closed), a voltage signal Vinit is input to a terminal of the capacitive element 3331 on a buffer 332 side, and a terminal on the opposite side serves as a virtual ground terminal. A potential of the virtual ground terminal is set to zero for convenience. At this time, when a capacitance value of the capacitive element 3331 is C1, an electric charge Qinit accumulated in the capacitive element 3331 is expressed by the following Formula (1). On the other hand, since both ends of the capacitive element 3333 are short-circuited, the capacitive element 3333 has no accumulated electric charges.

$$Qinit = C1 \times Vinit \tag{1}$$

Next, considering a case where the switch element 3334 is turned off (open) and the voltage of the terminal of the capacitive element 3331 on the buffer 332 side changes to Vafter, an electric charge Qafter accumulated in the capacitive element 3331 is expressed by the following Formula (2).

$$Qafter = C1 \times Vafter \tag{2}$$

On the other hand, when a capacitance value of the capacitive element 3333 is C2 and an output voltage is Vout, an electric charge Q2 accumulated in the capacitive element 3333 is expressed by the following Formula (3).

$$Q2 = -C2 \times Vout \tag{3}$$

At this time, since the total electric charge amount of the capacitive element 3331 and the capacitive element 3333 does not change, the following Formula (4) is established.

$$Qinit = Qafter + Q2 \tag{4}$$

When Formulas (1) to (3) are substituted into Formula (4) and rearranged, the following Formula (5) is obtained.

$$Vout = -(C1/C2) \times (Vafter - Vinit) \tag{5}$$

Formula (5) represents a subtraction operation of the voltage signal, and the gain of the subtraction result is C1/C2. Since it is generally desired to maximize the gain, it is preferable to design C1 larger and C2 smaller. On the other hand, when C2 is too small, kTC noise increases, and noise characteristics may deteriorate. Therefore, the decrease in capacitance C2 is limited to a range in which noise can be tolerated. Furthermore, since the address event detection section 33 including the subtractor 333 is mounted for each pixel 30, the capacitive element 3331 and the capacitive element 3333 have area restrictions. In consideration of these, the capacitance values C1 and C2 of the capacitive elements 3331 and 3333 are determined.

In FIG. 7, the quantizer 334 includes a comparator 3341. The comparator 3341 takes an output signal of the inverter circuit 3332, that is, a voltage signal from the subtractor 430 as a non-inverting (+) input, and takes a predetermined threshold voltage Vth as an inverting (−) input. Then, the comparator 3341 compares the voltage signal from the subtractor 430 with the predetermined threshold voltage Vth, and outputs a signal indicating a comparison result to the transfer section 335 as a detection signal of the address event.

[Second Configuration Example of Address Event Detection Section]

Figure 8:
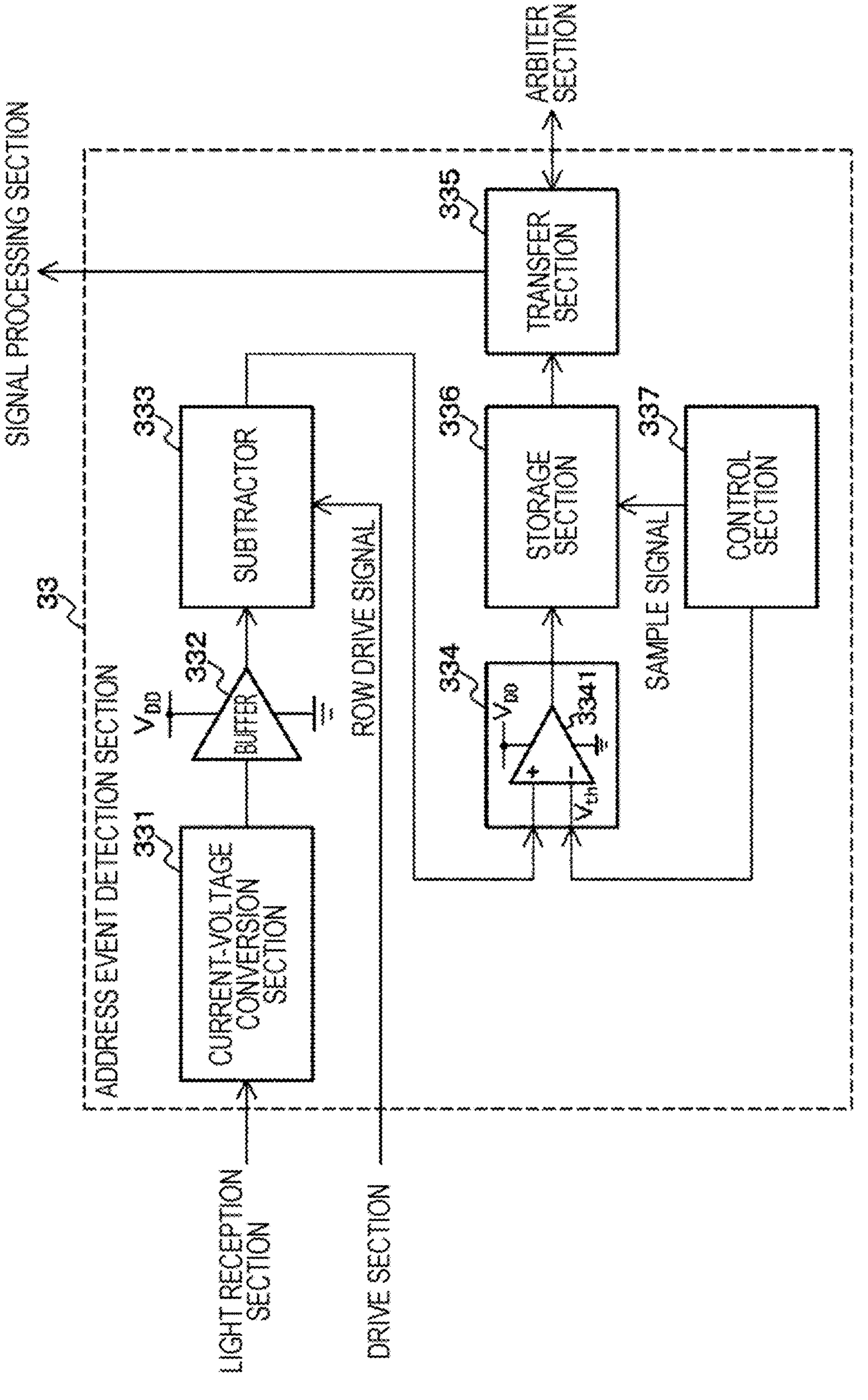
FIG. 8 is a block diagram illustrating a second configuration example of the address event detection section.

FIG. 8 is a block diagram illustrating a second configuration example of the address event detection section 33. As illustrated in FIG. 8, the address event detection section 33 according to the present configuration example includes a storage section 336 and a control section 337 in addition to the current-voltage conversion section 331, the buffer 332, the subtractor 333, the quantizer 334, and the transfer section 335.

The storage section 336 is provided between the quantizer 334 and the transfer section 335, and accumulates an output of the quantizer 334, that is, a comparison result of the comparator 3341 on the basis of a sample signal supplied from the control section 337. The storage section 336 may be a sampling circuit such as a switch, plastic, or a capacitor, or may be a digital memory circuit such as a latch or a flip-flop.

The control section 337 supplies a predetermined threshold voltage Vth to an inverting (−) input terminal of the comparator 3341. The threshold voltage Vth supplied from the control section 337 to the comparator 3341 may have different voltage values in a time division manner. For example, the control section 337 supplies a threshold voltage Vth1 corresponding to an on-event indicating that an amount of change of the photocurrent exceeds an upper limit threshold value and a threshold voltage Vth2 corresponding to an off-event indicating that the amount of change thereof falls below a lower limit threshold value at different timings, so that one comparator 3341 can detect a plurality of types of address events.

For example, the storage section 336 may accumulate the comparison result of the comparator 3341 using the threshold voltage Vth1 corresponding to the on-event during a period in which the threshold voltage Vth2 corresponding to the off-event is supplied from the control section 337 to the inverting (−) input terminal of the comparator 3341. Note that the storage section 336 may be inside the pixel 30 or may be outside the pixel 30. Furthermore, the storage section 336 is not an essential component of the address event detection section 33. That is, the storage section 336 may not be provided.

[Imaging Device (Scanning Type) According to Second Configuration Example]

The imaging device 20 according to the first configuration example described above is an asynchronous imaging device that reads an event by an asynchronous reading method. However, an event reading method is not limited to the asynchronous reading method, and may be a synchronous reading method. The imaging device to which the synchronous reading method is applied is a scanning type imaging device, the same as a normal imaging device that performs imaging at a predetermined frame rate.

Figure 9:
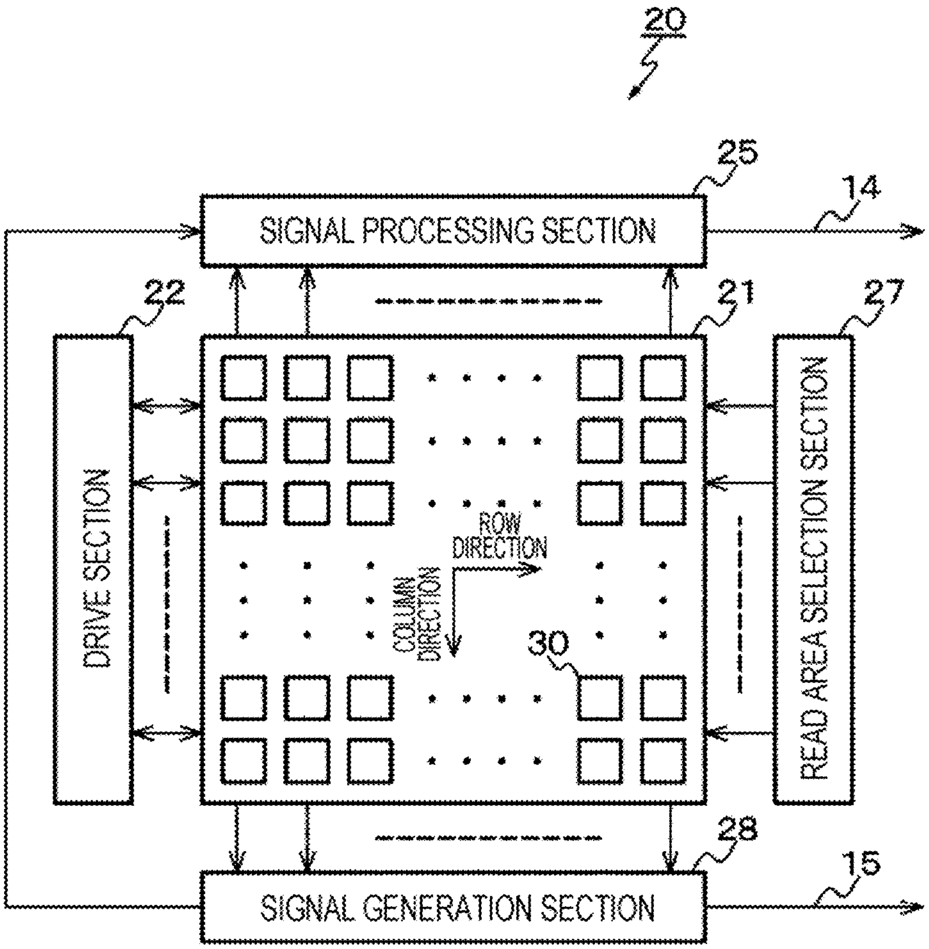
FIG. 9 is a block diagram illustrating an example of a configuration of an imaging device according to a second configuration example of the present disclosure.

FIG. 9 is a block diagram illustrating an example of a configuration of an imaging device according to the second configuration example, that is, a scanning type imaging device used as the imaging device 20 in the imaging system 10 to which the technology according to the present disclosure is applied.

As illustrated in FIG. 9, the imaging device 20 according to the second configuration example as the imaging device of the present disclosure includes the pixel array section 21, the drive section 22, the signal processing section 25, a read area selection section 27, and a signal generation section 28.

The pixel array section 21 includes the plurality of pixels 30. The plurality of pixels 30 outputs an output signal in response to a selection signal of the read area selection section 27. Each of the plurality of pixels 30 may have a quantizer in the pixel as illustrated in FIG. 7, for example. The plurality of pixels 30 outputs an output signal corresponding to an amount of change in the intensity of light. The plurality of pixels 30 may be two-dimensionally arranged in a matrix as illustrated in FIG. 9.

The drive section 22 drives each of the plurality of pixels 30 to output a pixel signal generated in each pixel 30 to the signal processing section 25. Note that the drive section 22 and the signal processing section 25 are circuit sections for acquiring gradation information. Therefore, in a case where only the event information is acquired, the drive section 22 and the signal processing section 25 may not be provided.

The read area selection section 27 selects some of the plurality of pixels 30 included in the pixel array section 21. For example, the read area selection section 27 selects any one or a plurality of rows among the rows included in the structure of the two-dimensional matrix corresponding to the pixel array section 21. The read area selection section 27 sequentially selects one or a plurality of rows according to a preset cycle. Furthermore, the read area selection section 27 may determine the selected area according to a request from each pixel 30 of the pixel array section 21.

On the basis of an output signal of the pixel selected by the read area selection section 27, the signal generation section 28 generates an event signal corresponding to an active pixel in which the event has been detected among the selected pixels. The event is an event in which the intensity of light changes. The active pixel is a pixel in which the change amount of the intensity of light corresponding to the output signal exceeds or falls below a threshold value set in advance. For example, the signal generation section 28 compares the output signal of the pixel with a reference signal, detects an active pixel that outputs the output signal in a case where the output signal is larger or smaller than the reference signal, and generates an event signal corresponding to the active pixel.

The signal generation section 28 can include, for example, a column selection circuit that arbitrates a signal entering the signal generation section 28. Furthermore, the signal generation section 28 can be configured to output not only the information of an active pixel that has detected the event but also the information of an inactive pixel that has not detected the event.

The address information and the time stamp information (for example, (X, Y, T)) of the active pixel that has detected the event are output from the signal generation section 28 through an output line 15. However, the data output from the signal generation section 28 may be not only the address information and the time stamp information but also information in a frame format (for example, (0, 0, 1, 0, . . . )).

[Configuration Example of Chip Structure]

Figure 10:
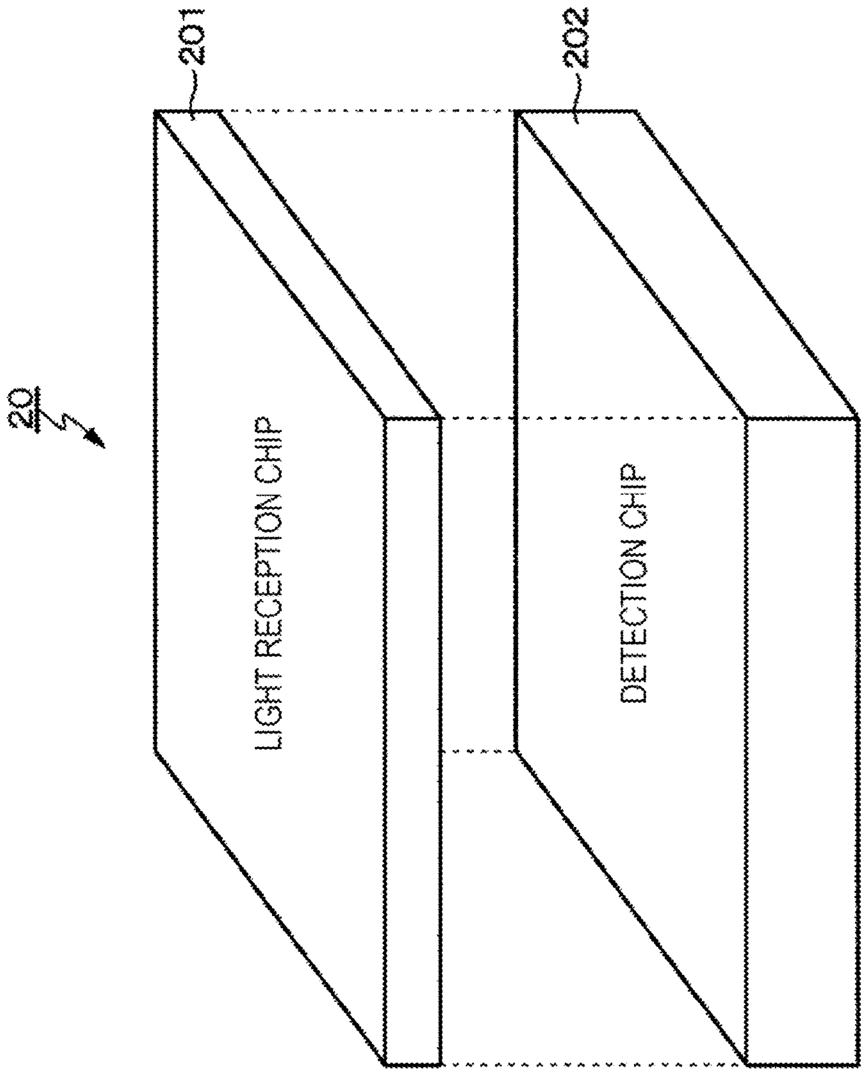
FIG. 10 is an exploded perspective view schematically illustrating a stacked chip structure of the imaging device.

As a chip (semiconductor integrated circuit) structure of the imaging device 20 according to the first configuration example or the second configuration example described above, for example, a stacked chip structure can be adopted. FIG. 10 is an exploded perspective view schematically illustrating a stacked chip structure of the imaging device 20.

As illustrated in FIG. 10, the staked chip structure, that is, the stacked structure has a structure in which at least two chips of a light reception chip 201 that is a first chip and a detection chip 202 that is a second chip are stacked. Then, in the circuit configuration of the pixel 30 illustrated in FIG. 4, each of the light reception elements 311 is disposed on the light reception chip 201, and all elements other than the light reception element 311, elements of other circuit portions of the pixel 30, and the like are disposed on the detection chip 202. The light reception chip 201 and the detection chip 202 are electrically connected via a connection portion such as a via (VIA), Cu—Cu bonding, or a bump.

Note that, here, a configuration example in which the light reception element 311 is disposed on the light reception chip 201, and elements other than the light reception element 311, elements of other circuit portions of the pixel 30, and the like are disposed on the detection chip 202 has been exemplified, but the present disclosure is not limited to this configuration example.

For example, in the circuit configuration of the pixel 30 illustrated in FIG. 4, each element of the light reception section 31 may be disposed on the light reception chip 201, and elements other than the light reception section 31, elements of other circuit portions of the pixel 30, and the like may be disposed on the detection chip 202. Furthermore, each element of the light reception section 31, and the reset transistor 321 and the floating diffusion layer 324 of the pixel signal generation section 32 may be disposed on the light reception chip 201, and the other elements may be disposed on the detection chip 202. Moreover, a part of the elements constituting the address event detection section 33 may be disposed on the light reception chip 201 together with each element of the light reception section 31 and the like.

[Configuration Example of Column Processing Section]

Figure 11:
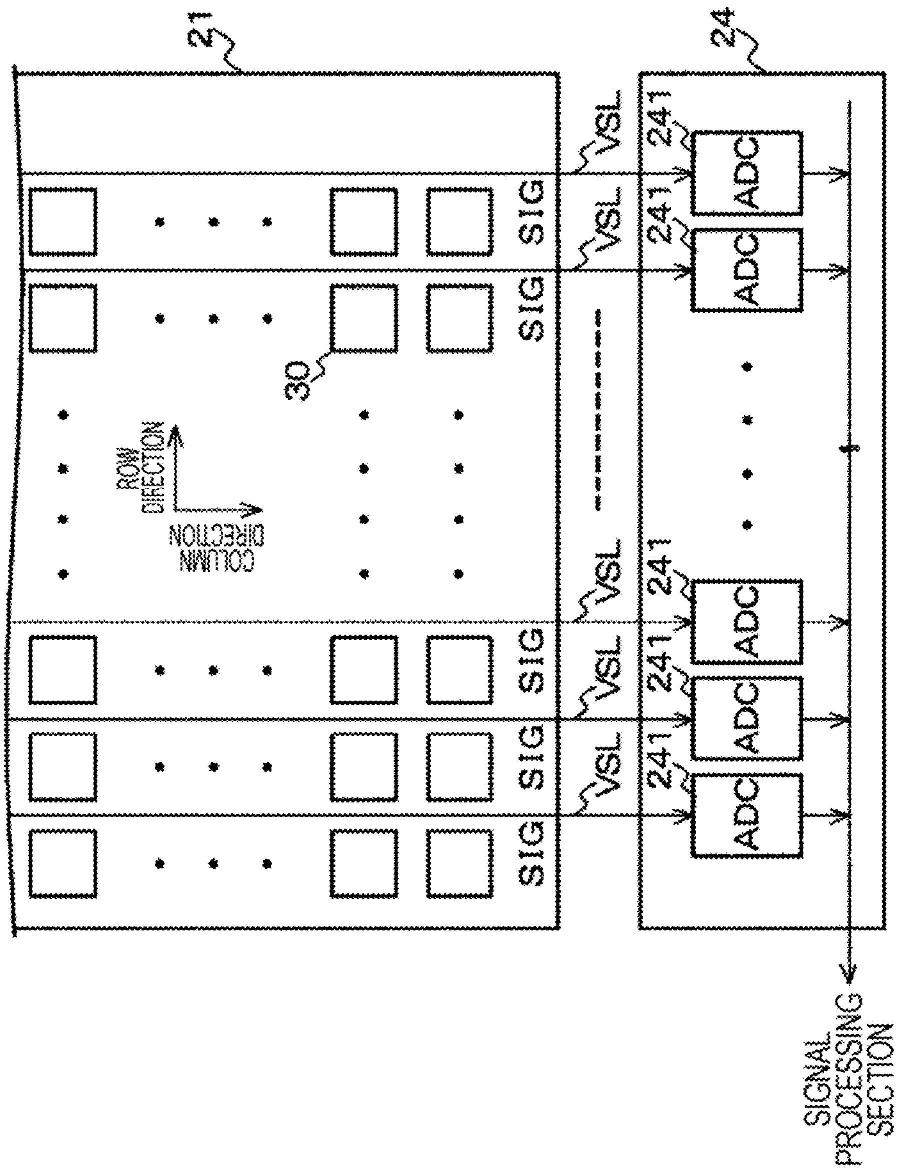
FIG. 11 is a block diagram illustrating an example of a configuration of a column processing section of the imaging device according to the first configuration example.

FIG. 11 is a block diagram illustrating an example of a configuration of the column processing section 24 of the imaging device 20 according to the first configuration example. As illustrated in FIG. 11, the column processing section 24 according to the present example includes a plurality of analog-digital converters (ADC) 241 arranged for each pixel column of the pixel array section 21.

Note that, here, a configuration example in which the analog-digital converter 241 is disposed in a one-to-one correspondence relationship with respect to the pixel column of the pixel array section 21 has been exemplified, but the present disclosure is not limited to this configuration example. For example, the analog-digital converter 241 may be disposed in units of a plurality of pixel columns, and the analog-digital converter 241 may be used in a time division manner between the plurality of pixel columns.

The analog-digital converter 241 converts the analog pixel signal SIG supplied via the vertical signal line VSL into a digital signal having a larger bit depth than the detection signal of the address event described above. For example, when the detection signal of the address event is 2 bits, the pixel signal is converted into a digital signal of 3 bits or more (16 bits or the like). The analog-digital converter 241 supplies the digital signal generated by the analog-digital conversion to the signal processing section 25.

First Embodiment

[Example of Circuit Configuration of Pixel]

Figure 12:
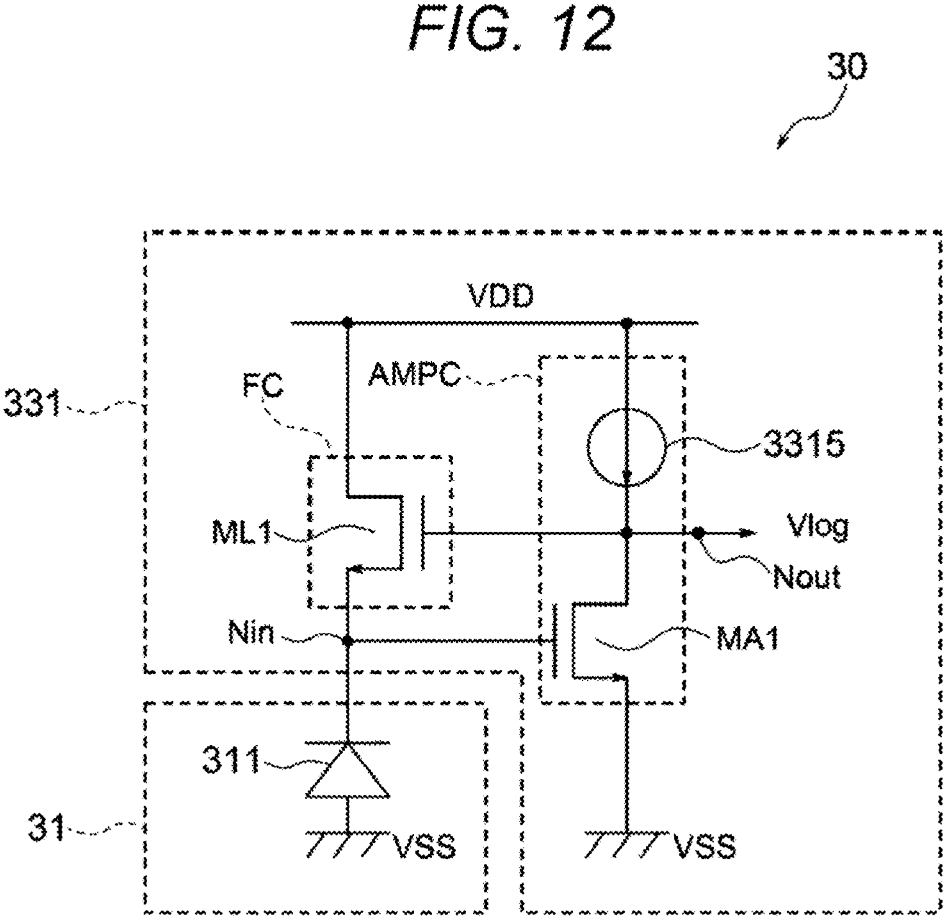
FIG. 12 is a circuit diagram illustrating an example of a configuration of a pixel according to a first embodiment.

FIG. 12 is a circuit diagram illustrating an example of a configuration of a pixel 30 according to a first embodiment.

In the first embodiment, the pixel signal generation section 32, and the transfer transistor 312 and the OFG transistor 313 of the light reception section 31 illustrated in FIG. 4 are not provided. Furthermore, FIG. 12 is a diagram illustrating a light reception section 31 and a current-voltage conversion section 331.

The current-voltage conversion section 331 includes an amplification circuit AMPC and a feedback circuit FC.

The amplification circuit AMPC is connected between an input node Nin and an output node Nout. The amplification circuit AMPC amplifies a signal input via the input node Nin and outputs the amplified signal to the output node Nout. The amplification circuit AMPC includes a transistor MA1 and a current source 3315. The transistor MA1 is connected between the output node Nout and a power supply voltage VSS (ground). A gate of the transistor MA1 is electrically connected to the input node Nin. The current source 3315 is connected between a power supply voltage VDD and the output node Nout.

The feedback circuit FC is connected between the input node Nin and the output node Nout. The feedback circuit FC operates according to a voltage of the output node Nout. By providing a feedback loop of the feedback circuit FC, an input signal at the input node Nin can be logarithmically transformed and output to the output node Nout. The feedback circuit FC includes a transistor ML1. The transistor ML1 is connected between the input node Nin and the power supply voltage VDD. A gate of the transistor ML1 is electrically connected to the output node Nout.

Each of the transistors ML1 and MA1 illustrated in FIG. 12 corresponds to, for example, the N-type transistors 3311 and 3313 illustrated in FIG. 6. The current source 3315 illustrated in FIG. 12 corresponds to, for example, the P-type transistor 3312 illustrated in FIG. 6.

Figure 13:
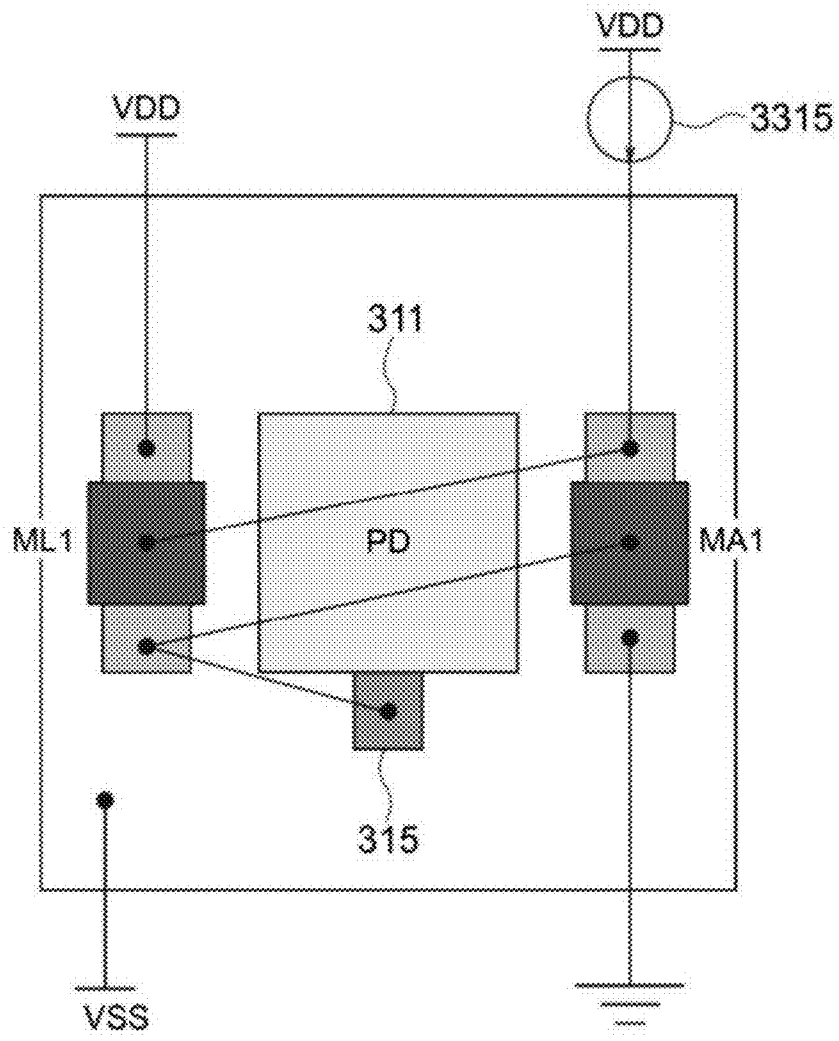
FIG. 13 is a top view illustrating an example of an arrangement of a configuration of a pixel according to the first embodiment.

FIG. 13 is a top view illustrating an example of an arrangement of the configuration of the pixel 30 according to the first embodiment. FIG. 13 illustrates the arrangement of the configuration of the pixel 30 illustrated in FIG. 12.

The pixel 30 further includes an extraction electrode 315. The extraction electrode 315 is connected between a light reception element 311 and a source of the transistor ML1. A photocurrent is extracted via the extraction electrode 315.

In the example illustrated in FIG. 13, a length of a gate electrode of the transistor ML1 in a channel length direction is substantially the same as a length of a gate electrode of the transistor MAL in the channel length direction, for example.

Figure 14:
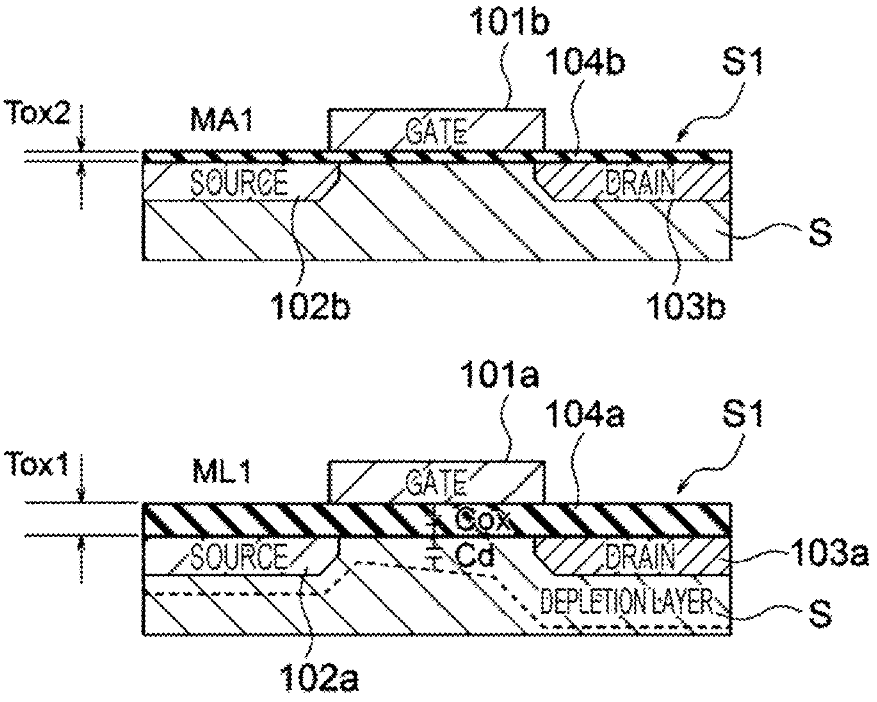
FIG. 14 is a cross-sectional view illustrating an example of a configuration of a transistor according to the first embodiment.

FIG. 14 is a cross-sectional view illustrating an example of a configuration of the transistors ML1 and MA1 according to the first embodiment. The upper part of FIG. 14 illustrates a cross-sectional view of the transistor MA1. The lower part of FIG. 14 illustrates a cross-sectional view of the transistor ML1.

The transistors ML1 and MA1 are provided on a substrate surface S1 of a substrate S. The substrate S is, for example, a semiconductor substrate such as a silicon (Si) substrate. Furthermore, the substrate S is, for example, a P-type silicon substrate.

The transistor ML1 includes a gate electrode 101*a*, a source layer 102*a*, a drain layer 103*a*, and a gate insulating film 104*a*. The transistor MA1 includes a gate electrode 101*b*, a source layer 102*b*, a drain layer 103*b*, and a gate insulating film 104*b*.

The gate insulating film 104*a* of the transistor ML1 is thicker than the gate insulating film ab of the transistor MA1. As a result, a subthreshold slope of the transistor ML1 can be made higher than a subthreshold slope of the transistor MA1. As a result, the event detection sensitivity can be improved. Note that details of the subthreshold slope will be described later with reference to FIG. 15.

Figure 15:
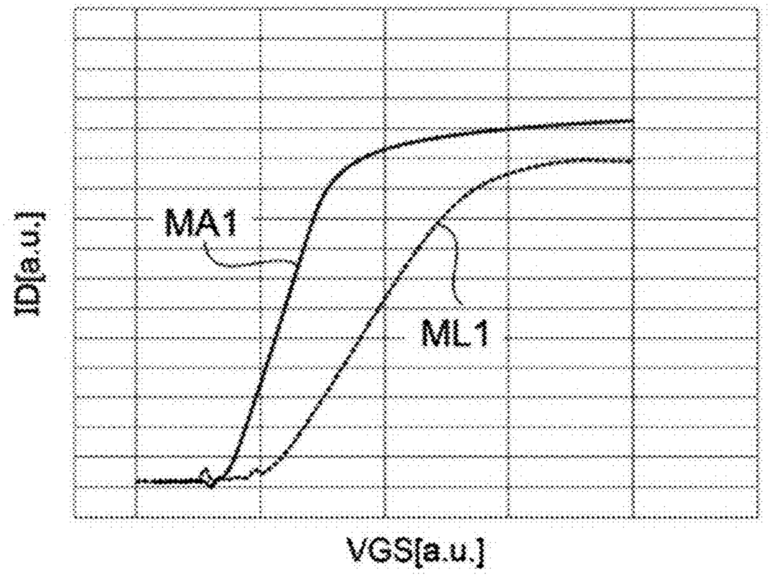
FIG. 15 is a diagram illustrating an example of transmission characteristics of the transistor according to the first embodiment.

FIG. 15 is a diagram illustrating an example of transmission characteristics of the transistors ML1 and MA1 according to the first embodiment. FIG. 15 is a graph illustrating a result of a simulation. In the graph illustrated in FIG. 15, the vertical axis represents a drain current (Id), and the horizontal axis represents a gate-source voltage (Vgs).

The subthreshold slope is a change in the voltage (Vgs) when the drain current (Id) increases by one digit in an IV curve illustrated in FIG. 15.

A subthreshold slope Ss-th is expressed by the following Formula (6) using a capacitance Cd of a depletion layer, a capacitance Cox of the gate insulating film (gate oxide film), and a thermal voltage kT/q.

[Mathematical formula 1]

$$S_{s-th} = \ln(10)\frac{kT}{q}\left(1 + \frac{C_d}{C_{ox}}\right) \quad (6)$$

There is a relationship of Cox∝1/Tox between the capacitance Cox of the gate insulating film and a thickness Tox of the gate insulating film. As illustrated in FIG. 14, the subthreshold slope of the transistor ML1 can be increased by increasing the gate insulating film of the transistor ML1. By increasing the subthreshold slope of the transistor ML1 included in the feedback circuit FC, the event detection sensitivity can be improved.

In the example illustrated in FIG. 15, the subthreshold slope of the transistor ML1 is larger than the subthreshold slope of the transistor MA1. The subthreshold slope of the transistor ML1 is, for example, about 100 mV/decade or more. The subthreshold slope of the transistor MAL is, for example, about 60 to about 100 mV/decade.

Figure 16:
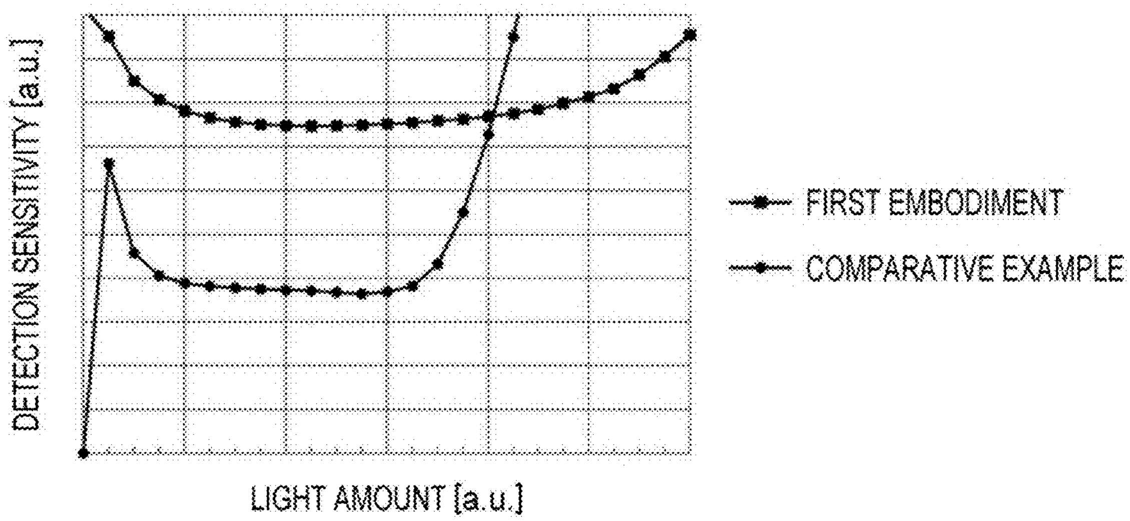
FIG. 16 is a diagram illustrating an example of a relationship between detection sensitivity and a light amount in a pixel according to the first embodiment.

FIG. 16 is a diagram illustrating an example of a relationship between detection sensitivity and a light amount in the pixel 30 according to the first embodiment. In a graph of FIG. 16, the vertical axis represents the detection sensitivity (logarithmic sensitivity), and the horizontal axis represents the light amount. Furthermore, FIG. 16 is a diagram illustrating a slope of the IV curve in FIG. 15.

In the first embodiment, the subthreshold slope of the transistor TL1 is, for example, 10 mV/decae or more. On the other hand, in a comparative example, the subthreshold slope of the transistor TL1 is about the same as the subthreshold slope of the transistor TA1 (about 60 to about 100 mV/decade).

As illustrated in FIG. 16, in a weak inversion region of the gate-source voltage Vgs in which the transistor ML1 operates, the detection sensitivity in the first embodiment is higher than the detection sensitivity in the comparative example.

The thickness of the gate insulating film of the transistor ML1 is, for example, 5 nm or more. The threshold slope of the transistor ML1 is, for example, 100 mV/decade or more.

[Manufacturing Method]

FIGS. 17A to 17H are cross-sectional views illustrating an example of a manufacturing method of the transistors ML1 and MA1 according to the first embodiment. The left side of FIGS. 17A to 17H illustrates the manufacturing method of the transistor ML1, and the right side illustrates the manufacturing method of the transistor MA1.

Figure 17A:
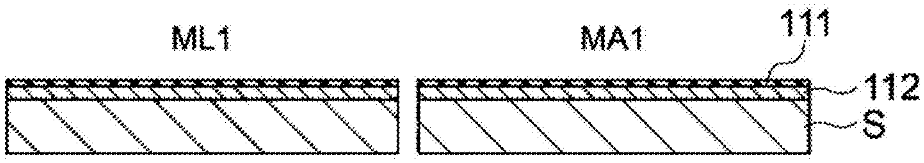
FIG. 17A is a cross-sectional view illustrating an example of a manufacturing method of the transistor according to the first embodiment.

First, as illustrated in FIG. 17A, a sacrificial oxide film 111 is formed on the substrate S. Thereafter, channel impurities are introduced into the substrate S by ion implantation, and a wafer is heat-treated to activate the impurities. Thus, the channel impurity layer (channel impurity implanted region) 112 is formed. The channel impurity is, for example, a P-type impurity such as boron.

Figure 17B:
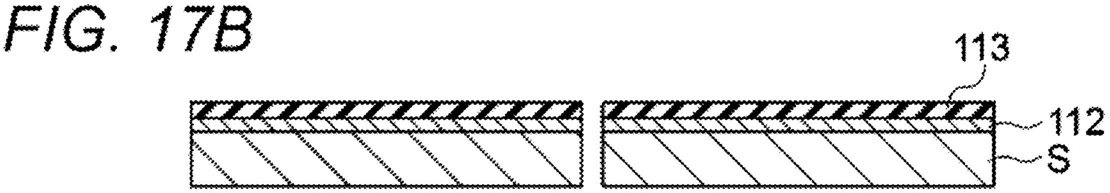
FIG. 17B is a cross-sectional view illustrating a step subsequent to FIG. 17A.

Next, as illustrated in FIG. 17B, the sacrificial oxide film 111 is removed, and an insulating film 113 is formed on the channel impurity layer 112. The insulating film 113 is a relatively thick oxide film.

Figure 17C:
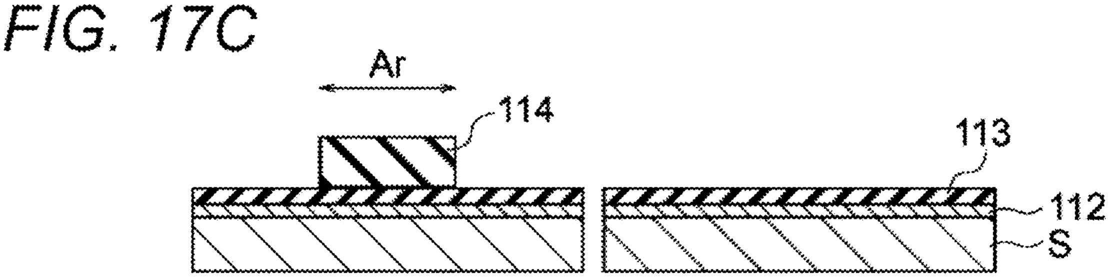
FIG. 17C is a cross-sectional view illustrating a step subsequent to FIG. 17B.

Next, as illustrated in FIG. 17C, a resist 114 is formed in a region Ar on the insulating film 113. The region Ar corresponds to a region of the gate electrode of the transistor ML1 illustrated in FIG. 13.

Figure 17D:
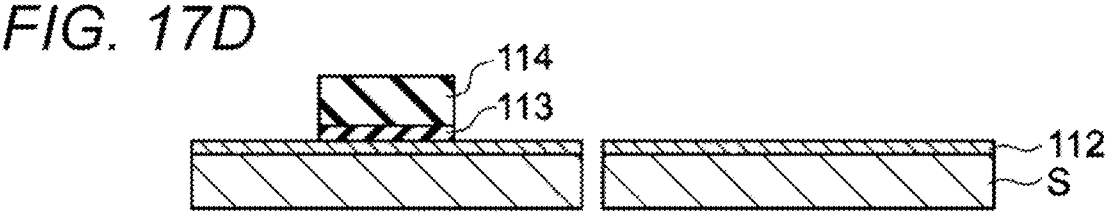
FIG. 17D is a cross-sectional view illustrating a step subsequent to FIG. 17C.

Next, as illustrated in FIG. 17D, the insulating film 113 is removed using the resist 114 as a mask. The insulating film 113 is removed by solution etching, for example.

Figure 17E:
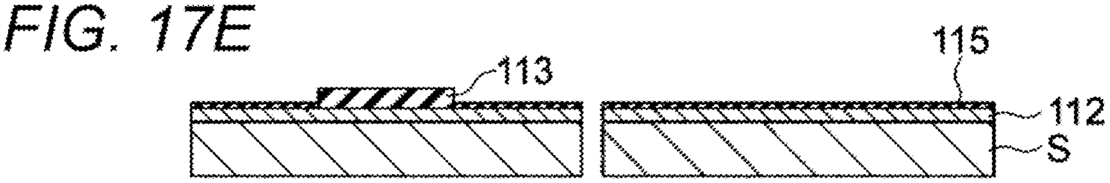
FIG. 17E is a cross-sectional view illustrating a step subsequent to FIG. 17D.

Next, as illustrated in FIG. 17E, the resist 114 is removed. Thereafter, an insulating film 115 is formed. The insulating film 115 is an oxide film thinner than the insulating film 113. Note that the insulating film 113 is also thicker by the step illustrated in FIG. 17E.

Figure 17F:
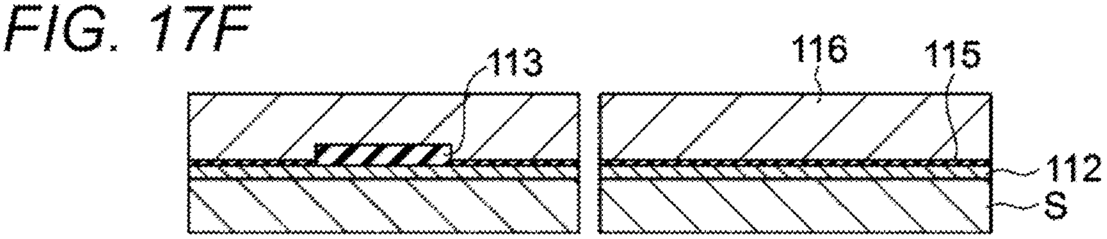
FIG. 17F is a cross-sectional view illustrating a step subsequent to FIG. 17E.

Next, as illustrated in FIG. 17F, a conductive layer 116 is formed on the insulating films 113 and 115. The conductive layer 116 is, for example, a polysilicon layer.

Figure 17G:
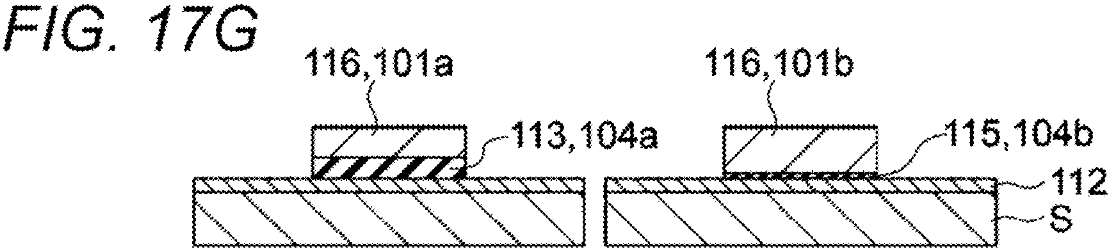
FIG. 17G is a cross-sectional view illustrating a step subsequent to FIG. 17F.

Next, as illustrated in FIG. 17G, the conductive layer 116 is processed. Thus, the gate electrodes 101*a* and 101*b* of the transistors ML1 and MA1 illustrated in FIG. 14 are formed. Furthermore, the insulating film 113 corresponds to the gate insulating film 104*a* of the transistor ML1. The insulating film 115 corresponds to the gate insulating film 104*b* of the transistor MA1.

Figure 17H:
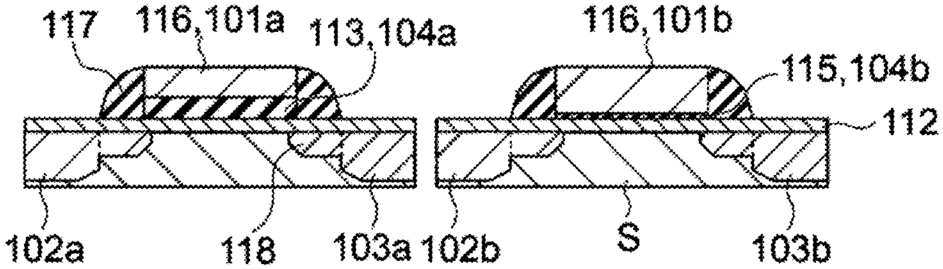
FIG. 17H is a cross-sectional view illustrating a step subsequent to FIG. 17G.

Next, as illustrated in FIG. 17H, a lightly doped drain (LDD) impurity is introduced into the substrate S by ion implantation using the conductive layer 116 (gate electrode) as a mask. Thereafter, sidewall insulating films 117 are formed on both sides of the conductive layer 116. Thereafter, using each of the sidewall insulating films 117 as a mask, source impurities and drain impurities are introduced into the substrate S by ion implantation. The source impurity and the drain impurity are, for example, N-type impurities such as phosphorus. Thereafter, the impurities are activated by heat treatment to form an LDD layer 118, the source layers 102*a* and 102*b*, and the drain layers 103*a* and 103*b*.

As described above, according to the first embodiment, the gate insulating film 104*a* of the transistor TL1 is thicker than the gate insulating film 104*b* of the transistor TA1. As a result, the subthreshold slope of the transistor TL1 can be increased, and the event detection sensitivity can be improved.

In the first embodiment, as illustrated in FIG. 12, the current-voltage conversion section 331 is provided with the two transistors. Normally, the event detection sensitivity can be improved by increasing the number of transistors. However, when the number of transistors increases, miniaturization becomes difficult due to an increase in occupied area. On the other hand, in the first embodiment, the event detection sensitivity can be improved while suppressing an increase in the number of transistors by adjusting the thickness of the gate insulating film.

Modification of First Embodiment

FIGS. 18A to 18I are cross-sectional views illustrating an example of a manufacturing method of the transistors ML1 and MAL according to a modification of the first embodiment. The left side of FIGS. 18A to 18H illustrates the manufacturing method of the transistor ML1, and the right side illustrates the manufacturing method of the transistor MA1.

The modification of the first embodiment is different from the first embodiment in a method of forming the gate insulating film 104*a* of the transistor ML1.

Figure 18A:
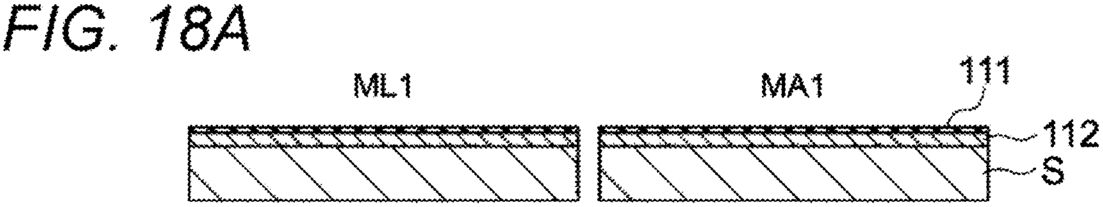
FIG. 18A is a cross-sectional view illustrating an example of a manufacturing method of a transistor according to a modification of the first embodiment.

First, as illustrated in FIG. 18A, the sacrificial oxide film 111 is formed on the substrate S. Thereafter, channel impurities are introduced into the substrate S by ion implantation, and a wafer is heat-treated to activate the impurities. Thus, the channel impurity layer (channel impurity implanted region) 112 is formed. The channel impurity is, for example, a P-type impurity such as boron.

Figure 18B:
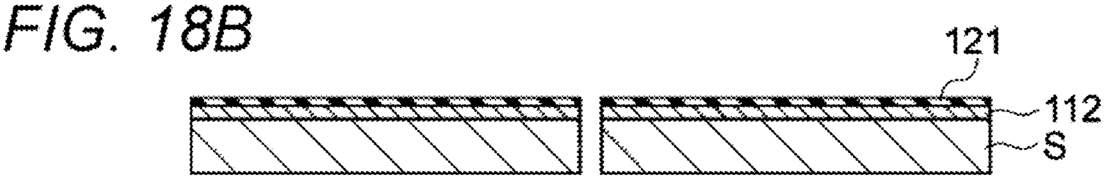
FIG. 18B is a cross-sectional view illustrating a step subsequent to FIG. 18A.

Next, as illustrated in FIG. 18B, the sacrificial oxide film 111 is removed, and an insulating film 121 is formed on the channel impurity layer 112. The insulating film 121 is a relatively thin oxide film.

Figure 18C:
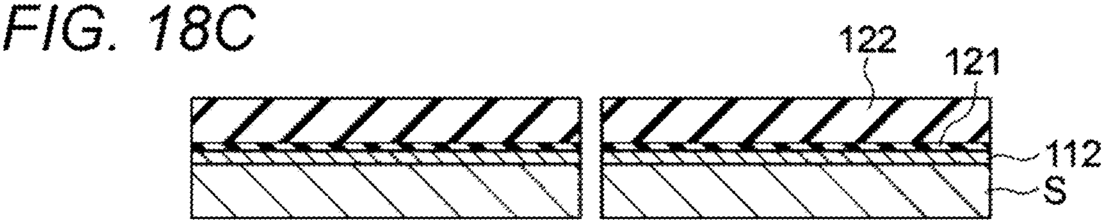
FIG. 18C is a cross-sectional view illustrating a step subsequent to FIG. 18B.

Next, as illustrated in FIG. 18C, a material layer 122 is formed on the insulating film 121. The material layer 122 is, for example, a silicon nitride (SiN) layer.

Figure 18D:
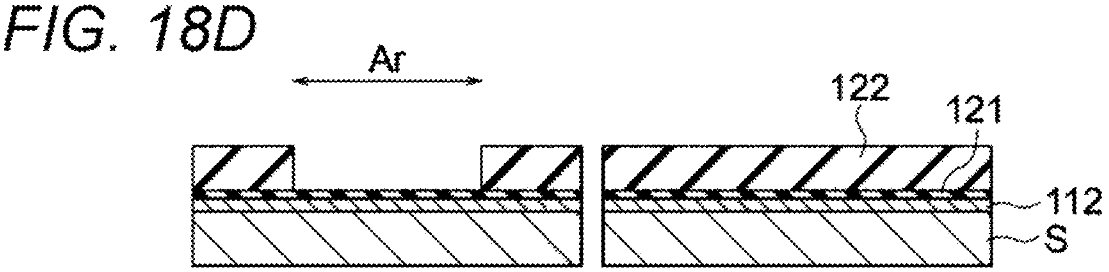
FIG. 18D is a cross-sectional view illustrating a step subsequent to FIG. 18C.

Next, as illustrated in FIG. 18D, the material layer 122 in the region Ar is removed. The region Ar corresponds to a region of the gate electrode of the transistor ML1 illustrated in FIG. 13.

Figure 18E:
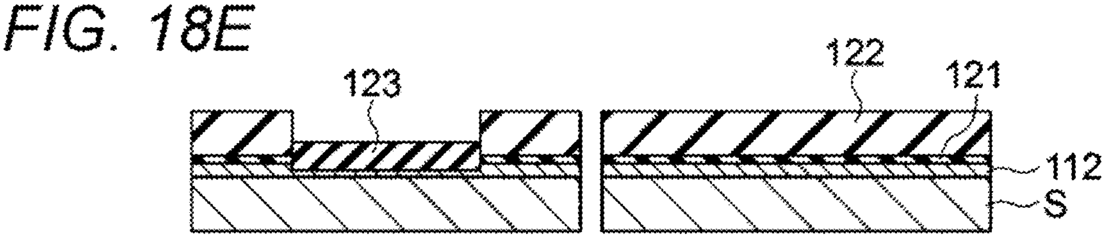
FIG. 18E is a cross-sectional view illustrating a step subsequent to FIG. 18D.

Next, as illustrated in FIG. 18E, local oxidation of silicon (LOCOS) oxidation treatment is performed. Thus, an insulating film 123 is formed. The insulating film 123 is an oxide film thicker than the insulating film 121.

Figure 18F:
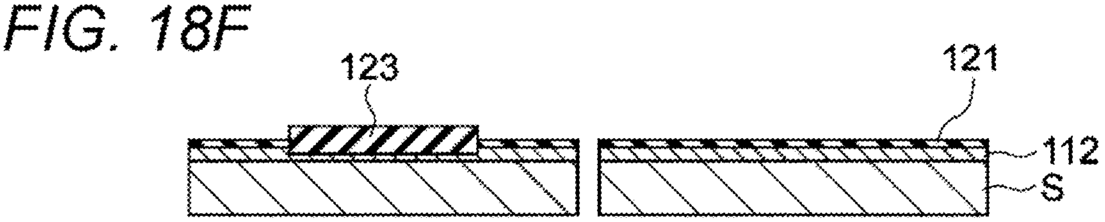
FIG. 18F is a cross-sectional view illustrating a step subsequent to FIG. 18E.

Next, as illustrated in FIG. 18F, the material layer 122 is removed.

Figure 18G:
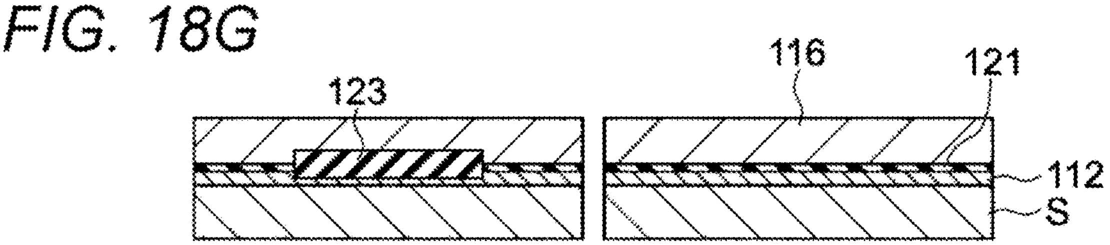
FIG. 18G is a cross-sectional view illustrating a step subsequent to FIG. 18F.

Next, as illustrated in FIG. 18G, the conductive layer 116 is formed on the insulating films 121 and 123. The conductive layer 116 is, for example, a polysilicon layer.

Figure 18H:
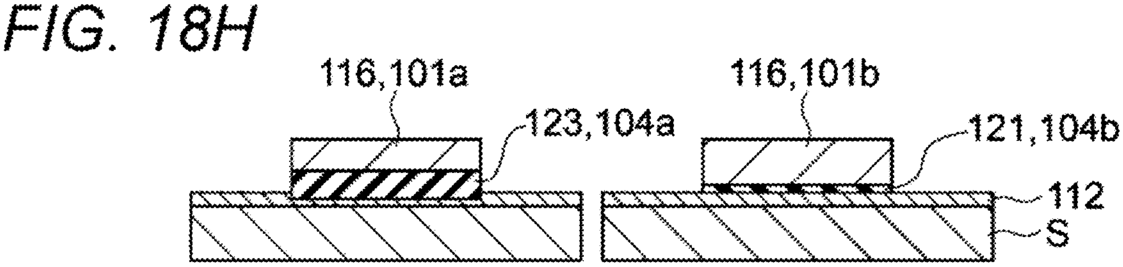
FIG. 18H is a cross-sectional view illustrating a step subsequent to FIG. 18G.

Next, as illustrated in FIG. 18H, the conductive layer 116 is processed. Thus, the gate electrodes 101*a* and 101*b* of the transistors ML1 and MA1 illustrated in FIG. 14 are formed. Furthermore, the insulating film 123 corresponds to the gate insulating film 104*a* of the transistor ML1. The insulating film 121 corresponds to the gate insulating film 104*b* of the transistor MA1. Therefore, the insulating film 123, which is the gate insulating film 104*a* of the transistor ML1, is formed by LOCOS oxidation treatment.

Figure 18I:
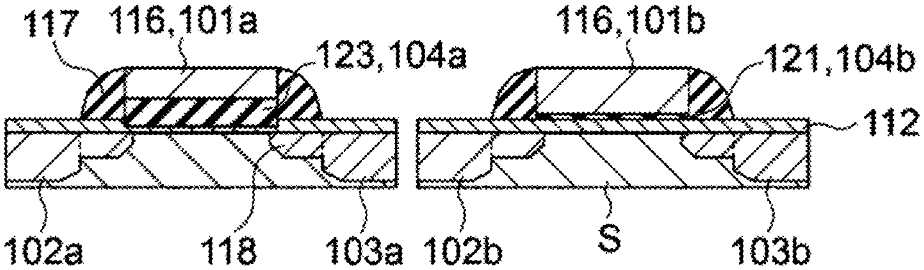
FIG. 18I is a cross-sectional view illustrating a step subsequent to FIG. 18H.

Next, as illustrated in FIG. 18I, the LDD layer 118, the source layers 102*a* and 102*b*, and the drain layers 103*a* and 103*b* are formed. Note that the step illustrated in FIG. 18I is the same as the step illustrated in FIG. 17H.

Furthermore, as illustrated in FIG. 18H, the end portion of the insulating film 123 on a substrate S side is located closer to the substrate than the end portion of the insulating film 121 on the substrate S side. This is because the insulating film 123 is formed to penetrate into the substrate S by the LOCOS oxidation treatment.

As in the modification of the first embodiment, the method of forming the gate insulating film 104*a* of the transistor ML1 may be changed. Also in this case, the similar effects to those of the first embodiment can be obtained.

Second Embodiment

Figure 19:
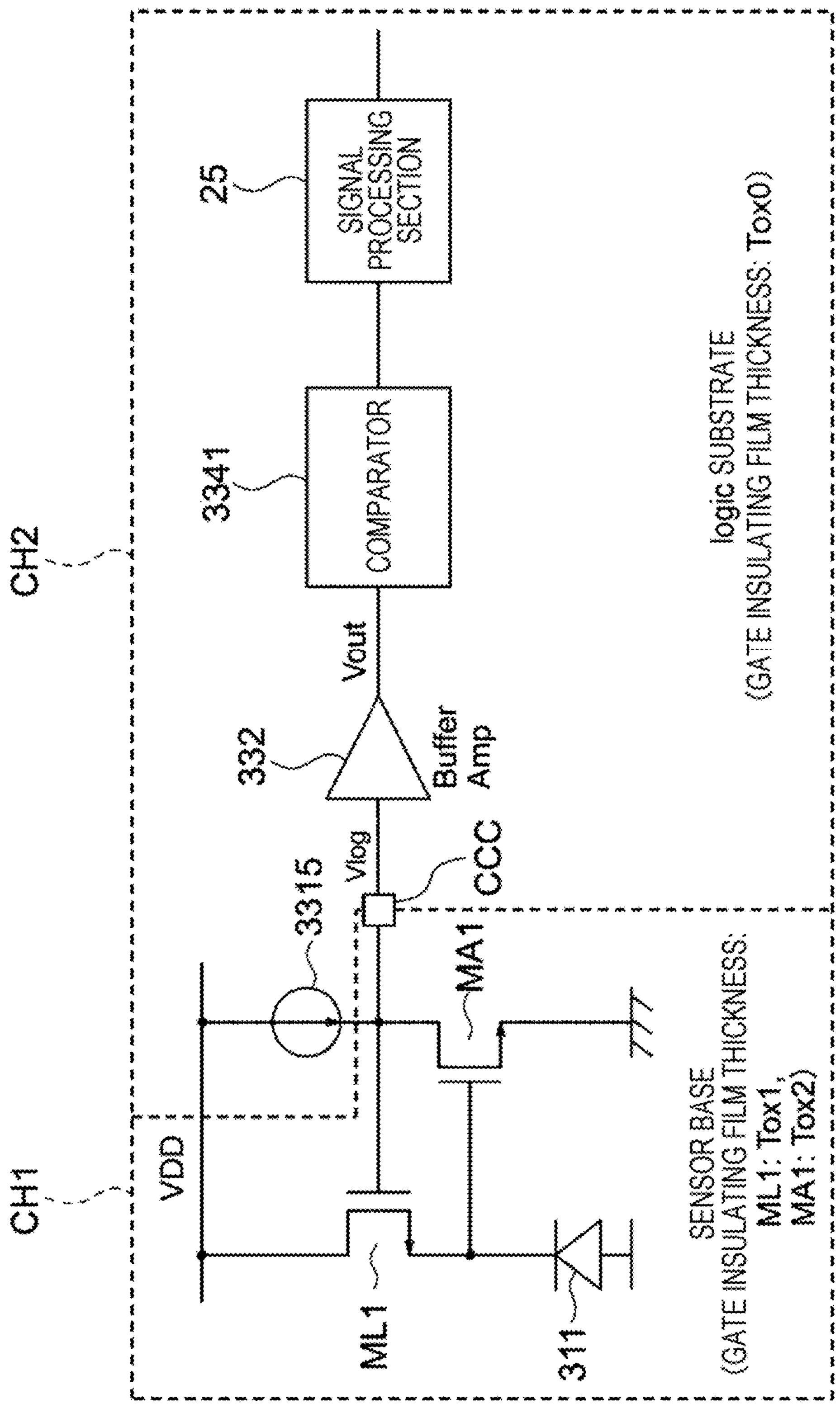
FIG. 19 is a diagram illustrating an example of a configuration of a pixel and a signal processing section according to a second embodiment.

FIG. 19 is a diagram illustrating an example of configurations of a pixel 30 and a signal processing section 25 according to a second embodiment. FIG. 19 corresponds to a part of FIGS. 5 and 7.

The second embodiment is different from the first embodiment in that the configuration of the pixel 30 is divided and disposed on a plurality of substrates.

An imaging device 20 further includes a first semiconductor chip CH1 and a second semiconductor chip CH2. The first semiconductor chip CH1 and the second semiconductor chip CH2 are electrically connected to each other using, for example, wiring bonding (Cu—Cu bonding) CCC.

The first semiconductor chip CH1 corresponds to, for example, the light reception chip 201 illustrated in FIG. 10. The second semiconductor chip CH2 corresponds to, for example, the detection chip 202 illustrated in FIG. 10.

In the example illustrated in FIG. 19, a light reception element 311 and transistors ML1 and MA1 are disposed on the first semiconductor chip CH1. In the example illustrated in FIG. 19, a current source 3315 and subsequent circuits after a buffer 332 are disposed in the second semiconductor chip CH2. The subsequent circuit illustrated in FIG. 19 includes, for example, the buffer 332, a comparator 3341, the signal processing section 25, and the like. Note that the arrangement and division of the configuration of the pixel 30 between the first semiconductor chip CH1 and the second semiconductor chip CH2 is not limited to the example illustrated in FIG. 19.

The buffer 332 also functions as a buffer amplifier (signal amplification section). That is, the buffer 332 amplifies a voltage signal.

The comparator (comparison section) 3341 compares a voltage of the voltage signal amplified by the buffer 332 with a predetermined voltage. As described above, the comparator 3341 outputs a signal indicating a comparison result as a detection signal of an address event.

Here, a thickness of a gate insulating film of the transistor ML1 is defined as a thickness Tox1. A thickness of a gate insulating film of the transistor MA1 is defined as a thickness Tox2. A thickness of a gate insulating film of a transistor constituting the subsequent circuit is defined as a thickness Tox0.

The gate insulating film of the transistor ML1 is thicker than the gate insulating film of the transistor included in the subsequent circuit (Tox1>Tox0). Usually, the gate insulating film of the transistor of the subsequent circuit is preferably thin for increasing the speed, reducing the power consumption, and the like. On the other hand, the gate insulating film of the transistor ML1 is preferably thick for event detection sensitivity.

Furthermore, according to the second embodiment, the subthreshold slope of the transistor ML1 can be made higher than the subthreshold slope of the transistor included in the subsequent circuit. As a result, the event detection sensitivity can be improved.

As in the second embodiment, the configuration of the pixel 30 may be divided and disposed on the plurality of substrates. Also in this case, the similar effects to those of the first embodiment can be obtained.

Note that the thickness Tox1 of the gate insulating film of the transistor ML1 may be thicker than the thickness Tox2 of the gate insulating film of the transistor MAL as in the first embodiment (Tox1>Tox2), but may be substantially the same as the thickness Tx2 (Tox1≈Tox2>Tox0). That is, the gate insulating film of the transistor MA1 may also be thicker than the gate insulating film of the transistor included in the subsequent circuit. In this case, the transistors ML1 and MA1 can be manufactured in the same step, and an increase in the number of steps can be suppressed.

Third Embodiment

Figure 20:
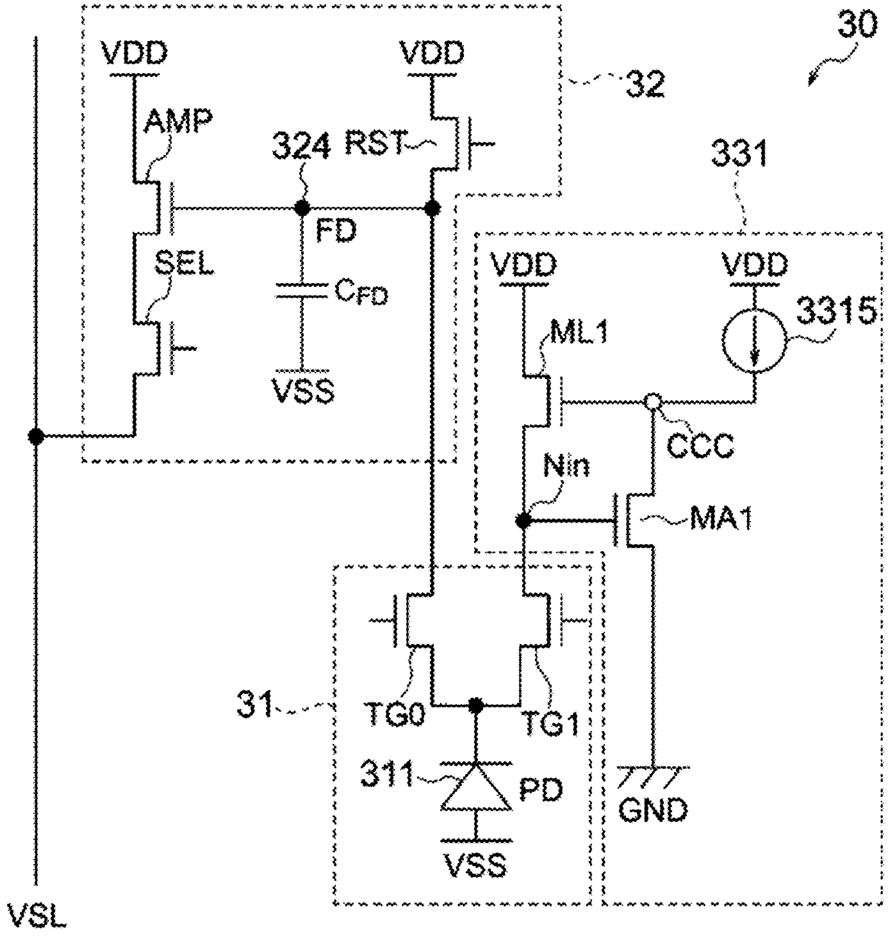
FIG. 20 is a circuit diagram illustrating an example of a configuration of a pixel according to a third embodiment.

FIG. 20 is a circuit diagram illustrating an example of a configuration of a pixel 30 according to a third embodiment. The third embodiment is different from the first embodiment in that a pixel signal generation section 32 and transistors TG0 and TG1 of a light reception section 31 illustrated in FIG. 4 are provided.

The pixel 30 further includes the pixel signal generation section 32.

The light reception section 31 further includes the transistors TG0 and TG1. In the light reception section 31 illustrated in FIG. 20, the transistors TG0 and TG1 corresponds to, for example, the transfer transistor 312 and the OFG transistor 313 illustrated in FIG. 4, respectively.

The transistor TG0 is connected between a light reception element 311 and a floating diffusion layer 324 of the pixel signal generation section 32. The transistor TG0 transfers the charge generated in the light reception element 311 to the floating diffusion layer (charge accumulation section) 324.

The transistor TG1 is connected between the light reception element 311 and an input node Nin of a current-voltage conversion section 331. The transistor TG1 transfers the charge generated by the light reception element 311 to the input node Nin.

At the time of event detection, the transistor TG0 is turned off, and the transistor TG1 is turned on. As a result, event detection by a photocurrent generated in the light reception element 311 is performed. At the time of imaging, the transistors TG0 and TG1 are turned off, and the transistor TG0 is turned on after a predetermined accumulation time has elapsed. As a result, signal charges accumulated in the light reception element 311 can be transferred to the floating diffusion layer 324.

In the pixel signal generation section 32 illustrated in FIG. 20, each of transistors RST, AMP, and SEL corresponds to, for example, the reset transistor 321, the amplification transistor 322, and the selection transistor 323 illustrated in FIG. 6.

As described above, the thicknesses of the gate insulating films of the transistors ML1 and MAL are thicknesses Tox1 and Tox2, respectively. As described above, the thickness of the gate insulating film of the transistor included in the subsequent circuit is a thickness Tox0. The thicknesses of gate insulating films of the transistors AMP, SEL, RST, TG0, and TG1 are defined as thicknesses Tox3, Tox4, Tox5, Tox6, and Tox7, respectively.

A relationship between the thicknesses of the gate insulating films of the respective transistors is expressed by, for example, the following Formula (7).

$$Tox1 > Tox2 \approx Tox3 \approx Tox4 \approx Tox5 \approx Tox6 \approx Tox7 \quad (7)$$

That is, the gate insulating film of the transistor ML1 is thicker than the gate insulating films of the transistors TG0 and TG1.

More specifically, a relationship of the thicknesses of the gate insulating films of the respective transistors is expressed by, for example, the following Formula (8).

$$Tox1 > Tox4 \approx Tox5 \approx Tox6 \approx Tox7 > Tox2 \approx Tox3 \quad (8)$$

In the case of Formula (8), the gate insulating films of the transistors MA1 and AMP become relatively thin, so that the current gain can be improved.

Figure 21:
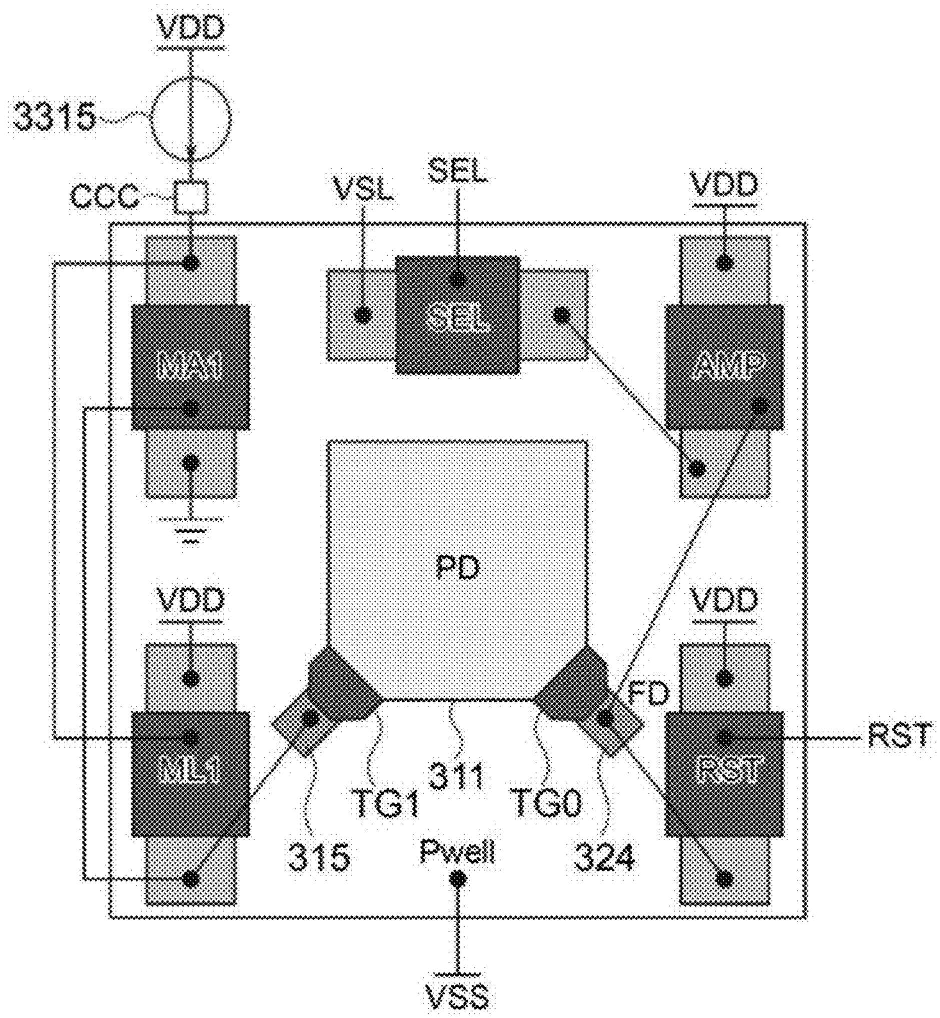
FIG. 21 is a top view illustrating an example of an arrangement of a configuration of a pixel according to the third embodiment.

FIG. 21 is a top view illustrating an example of an arrangement of a configuration of the pixel 30 according to the third embodiment.

As illustrated in FIG. 21, the light reception element 311 is connected to the pixel signal generation section 32 and the current-voltage conversion section 331 (address event detection section 33) via each of the transistors TG0 and TG1.

As in the third embodiment, the pixel signal generation section 32 and the transistors TG0 and TG1 of the light reception section 31 may be provided. Also in this case, the similar effects to those of the first embodiment can be obtained.

Fourth Embodiment

Figure 22:
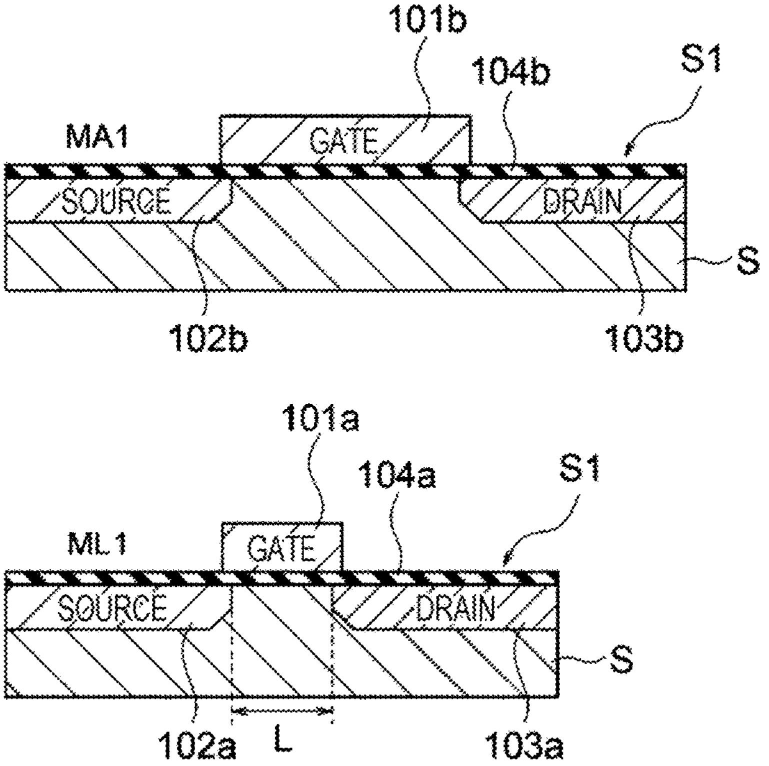
FIG. 22 is a cross-sectional view illustrating an example of a configuration of a transistor according to a fourth embodiment.

FIG. 22 is a cross-sectional view illustrating an example of a configuration of transistors ML1 and MA1 according to a fourth embodiment. In the fourth embodiment, a channel length of the transistor ML1 is different from that of the first embodiment.

As illustrated in FIG. 22, a channel length of the transistor ML1 is shorter than a channel length of the transistor MA1. More specifically, a length in the channel length direction of a gate electrode 101*a* of the transistor ML1 is shorter than a length in the channel length direction of a gate electrode 101*b* of the transistor MA1. As a result, an effective gate length L of the transistor ML1 can be shortened. As a result, the subthreshold slope of the transistor ML1 can be increased by the short channel effect, and the event detection sensitivity can be improved.

Note that the configuration of the transistor ML1 may be determined, for example, on the basis of the following Formula (9) which is a Brews formula so as to obtain the short channel effect.

$$Lmin = 0.4 \times \{rj \times d \times (Ws + Wd)^2\}^{1/3} \quad (9)$$

In Formula (9), Lmin represents a minimum channel length. rj represents a junction depth of a source-drain impurity region. d represents a gate insulating film thickness converted into a silicon oxide film. Ws represents a length of a depletion layer extending from a source end. Wd represents a length of the depletion layer extending from a drain end.

Figure 23:
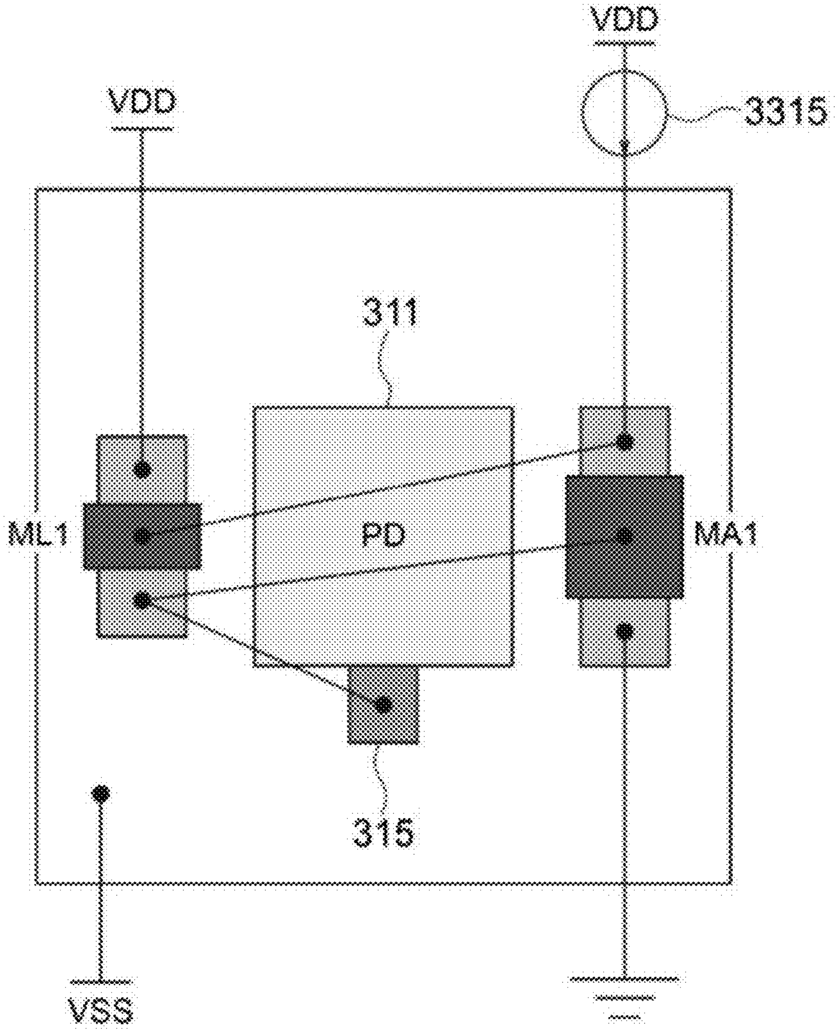
FIG. 23 is a top view illustrating an example of an arrangement of a configuration of a pixel according to the fourth embodiment.

FIG. 23 is a top view illustrating an example of an arrangement of the configuration of the pixel 30 according to the fourth embodiment.

As illustrated in FIG. 23, the gate electrode 101*a* of the transistor ML1 is smaller than the gate electrode 101*b* of the transistor MA1.

As in the fourth embodiment, a magnitude relationship of the channel length may be changed between the transistor MAL and the transistor ML1. Also in this case, the similar effects to those of the first embodiment can be obtained.

Fifth Embodiment

Figure 24:
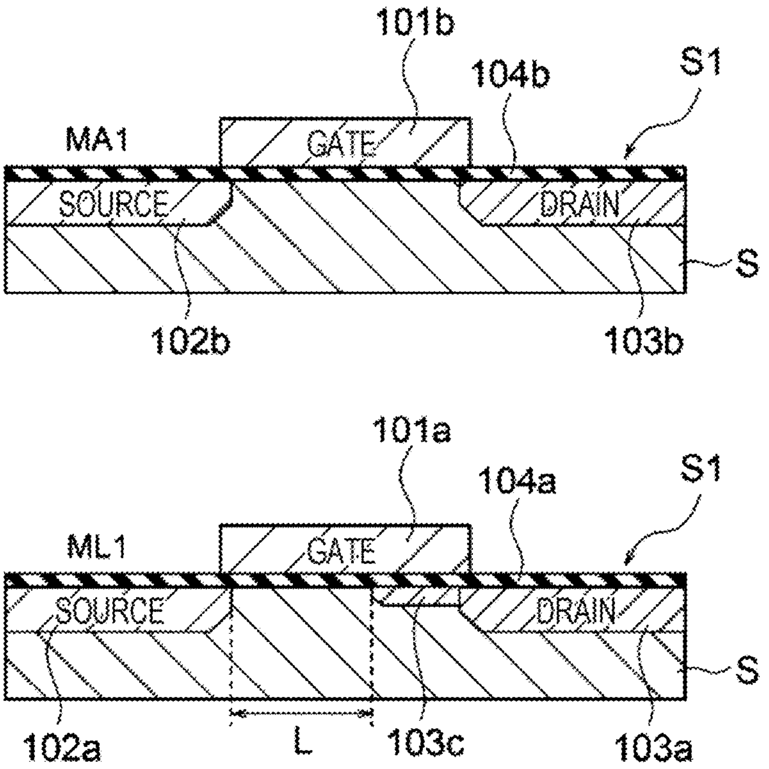
FIG. 24 is a cross-sectional view illustrating an example of a configuration of a transistor according to a fifth embodiment.

FIG. 24 is a cross-sectional view illustrating an example of a configuration of transistors ML1 and MA1 according to a fifth embodiment. In the fifth embodiment, a channel length of the transistor ML1 is different from that of the first embodiment.

The transistor ML1 includes a drain extension (drain extension region) 103*c* in contact with a drain layer 103*a*. The impurity concentration of the drain extension 103*c* is lower than the impurity concentration of the drain layer 103*a*. The drain extension 103*c* extends toward an opposing source layer 102*a* below a gate electrode 101*a* (on a substrate S side). An effective gate length L of the transistor ML1 can be shortened by the drain extension 103*c*. As a result, the subthreshold slope of the transistor ML1 can be increased by the short channel effect, and the event detection sensitivity can be improved.

Figure 25:
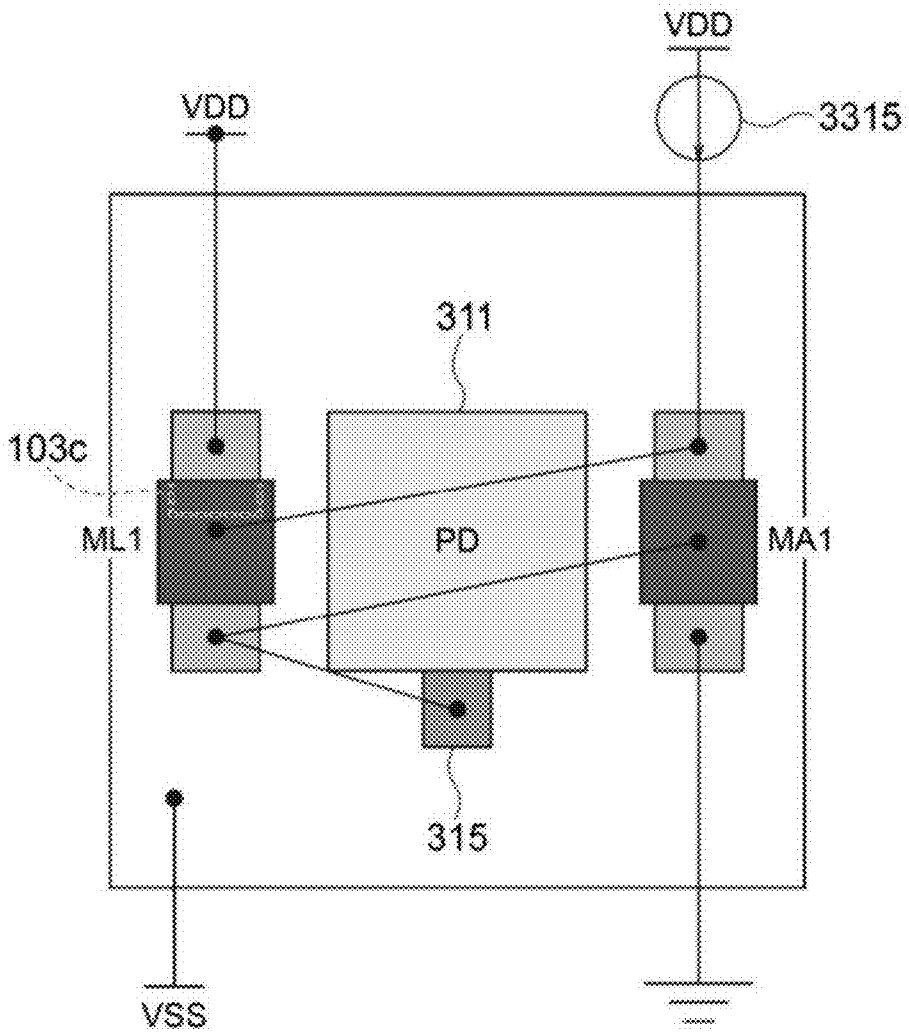
FIG. 25 is a top view illustrating an example of an arrangement of a configuration of a pixel according to the fourth embodiment.

FIG. 25 is a top view illustrating an example of an arrangement of a configuration of a pixel 30 according to the fourth embodiment.

The drain extension 103*c* extends from the drain layer 103*a*. Furthermore, the drain extension 103*c* is disposed so as to overlap the gate electrode 101*a* of the transistor ML1 when viewed from a direction substantially perpendicular to a substrate surface (substrate surface S1) on which the transistor ML1 is provided.

Note that, as illustrated in FIG. 25, the gate electrode 101*a* of the transistor ML1 may have substantially the same size as a gate electrode 101*b* of the transistor MA1.

FIGS. 26A to 26H are cross-sectional views illustrating an example of a manufacturing method of the transistors ML1 and MA according to the fifth embodiment. The left side of FIGS. 26A to 26H illustrates the manufacturing method of the transistor ML1, and the right side illustrates the manufacturing method of the transistor MA1.

Figure 26A:
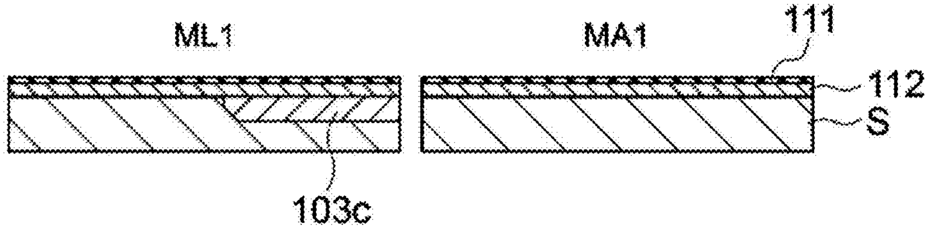
FIG. 26A is a cross-sectional view illustrating an example of a manufacturing method of the transistor according to the fifth embodiment.
Figure 26B:
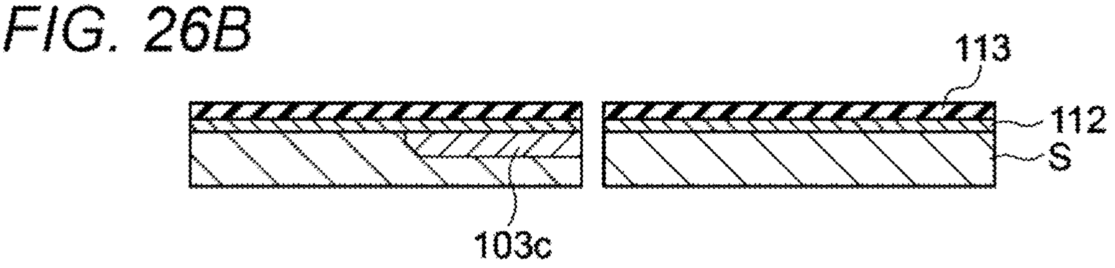
FIG. 26B is a cross-sectional view illustrating a step subsequent to FIG. 26A.
Figure 26C:
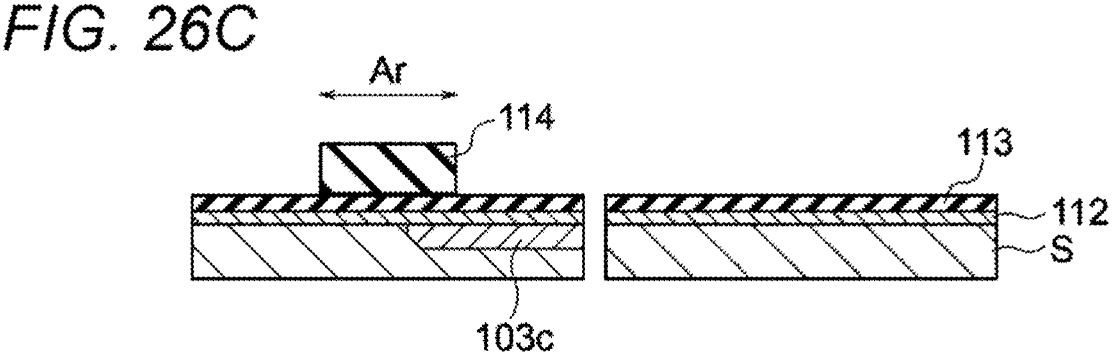
FIG. 26C is a cross-sectional view illustrating a step subsequent to FIG. 26B.
Figure 26D:
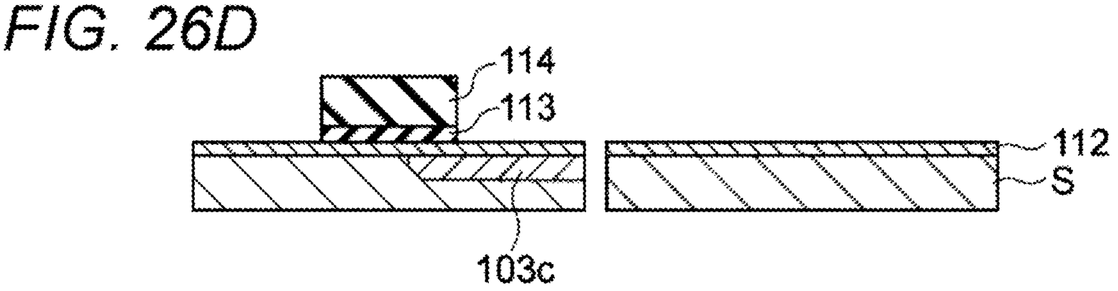
FIG. 26D is a cross-sectional view illustrating a step subsequent to FIG. 26C.
Figure 26E:
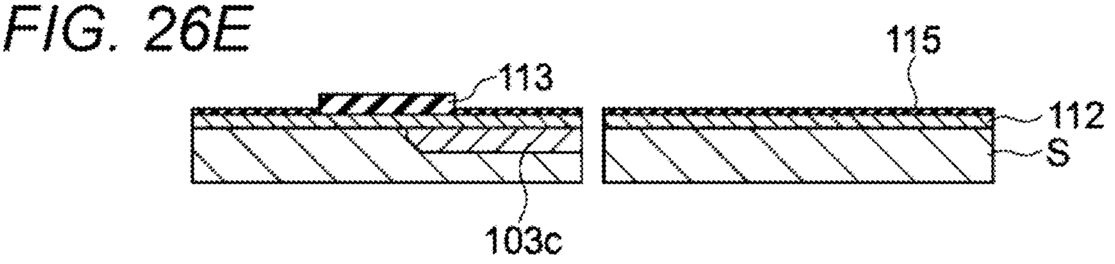
FIG. 26E is a cross-sectional view illustrating a step subsequent to FIG. 26D.
Figure 26F:
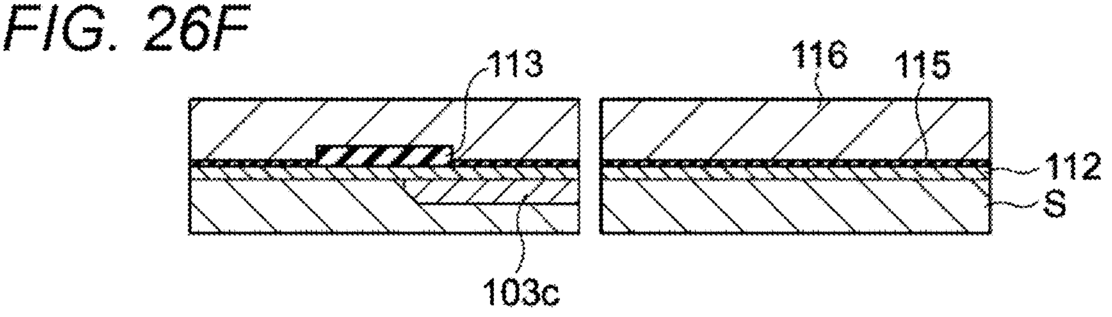
FIG. 26F is a cross-sectional view illustrating a step subsequent to FIG. 26E.
Figure 26G:
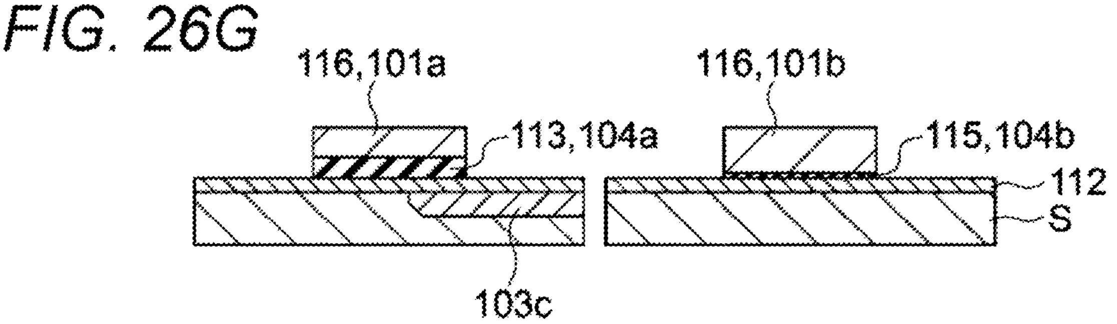
FIG. 26G is a cross-sectional view illustrating a step subsequent to FIG. 26F.
Figure 26H:
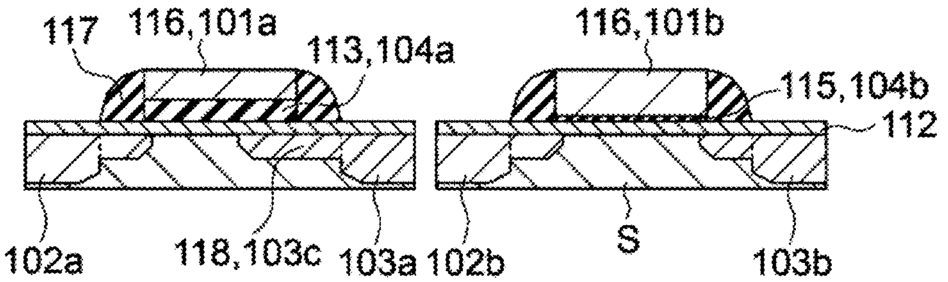
FIG. 26H is a cross-sectional view illustrating a step subsequent to FIG. 26G.

First, as illustrated in FIG. 26A, a sacrificial oxide film 111 is formed on the substrate S. Thereafter, channel impurities are introduced into the substrate S by ion implantation, drain impurities are introduced into the substrate S by ion implantation, and a wafer is heat-treated to activate the impurities. As a result, a channel impurity layer (channel impurity implanted region) 112 and the drain extension 103*c* are formed. The channel impurity is, for example, a P-type impurity such as boron. The drain impurity is, for example, an N-type impurity such as phosphorus.

Thereafter, as illustrated in FIGS. 26B to 26H, steps similar to those in FIGS. 17B to 17H described in the first embodiment are executed.

Note that, in the fifth embodiment, as illustrated in FIG. 26A, the drain extension 103*c* is formed before an insulating film 113 is formed. The drain impurity can be implanted with low energy, and the drain extension 103*c* can be formed relatively shallowly in some cases. By forming the drain extension 103*c* shallow, it is possible to suppress variations in threshold voltage due to the short channel effect. However, the formation of the drain extension 103*c* may be performed after the formation of the insulating film 113. Since the heat treatment time after the ion implantation of the drain impurity is short, diffusion of the impurity after the ion implantation is small, and the drain extension 103*c* can be formed relatively shallowly in some cases. By forming the drain extension 103*c* shallow, it is possible to suppress variations in threshold voltage due to the short channel effect.

As in the fifth embodiment, a magnitude relationship of the channel length may be changed between the transistor MAL and the transistor ML1. Also in this case, the similar effects to those of the first embodiment can be obtained.

Modification of Fifth Embodiment

FIGS. 27A to 27I are cross-sectional views illustrating an example of a manufacturing method of the transistors ML1 and MA1 according to a modification of the fifth embodiment. The left side of FIGS. 27A to 27I illustrates the manufacturing method of the transistor ML1, and the right side illustrates the manufacturing method of the transistor MA1.

The modification of the fifth embodiment is different from the fifth embodiment in a method of forming the gate insulating film 101*a* of the transistor ML1. The modification of the fifth embodiment is a combination of the fifth embodiment and the modification of the first embodiment.

Figure 27A:
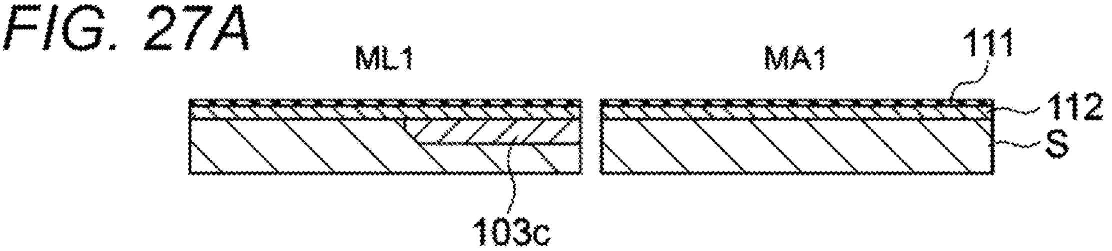
FIG. 27A is a cross-sectional view illustrating an example of a manufacturing method of a transistor according to a modification of the fifth embodiment.
Figure 27B:
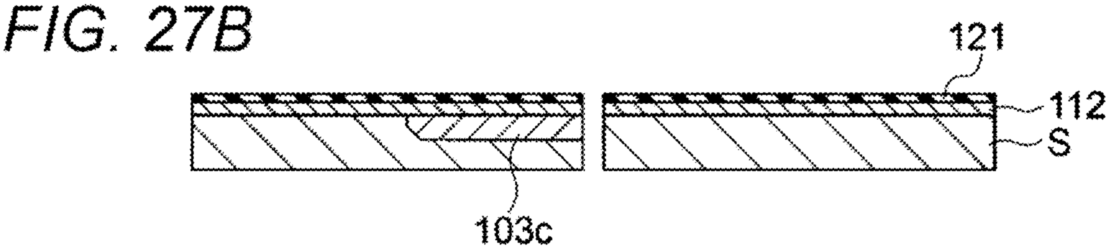
FIG. 27B is a cross-sectional view illustrating a step subsequent to FIG. 27A.
Figure 27C:
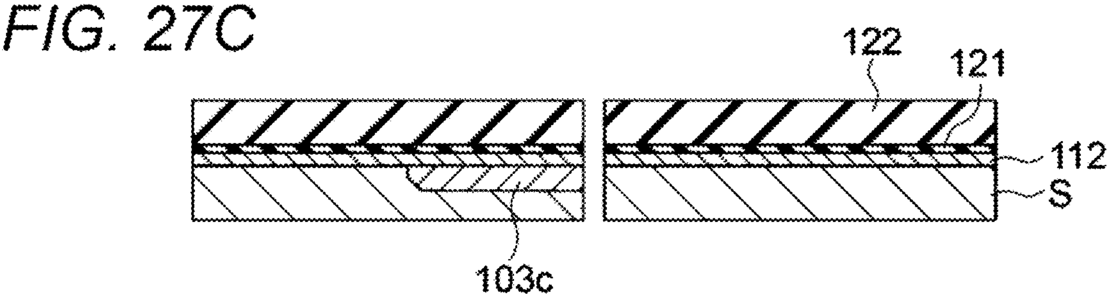
FIG. 27C is a cross-sectional view illustrating a step subsequent to FIG. 27B.
Figure 27D:
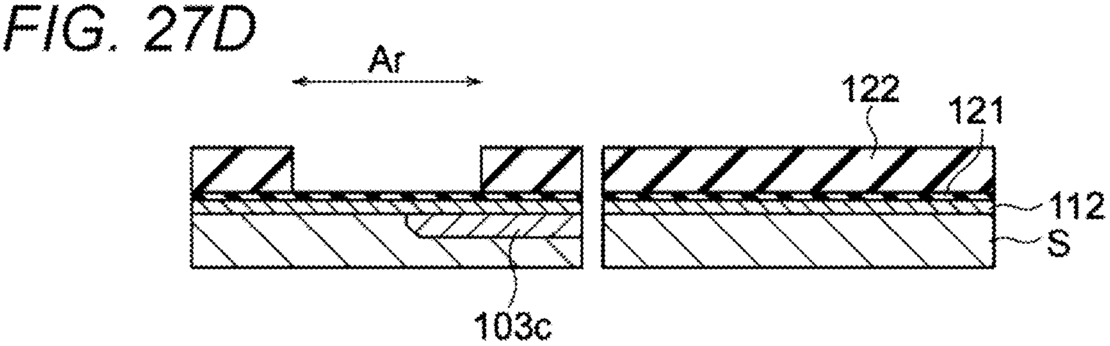
FIG. 27D is a cross-sectional view illustrating a step subsequent to FIG. 27C.
Figure 27E:
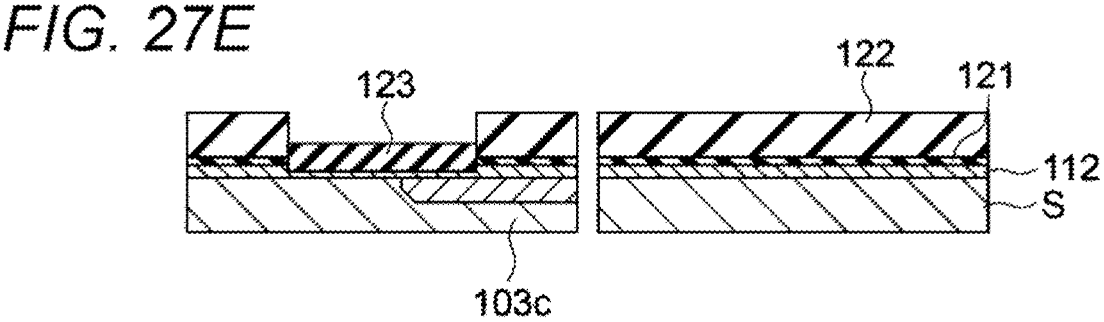
FIG. 27E is a cross-sectional view illustrating a step subsequent to FIG. 27D.
Figure 27F:
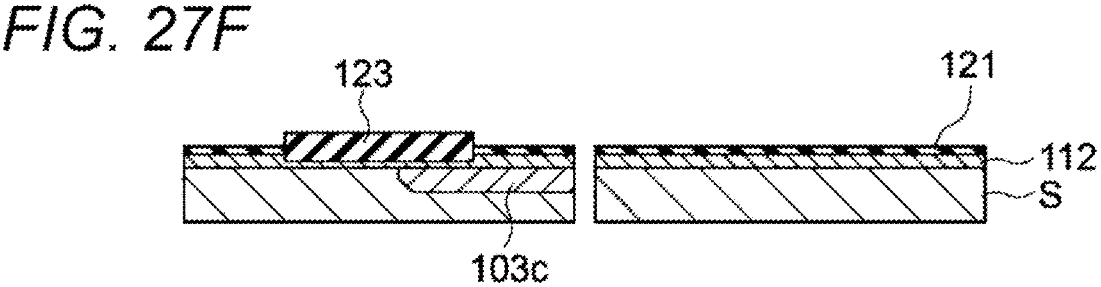
FIG. 27F is a cross-sectional view illustrating a step subsequent to FIG. 27E.
Figure 27G:
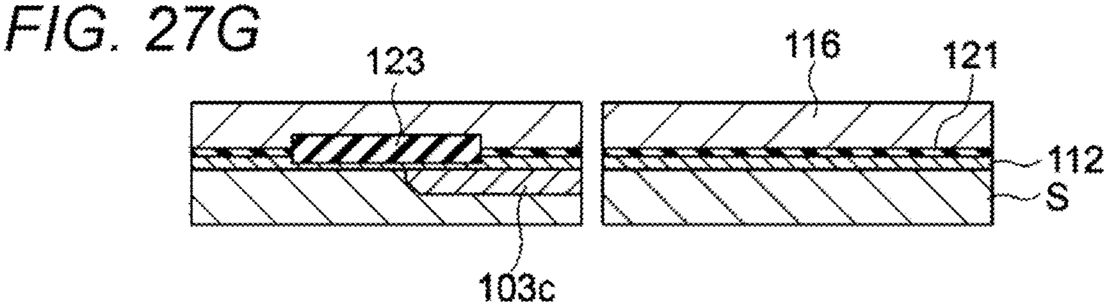
FIG. 27G is a cross-sectional view illustrating a step subsequent to FIG. 27F.
Figure 27H:
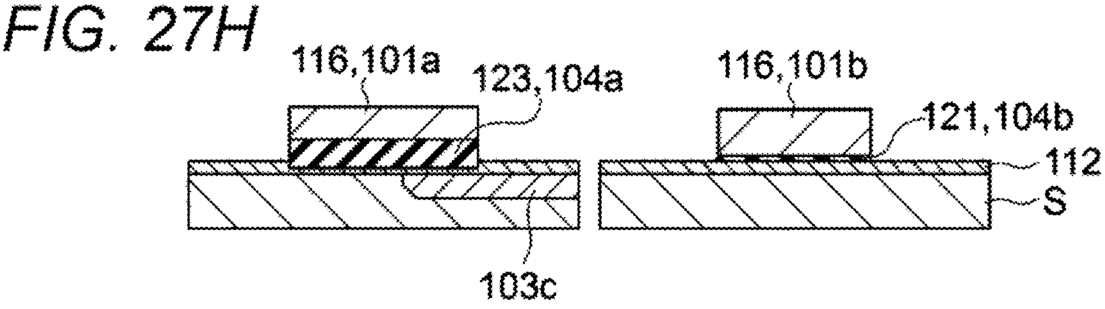
FIG. 27H is a cross-sectional view illustrating a step subsequent to FIG. 27G.
Figure 27I:
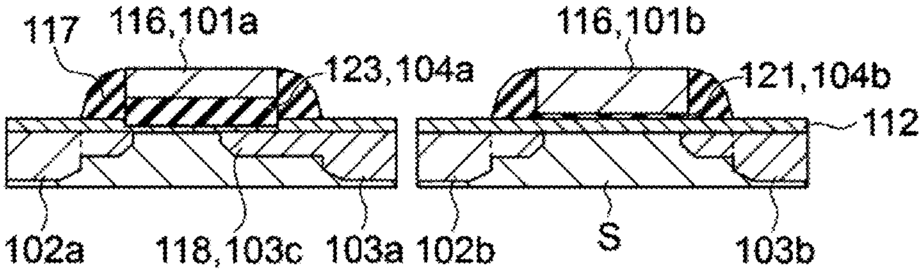
FIG. 27I is a cross-sectional view illustrating a step subsequent to FIG. 27H.

First, as illustrated in FIG. 27A, the sacrificial oxide film 111 is formed on the substrate S. Thereafter, channel impurities are introduced into the substrate S by ion implantation, drain impurities are introduced into the substrate S by ion implantation, and a wafer is heat-treated to activate the impurities. As a result, a channel impurity layer (channel impurity implanted region) 112 and the drain extension 103*c* are formed. The channel impurity is, for example, a P-type impurity such as boron. The drain impurity is, for example, an N-type impurity such as phosphorus.

Thereafter, as illustrated in FIGS. 27B to 27I, steps similar to those in FIGS. 18B to 18I described in the modification of the first embodiment are executed.

Note that, in the modification of the fifth embodiment, as illustrated in FIG. 27A, the drain extension 103*c* is formed before the formation of the insulating film 123. However, as described in the fifth embodiment, the formation of the drain extension 103*c* may be performed after the formation of the insulating film 123.

Sixth Embodiment

Figure 28:
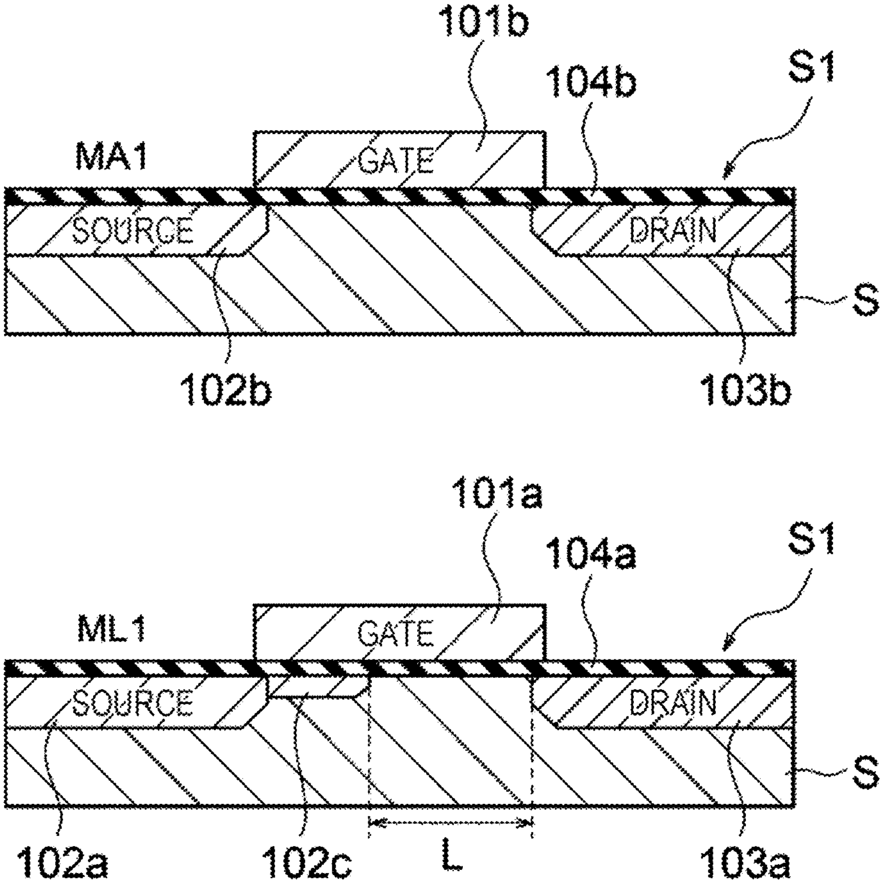
FIG. 28 is a cross-sectional view illustrating an example of a configuration of a transistor according to a sixth embodiment.

FIG. 28 is a cross-sectional view illustrating an example of a configuration of transistors ML1 and MA1 according to a sixth embodiment. The sixth embodiment is different from the fifth embodiment in that an extension (extension region) is provided in a source layer of the transistor ML1 instead of the drain layer.

The transistor ML1 includes a source extension (source extension region) 102*c* in contact with a source layer 102*a*. The impurity concentration of the source extension 102*c* is lower than the impurity concentration of the source layer 102*a*. The source extension 102*c* extends toward an opposing drain layer 103*a* below a gate electrode 101*a* (on a substrate S side). The source extension 102*c* can shorten an effective gate length L of the transistor ML1. As a result, the subthreshold slope of the transistor ML1 can be increased by the short channel effect, and the event detection sensitivity can be improved.

Figure 29:
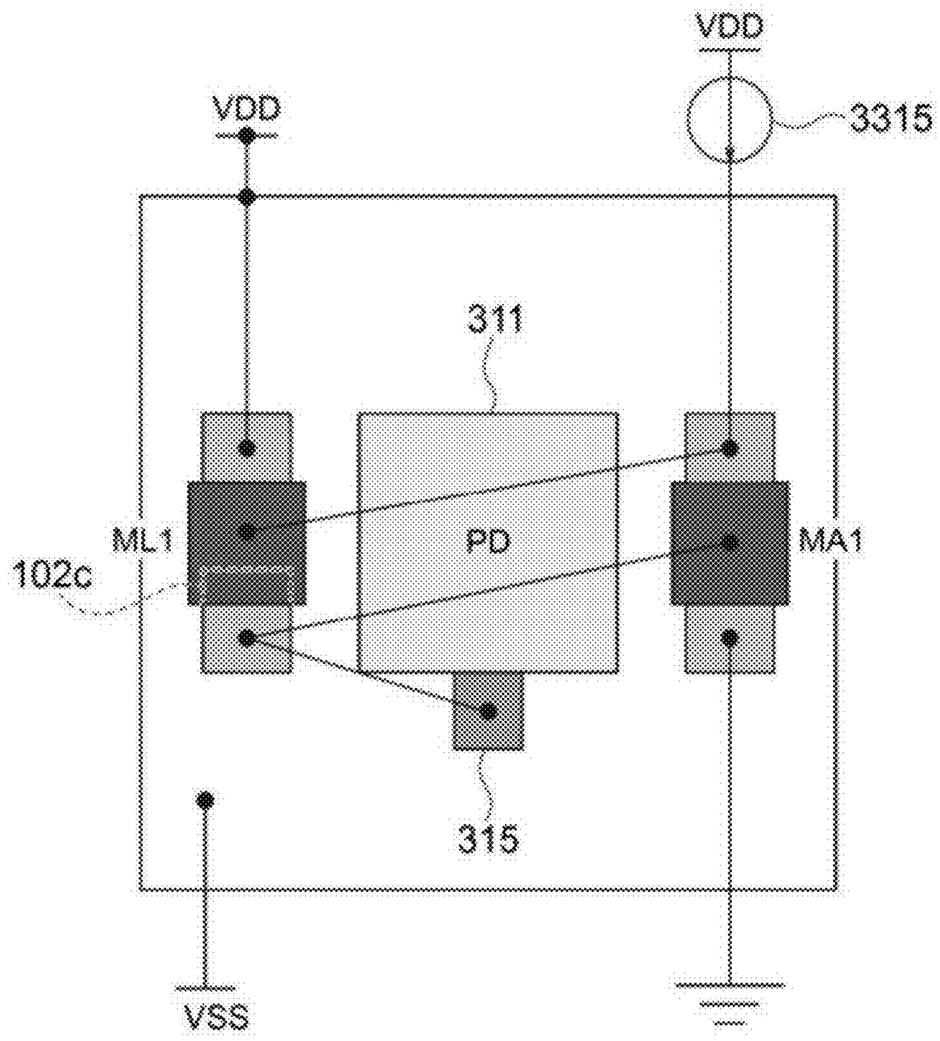
FIG. 29 is a top view illustrating an example of an arrangement of a configuration of a pixel according to the sixth embodiment.

FIG. 29 is a top view illustrating an example of an arrangement of a configuration of a pixel 30 according to the sixth embodiment.

The source extension 102*c* extends from the source layer 102*a*. Furthermore, the source extension 102*c* is disposed so as to overlap the gate electrode 101*a* of the transistor ML1 when viewed from a direction substantially perpendicular to a substrate surface (substrate surface S1) on which the transistor ML1 is provided.

Note that, as illustrated in FIG. 29, the gate electrode 101*a* of the transistor ML1 may have substantially the same size as a gate electrode 101*b* of the transistor MA1.

As in the sixth embodiment, an extension (extension region) may be provided in the source layer of the transistor ML1 instead of the drain layer. In this case, effects similar to those of the fifth embodiment can be obtained.

Seventh Embodiment

Figure 30:
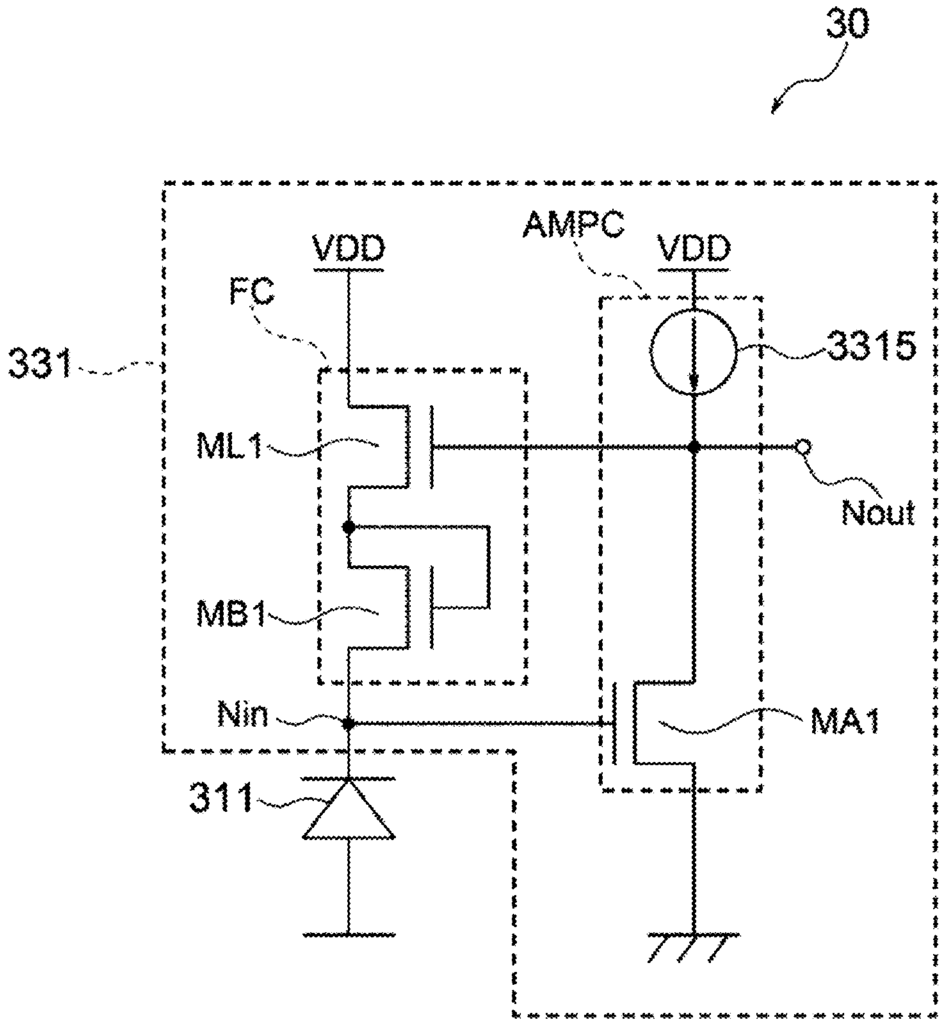
FIG. 30 is a circuit diagram illustrating an example of a configuration of a pixel according to a seventh embodiment.

FIG. 30 is a circuit diagram illustrating an example of a configuration of a pixel 30 according to a seventh embodiment. The seventh embodiment is different from the first embodiment in the configuration of a current-voltage conversion section 331.

A feedback circuit FC further includes a transistor MB1. The transistor MB1 is connected between an input node Nin and a transistor ML1. The transistor MB1 is, for example, an N-type transistor. The transistor MB1 is diode-connected.

The transistor MB1 amplifies a voltage of a node between a transistor ML1 and the transistor MB1 as a booster circuit and outputs the amplified voltage to the input node Nin. By providing the transistor MB1, the event detection sensitivity can be improved.

Furthermore, at least one gate insulating film of the transistors ML1 and MB1 is thicker than a thickness of a gate insulating film of a transistor MA1.

As in the seventh embodiment, the configuration of the current-voltage conversion section 331 may be different. Also in this case, the similar effects to those of the first embodiment can be obtained.

The second embodiment may be combined with the seventh embodiment. In this case, at least one gate insulating film of the transistors ML1 and MB1 is thicker than a thickness of a gate insulating film of a transistor included in a subsequent circuit. Note that the gate insulating film of the transistor MA1 may also be thicker than the gate insulating film of the transistor included in the subsequent circuit.

Eighth Embodiment

Figure 31:
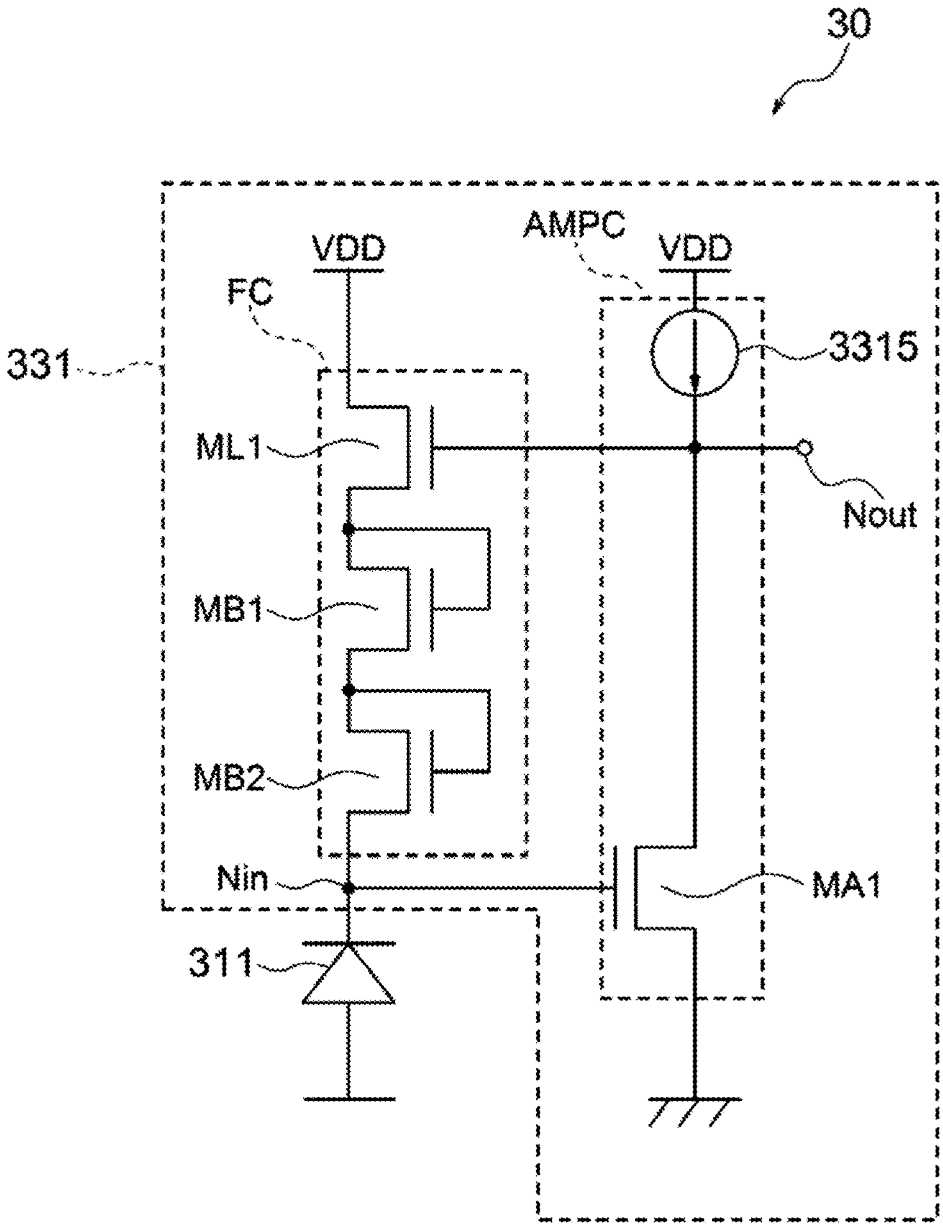
FIG. 31 is a circuit diagram illustrating an example of a configuration of a pixel according to an eighth embodiment.

FIG. 31 is a circuit diagram illustrating an example of a configuration of a pixel 30 according to an eighth embodiment. The eighth embodiment is different from the first embodiment in the configuration of a current-voltage conversion section 331.

A feedback circuit FC further includes a transistor MB2 as compared with the seventh embodiment. The transistor MB2 is connected between an input node Nin and a transistor MB1. The transistor MB1 is, for example, an N-type transistor. The transistor MB1 is diode-connected.

The transistors MB1 and MB2 amplify a voltage of a node between a transistor ML1 and the transistor MB1 as a booster circuit and output the amplified voltage to the input node Nin. By providing the transistors MB1 and MB2, the event detection sensitivity can be improved.

Therefore, a plurality of transistors may be connected between the input node Nin and the transistor ML1.

Furthermore, at least one gate insulating film of the transistors ML1, MB1, and MB2 is thicker than a thickness of a gate insulating film of a transistor MA1.

As in the eighth embodiment, the configuration of the current-voltage conversion section 331 may be different. Also in this case, the similar effects to those of the first embodiment can be obtained.

Furthermore, the second embodiment may be combined with the eighth embodiment. In this case, at least one gate insulating film of the transistors ML1, MB1, and MB2 is thicker than a thickness of a gate insulating film of a transistor included in a subsequent circuit. Note that the gate insulating film of the transistor MA1 may also be thicker than the gate insulating film of the transistor included in the subsequent circuit.

Ninth Embodiment

Figure 32:
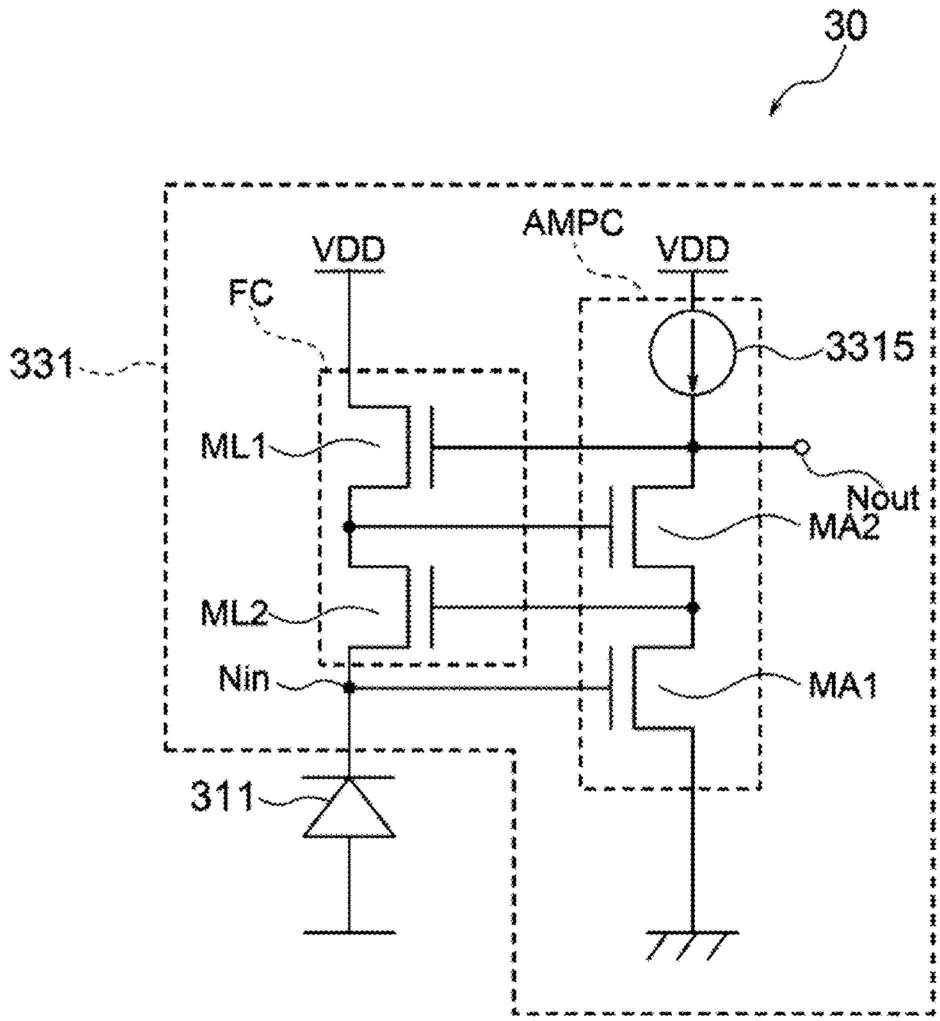
FIG. 32 is a circuit diagram illustrating an example of a configuration of a pixel according to a ninth embodiment.

FIG. 32 is a circuit diagram illustrating an example of a configuration of a pixel 30 according to a ninth embodiment. The ninth embodiment is different from the first embodiment in the configuration of a current-voltage conversion section 331.

A feedback circuit FC further includes a transistor ML2. An amplification circuit AMPC further includes a transistor MA2.

The transistor ML2 is connected between an input node Nin and a transistor ML1. The transistor ML2 is, for example, an N-type transistor. A gate of the transistor ML2 is connected to a node between a transistor MAL and the transistor MA2.

The transistor MA2 is connected between an output node Nout and the transistor MA1. The transistor MA2 is, for example, an N-type transistor. A gate of the transistor MA2 is connected to a node between the transistor ML1 and the transistor ML2.

The transistors ML1 and MA2 constitute one logarithmic conversion circuit (logarithmic conversion section), and the transistors ML2 and MA1 constitute one logarithmic conversion circuit.

The transistor ML2 amplifies a voltage of a node between the transistor ML1 and the transistor ML2 as a booster circuit and outputs the amplified voltage to the input node Nin. By providing the transistors ML2 and MA2, the event detection sensitivity can be improved.

Furthermore, at least one gate insulating film of the transistors ML1 and ML2 is thicker than gate insulating films of the transistors MA1 and MA2.

As in the ninth embodiment, the configuration of the current-voltage conversion section 331 may be changed. Also in this case, the similar effects to those of the first embodiment can be obtained.

Furthermore, the second embodiment may be combined with the ninth embodiment. In this case, at least one gate insulating film of the transistors ML1 and ML2 is thicker than a thickness of a gate insulating film of a transistor included in a subsequent circuit. Note that the gate insulating films of the transistors MA and MA2 may also be thicker than the gate insulating films of the transistor included in the subsequent circuit.

Tenth Embodiment

Figure 33:
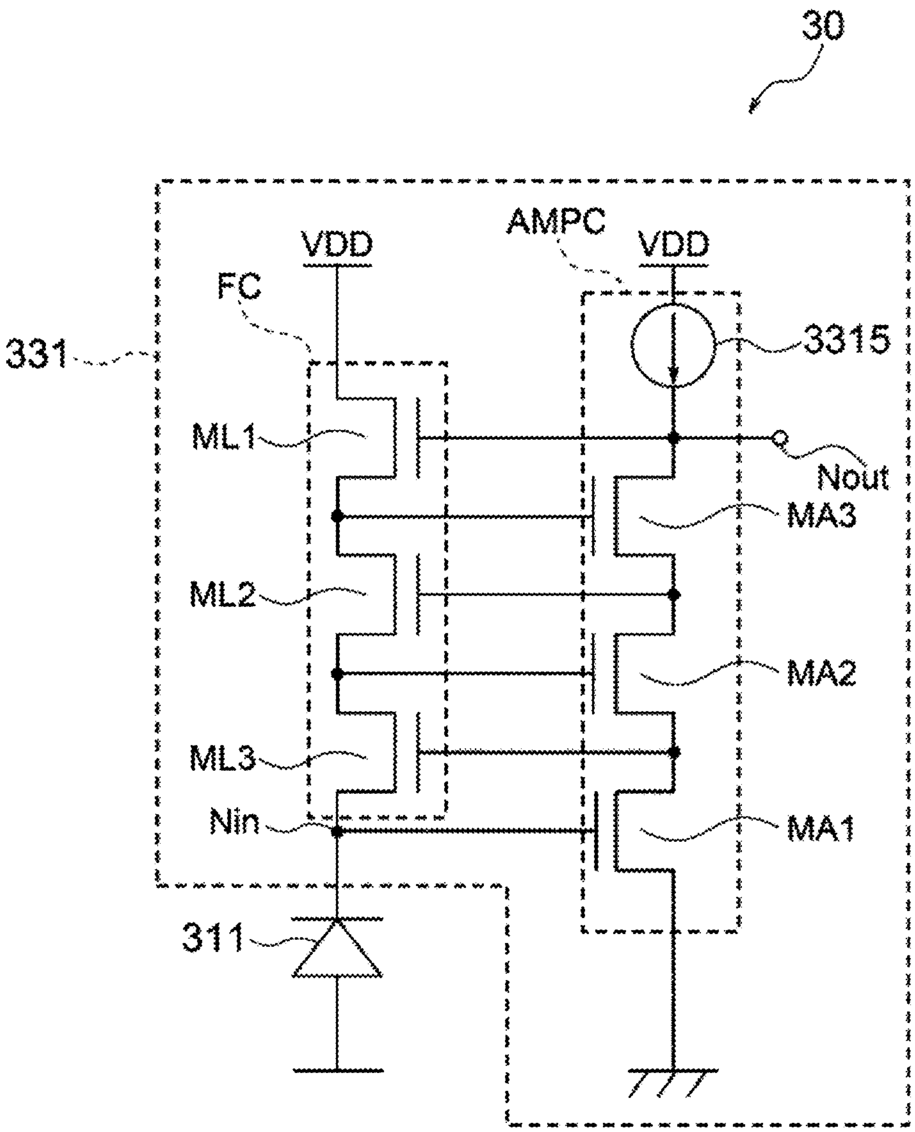
FIG. 33 is a circuit diagram illustrating an example of a configuration of a pixel according to a tenth embodiment.

FIG. 33 is a circuit diagram illustrating an example of a configuration of a pixel 30 according to a tenth embodiment. The eighth embodiment is different from the first embodiment in the configuration of a current-voltage conversion section 331.

A feedback circuit FC further includes a transistor ML3 as compared with the ninth embodiment. An amplification circuit AMPC further includes a transistor MA3 as compared with the ninth embodiment.

The transistor ML3 is connected between an input node Nin and a transistor ML2. The transistor ML3 is, for example, an N-type transistor. A gate of the transistor ML3 is connected to a node between a transistor MA1 and a transistor MA2.

Note that a gate of the transistor ML2 is connected to a node between the transistor MA2 and the transistor MA3.

The transistor MA3 is connected between an output node Nout and the transistor MA2. The transistor MA3 is, for example, an N-type transistor. A gate of the transistor MA3 is connected to a node between a transistor ML1 and the transistor ML2.

Note that a gate of the transistor MA2 is connected to a node between the transistor ML2 and the transistor ML3.

Therefore, a plurality of transistors may be connected between the input node Nin and the transistor ML1. A plurality of transistors may be connected between the output node Nout and the transistor MA1.

The transistors ML1 and MA3 constitute one logarithmic conversion circuit (logarithmic conversion section), the transistors ML2 and MA2 constitute one logarithmic conversion circuit, and the transistors ML3 and MA1 constitute one logarithmic conversion circuit.

The transistors ML2 and ML3 amplify a voltage of a node between the transistor ML1 and the transistor ML2 as a booster circuit and output the amplified voltage to the input node Nin. By providing the transistors ML2, ML3, MA2, and MA3, the event detection sensitivity can be improved.

Furthermore, at least one gate insulating film of the transistors ML1, ML2, ML3 is thicker than a thickness of gate insulating films of the transistors MA1, MA2, MA3.

As in the tenth embodiment, the configuration of the current-voltage conversion section 331 may be different. Also in this case, the similar effects to those of the first embodiment can be obtained.

Furthermore, the second embodiment may be combined with the tenth embodiment. In this case, at least one gate insulating film of the transistors ML1, ML2, ML3 is thicker than a thickness of a gate insulating film of a transistor included in a subsequent circuit. Note that the gate insulating films of the transistors MA1, MA2, and MA3 may also be thicker than the gate insulating film of the transistor included in the subsequent circuit.

Eleventh Embodiment

Figure 34:
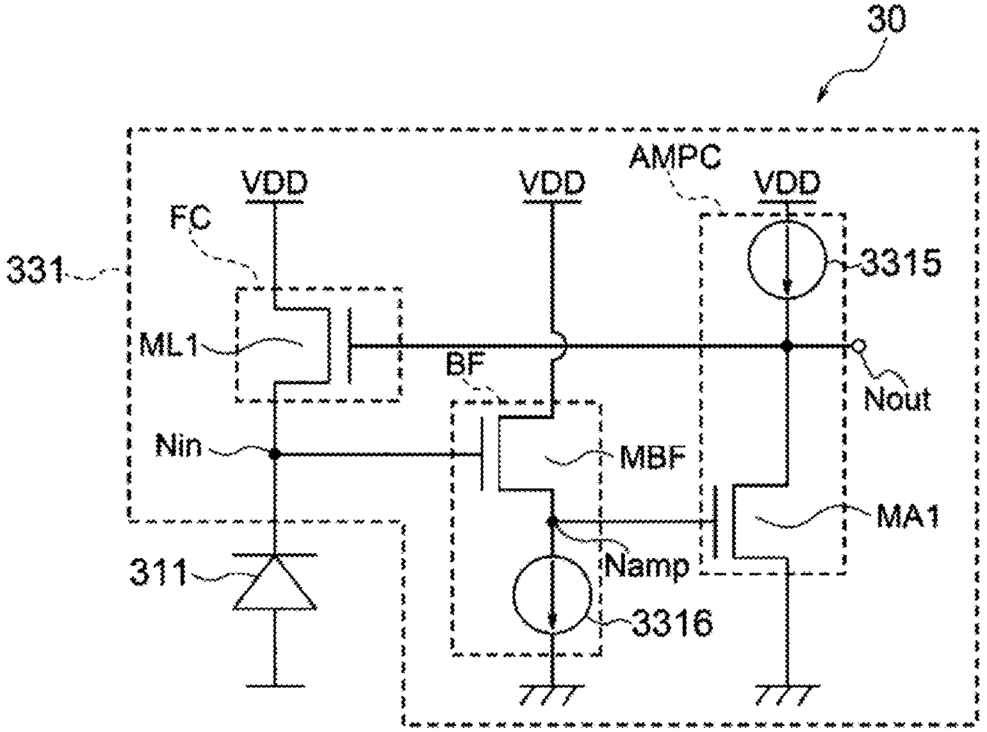
FIG. 34 is a circuit diagram illustrating an example of a configuration of a pixel according to an eleventh embodiment.

FIG. 34 is a circuit diagram illustrating an example of a configuration of a pixel 30 according to an eleventh embodiment. The eleventh embodiment is different from the first embodiment in the configuration of a current-voltage conversion section 331.

The current-voltage conversion section 331 further includes a buffer BF. The buffer BF is connected between an input node Nin and an amplification node Namp.

The buffer BF includes a transistor MBF and a current source 3316.

The transistor MBF is connected between a power supply voltage VDD and the amplification node Namp. A gate of the transistor MBF is connected to the input node Nin. The transistor MBF is, for example, an N-type transistor.

The current source 3316 is connected between the amplification node Namp and the ground. The current source 3316 supplies a bias current to the transistor MBF.

As in the eleventh embodiment, the configuration of the current-voltage conversion section 331 may be different. Also in this case, the similar effects to those of the first embodiment can be obtained.

Furthermore, the second embodiment may be combined with the eleventh embodiment. In this case, a gate insulating film of a transistor ML1 is thicker than a gate insulating film of a transistor included in a subsequent circuit. Note that gate insulating films of the transistors MA1 and MBF may also be thicker than the gate insulating film of the transistor included in the subsequent circuit.

Twelfth Embodiment

Figure 35:
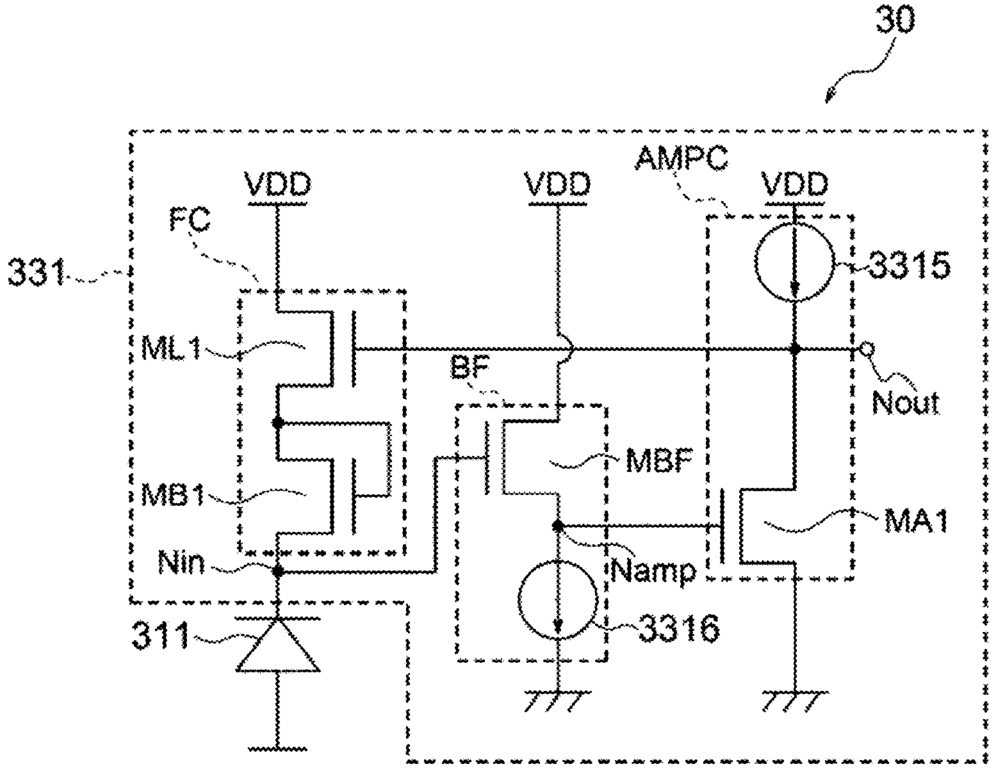
FIG. 35 is a circuit diagram illustrating an example of a configuration of a pixel according to a twelfth embodiment.

FIG. 35 is a circuit diagram illustrating an example of a configuration of a pixel 30 according to a twelfth embodiment. The twelfth embodiment is different from the first embodiment in the configuration of a current-voltage conversion section 331.

A feedback circuit FC in the twelfth embodiment is further provided with a transistor MB1 as compared with the eleventh embodiment. Therefore, the twelfth embodiment is a combination of the eleventh embodiment and the seventh embodiment.

Furthermore, at least one gate insulating film of a transistor ML1 and the transistor MB1 is thicker than a thickness of a gate insulating film of a transistor MA1.

As in the twelfth embodiment, the configuration of the current-voltage conversion section 331 may be different. Also in this case, the similar effects to those of the first embodiment can be obtained.

Furthermore, the second embodiment may be combined with the twelfth embodiment. At least one gate insulating film of the transistors ML1 and MB1 is thicker than a thickness of a gate insulating film of a transistor included in a subsequent circuit. Note that gate insulating films of the transistor MAL and a transistor MBF may also be thicker than the gate insulating film of the transistor included in the subsequent circuit.

<Application Example to Electronic Device>

Figure 36:
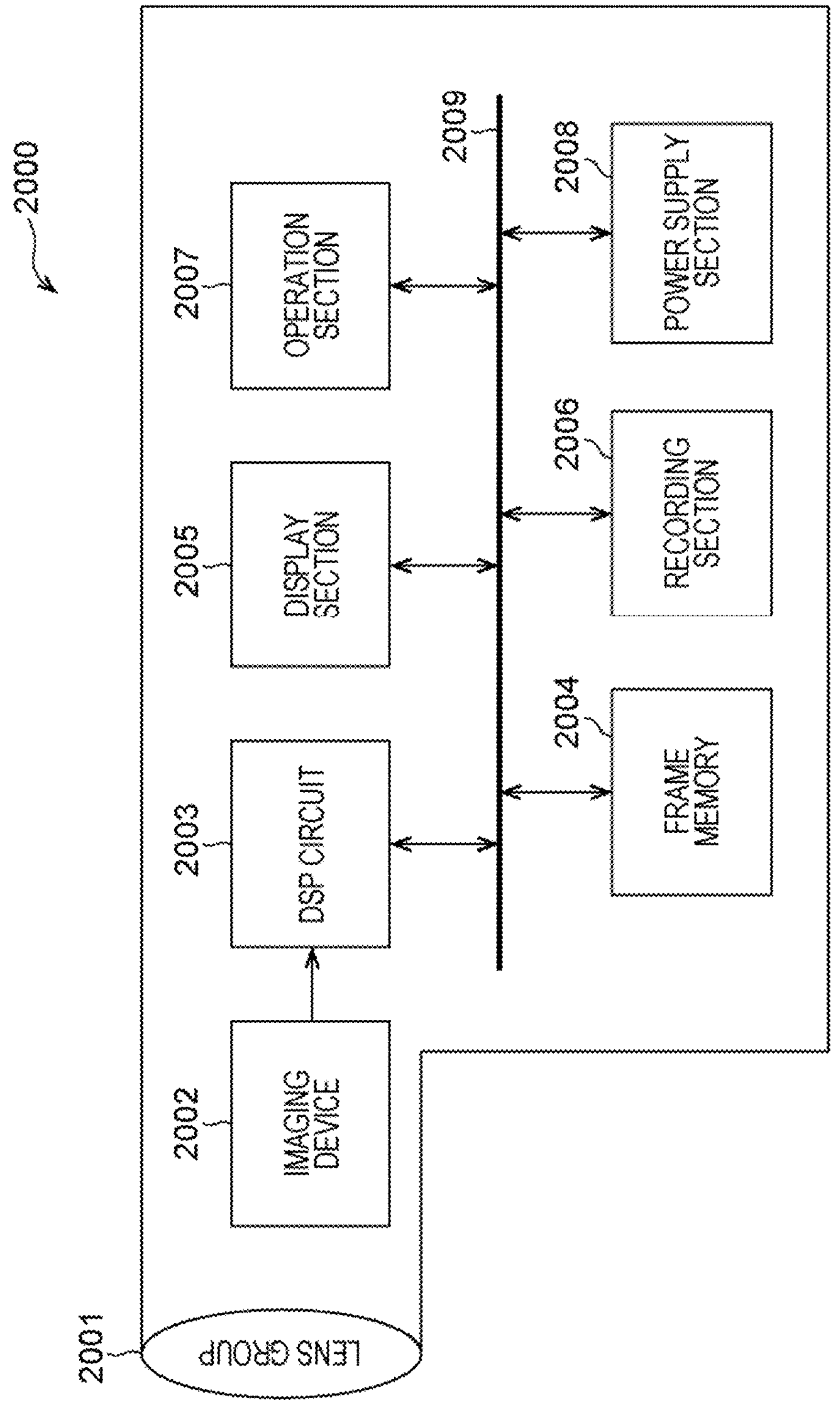
FIG. 36 is a schematic diagram illustrating an overall configuration example of an electronic device.

FIG. 36 is a block diagram illustrating a configuration example of a camera 2000 as an electronic device to which the present technology is applied.

The camera 2000 includes an optical section 2001 including a lens group and the like, an imaging device 2002 to which the above-described imaging system 10 and the like (Hereinafter, the imaging system is referred to as imaging system 10 or the like.) are applied, and a digital signal processor (DSP) circuit 2003 which is a camera signal processing circuit. Furthermore, the camera 2000 includes a frame memory 2004, a display section 2005, a recording section 2006, an operation section 2007, and a power supply section 2008. The DSP circuit 2003, the frame memory 2004, the display section 2005, the recording section 2006, the operation section 2007, and the power supply section 2008 are connected to one another through a bus line 2009.

The optical section 2001 captures incident light (image light) from the subject and forms an image on the imaging surface of the imaging device 2002. The imaging device 2002 converts the amount of the incident light from which an image is formed on the imaging surface by the optical section 2001 into an electrical signal in units of pixels, and outputs the electrical signal as a pixel signal.

The display section 2005 is formed with a panel type display device such as a liquid crystal panel or an organic EL panel, for example, and displays a moving image or a still image captured by the imaging device 2002. The recording section 2006 records the moving image or the still image captured by the imaging device 2002 on a recording medium such as a hard disk or a semiconductor memory.

The operation section 2007 issues operation commands for various functions of the camera 2000, in response to an operation performed by a user. The power supply section 2008 supplies, as appropriate, various power sources serving as operation power sources for the DSP circuit 2003, the frame memory 2004, the display section 2005, the recording section 2006, and the operation section 2007, to these supply targets.

As described above, by using the above-described imaging system 10 or the like as the imaging device 2002, acquisition of a good image can be expected.

<Application Example to Mobile Body>

The technology according to the present disclosure (the present technology) can be applied to various products. For example, the technology according to the present disclosure may be achieved in the form of a device to be mounted on a mobile body of any kind, such as an automobile, an electric vehicle, a hybrid electric vehicle, a motorcycle, a bicycle, a personal mobility, an airplane, a drone, a vessel, or a robot.

Figure 37:
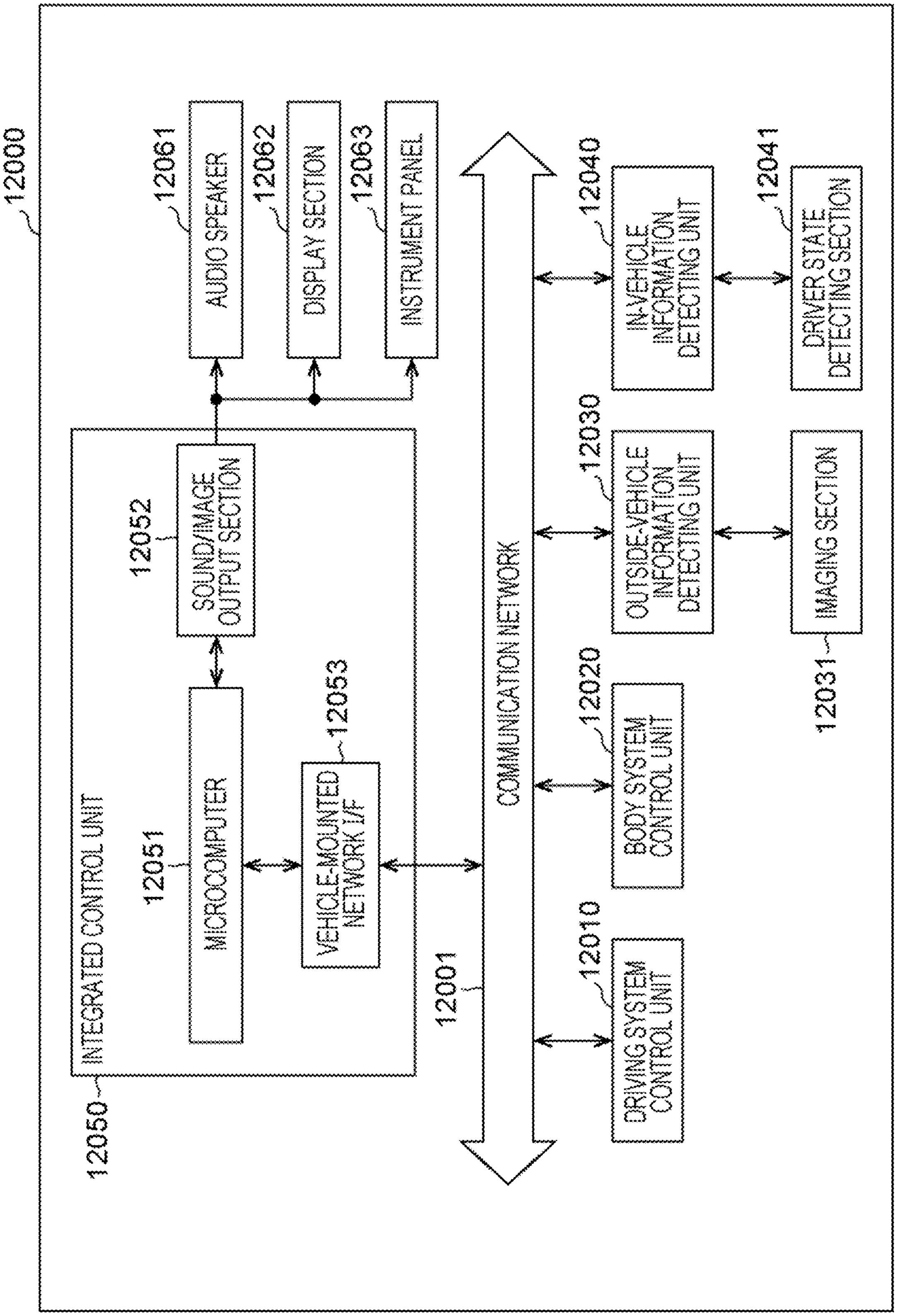
FIG. 37 is a block diagram illustrating an example of a schematic configuration of a vehicle control system.

FIG. 37 is a block diagram illustrating a schematic configuration example of a vehicle control system that is an example of a mobile body control system to which the technology according to the present disclosure can be applied.

The vehicle control system 12000 includes a plurality of electronic control units connected to each other via a communication network 12001. In the example illustrated in FIG. 37, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 37, an audio speaker 12061, a display section 12062, and an instrument panel 12063 are illustrated as output devices. The display section 12062 may, for example, include at least one of an on-board display and a head-up display.

Figure 38:
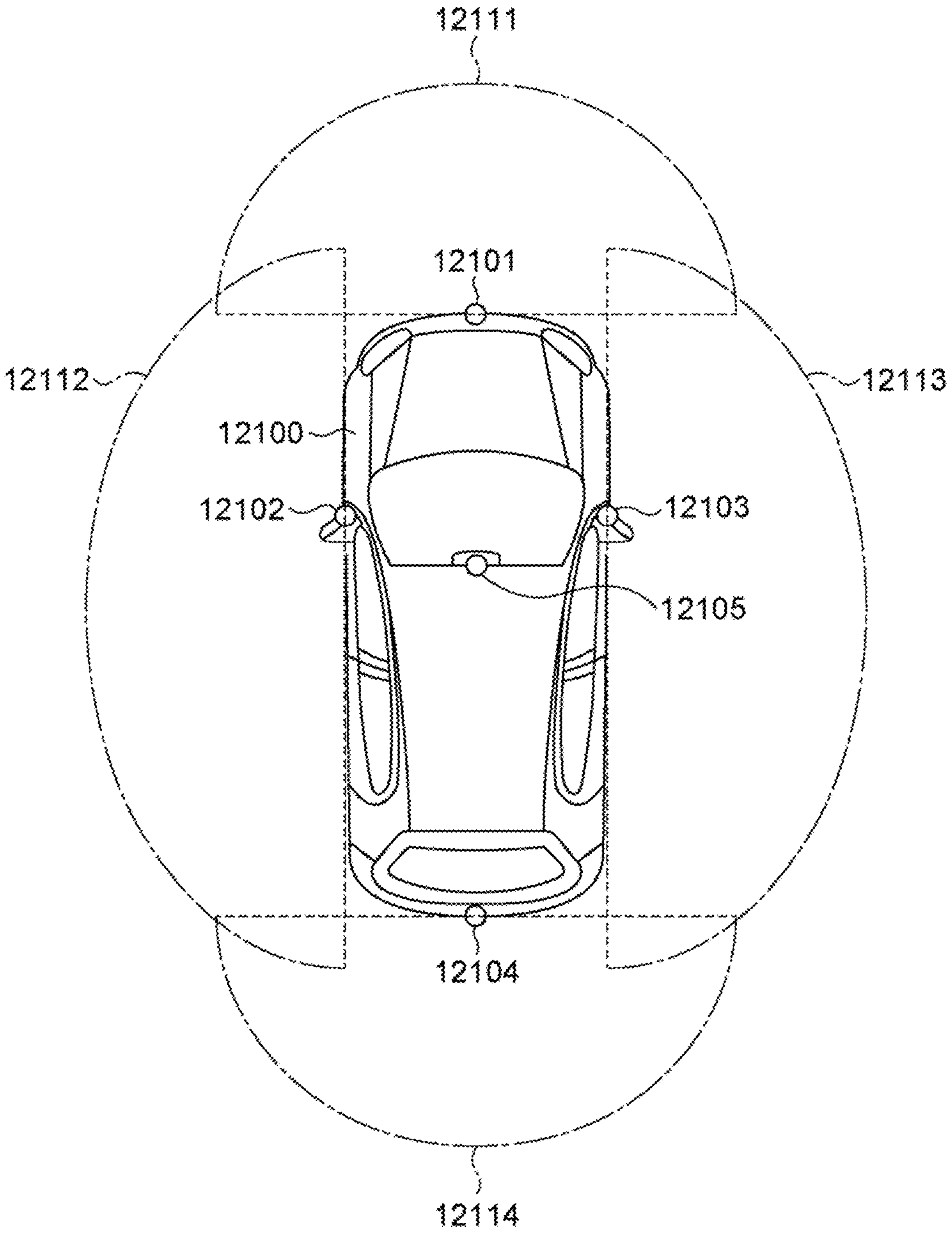
FIG. 38 is an explanatory diagram illustrating an example of installation positions of an outside-vehicle information detection section and an imaging section.

FIG. 38 is a diagram illustrating an example of an installation position of the imaging section 12031.

In FIG. 38, imaging sections 12101, 12102, 12103, 12104, and 12105 are included as the imaging section 12031.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Note that FIG. 38 illustrates an example of imaging ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure can be applied has been described above. The technology according to the present disclosure can be applied to, for example, the imaging sections 12031, 12101, 12102, 12103, 12104, 12105, and the like among the above-described configurations. Specifically, for example, the imaging system 10 in FIG. 1 can be applied to these imaging sections. By applying the technology according to the present disclosure to these imaging sections, it is possible to obtain a captured image with higher sensitivity, and thus, it is possible to perform highly accurate control using the captured image in the mobile body control system.

Note that the present technology may have the following configurations.

(1)

A light detection element including:

a light reception section that generates a charge according to an amount of received light;

a voltage conversion section that acquires the charge generated in the light reception section via an input node, converts the charge into a voltage signal, and outputs the voltage signal from an output node;

a signal amplification section that amplifies the voltage signal; and a comparison section that compares a voltage of the voltage signal amplified by the signal amplification section with a predetermined voltage, in which the voltage conversion section includes:

an amplification circuit connected between the input node and the output node; and a feedback circuit connected between the input node and the output node, and a gate insulating film of at least one transistor included in the feedback circuit is thicker than gate insulating films of transistors included in the signal amplification section and the comparison section.

(2)

The light detection element according to (1), in which a subthreshold slope of at least one transistor included in the feedback circuit is higher than subthreshold slopes of transistors included in the signal amplification section and the comparison section.

(3)

The light detection element according to (1) or (2), in which the amplification circuit includes:

a second transistor connected between the output node and a first reference voltage node and including a gate electrically connected to the input node; and a current source connected between the output node and a second reference voltage node different from the first reference voltage node, and a gate insulating film of at least one transistor included in the feedback circuit is thicker than a gate insulating film of the second transistor.

(4)

The light detection element according to any one of (1) to (3), in which the amplification circuit includes:

a second transistor connected between the output node and a first reference voltage node and including a gate electrically connected to the input node; and a current source connected between the output node and a second reference voltage node different from the first reference voltage node, and a subthreshold slope of at least one transistor included in the feedback circuit is higher than a subthreshold slope of the second transistor.

(5)

The light detection element according to any one of (1) to (4), in which the feedback circuit includes a first transistor connected between the input node and a third reference voltage node and including a gate electrically connected to the output node.

(6)

The light detection element according to (5), in which the feedback circuit further includes a third transistor connected between the input node and the first transistor, and the third transistor amplifies a voltage of a node between the first transistor and the third transistor and outputs the amplified voltage to the input node.

(7)

The light detection element according to (5) or (6), in which the amplification circuit includes:

a second transistor connected between the output node and a first reference voltage node and including a gate electrically connected to the input node; and a current source connected between the output node and a second reference voltage node different from the first reference voltage node, and a channel length of the first transistor is shorter than a channel length of the second transistor.

(8)

The light detection element according to (7), in which a length of the gate electrode of the first transistor in a channel length direction is shorter than a length of the gate electrode of the second transistor in the channel length direction.

(9)

The light detection element according to (7), in which the first transistor includes at least one of a source extension provided so as to extend from a source layer toward a drain layer and having an impurity concentration lower than an impurity concentration of the source layer, and a drain extension provided so as to extend from the drain layer toward the source layer and having an impurity concentration lower than an impurity concentration of the drain layer, and the source extension and the drain extension are disposed so as to overlap the gate electrode of the first transistor when viewed from a direction substantially perpendicular to a substrate surface on which the first transistor is provided.

(10)

The light detection element according to any one of (1) to (9), further including a first transfer transistor that is connected between the light reception section and the input node and transfers the charge generated by the light reception section to the input node, in which a gate insulating film of at least one transistor included in the feedback circuit is thicker than a gate insulating film of the first transfer transistor.

(11)

The light detection element according to (10), further including:

a charge accumulation section that stores a charge; and a second transfer transistor that is connected between the light reception section and the charge accumulation section and transfers the charge generated by the light reception section to the charge accumulation section, in which a gate insulating film of at least one transistor included in the feedback circuit is thicker than a gate insulating film of the second transfer transistor.

(12)

The light detection element according to any one of (1) to (11), in which the amplification circuit includes:

a second transistor connected between the output node and a first reference voltage node and including a gate electrically connected to the input node; and a current source connected between the output node and a second reference voltage node different from the first reference voltage node, and a gate insulating film of the second transistor is thicker than gate insulating films of transistors included in the signal amplification section and the comparison section.

(13)

The light detection element according to any one of (1) to (12), in which an end portion on a substrate side of the gate insulating film of at least one transistor included in the feedback circuit is located closer to the substrate side than an end portion on the substrate side of a gate insulating film of a transistor included in the amplification circuit.

(14)

The light detection element according to any one of (1) to (13), in which the amplification circuit includes:

a second transistor connected between the output node and a first reference voltage node and including a gate electrically connected to the input node; and a current source connected between the output node and a second reference voltage node different from the first reference voltage node, and the light detection element further includes:

a first semiconductor chip on which the light reception section, the feedback circuit, and the second transistor are disposed; and a second semiconductor chip stacked on the first semiconductor chip and on which the current source, the signal amplification section, and the comparison section are disposed.

(15)

The light detection element according to any one of (1) to (14), in which a thickness of the gate insulating film of at least one transistor included in the feedback circuit is 5 nm or more.

(16)

The light detection element according to any one of (1) to (15), in which a threshold slope of at least one transistor included in the feedback circuit is 100 mV/decade or more.

(17)

An electronic device including the light detection element according to any one of (1) to (16).

(18)

A manufacturing method of a light detection element including:

a light reception section that generates a charge according to an amount of received light;

a voltage conversion section that acquires the charge generated in the light reception section via an input node, converts the charge into a voltage signal, and outputs the voltage signal from an output node;

a signal amplification section that amplifies the voltage signal; and a comparison section that compares a voltage of the voltage signal amplified by the signal amplification section with a predetermined voltage, the voltage conversion section including:

an amplification circuit connected between the input node and the output node; and a feedback circuit connected between the input node and the output node, and a gate insulating film of at least one transistor included in the feedback circuit being thicker than gate insulating films of transistors included in the signal amplification section and the comparison section, the manufacturing method including forming the gate insulating film of at least one transistor included in the feedback circuit by local oxidation of silicon (LOCOS).

Aspects of the present disclosure are not limited to the above-described individual embodiments, but include various modifications that can be conceived by those skilled in the art, and the effects of the present disclosure are not limited to the above-described contents. That is, various additions, modifications, and partial deletions are possible without departing from the conceptual idea and spirit of the present disclosure derived from the matters defined in the claims and equivalents thereof.

REFERENCE SIGNS LIST

10 Imaging system
11 Imaging lens
12 Recording section
13 Control section
20 Imaging device
21 Pixel array section
22 Drive section
23 Arbiter section
24 Column processing section
25 Signal processing section
27 Read area selection section
28 Signal generation section
30 Pixel
31 Light reception section
32 Pixel signal generation section
33 Address event detection section
101*a* to 101*b* Gate electrode
102*c* Source extension
103*c* Drain extension
104*a* to 104*b* Gate insulating film
311 Light reception element
333 Subtractor
334 Quantizer
CH1 First semiconductor chip
CH2 Second semiconductor chip
S Substrate
S1 Substrate surface
ML1 to ML3 Transistor
MB1 to MB2 Transistor
MA1 to MA3 Transistor
MBF Transistor
TG0 to TG1 Transistor
Nin Input node
Nout Output node
L Effective gate length

The invention claimed is:

1. A light detection element comprising:

a light reception section that generates a charge according to an amount of received light;

a voltage conversion section that acquires the charge generated in the light reception section via an input node, converts the charge into a voltage signal, and outputs the voltage signal from an output node;

a signal amplification section that amplifies the voltage signal; and a comparison section that compares a voltage of the voltage signal amplified by the signal amplification section with a predetermined voltage, wherein the voltage conversion section includes:

an amplification circuit connected between the input node and the output node; and a feedback circuit connected between the input node and the output node, and a gate insulating film of at least one transistor included in the feedback circuit is thicker than gate insulating films of transistors included in the signal amplification section and the comparison section.

2. The light detection element according to claim 1, wherein a subthreshold slope of at least one transistor included in the feedback circuit is higher than subthreshold slopes of transistors included in the signal amplification section and the comparison section.

3. The light detection element according to claim 1, wherein the amplification circuit includes:

a second transistor connected between the output node and a first reference voltage node and including a gate electrically connected to the input node; and a current source connected between the output node and a second reference voltage node different from the first reference voltage node, and a gate insulating film of at least one transistor included in the feedback circuit is thicker than a gate insulating film of the second transistor.

4. The light detection element according to claim 1, wherein the amplification circuit includes:

a second transistor connected between the output node and a first reference voltage node and including a gate electrically connected to the input node; and a current source connected between the output node and a second reference voltage node different from the first reference voltage node, and a subthreshold slope of at least one transistor included in the feedback circuit is higher than a subthreshold slope of the second transistor.

5. The light detection element according to claim 1, wherein the feedback circuit includes a first transistor connected between the input node and a third reference voltage node and including a gate electrically connected to the output node.

6. The light detection element according to claim 5, wherein the feedback circuit further includes a third transistor connected between the input node and the first transistor, and the third transistor amplifies a voltage of a node between the first transistor and the third transistor and outputs the amplified voltage to the input node.

7. The light detection element according to claim 5, wherein the amplification circuit includes:

a second transistor connected between the output node and a first reference voltage node and including a gate electrically connected to the input node; and a current source connected between the output node and a second reference voltage node different from the first reference voltage node, and a channel length of the first transistor is shorter than a channel length of the second transistor.

8. The light detection element according to claim 7, wherein a length of the gate electrode of the first transistor in a channel length direction is shorter than a length of the gate electrode of the second transistor in the channel length direction.

9. The light detection element according to claim 7, wherein the first transistor includes at least one of a source extension provided so as to extend from a source layer toward a drain layer and having an impurity concentration lower than an impurity concentration of the source layer, and a drain extension provided so as to extend from the drain layer toward the source layer and having an impurity concentration lower than an impurity concentration of the drain layer, and the source extension and the drain extension are disposed so as to overlap the gate electrode of the first transistor when viewed from a direction substantially perpendicular to a substrate surface on which the first transistor is provided.

10. The light detection element according to claim 1, further comprising a first transfer transistor that is connected between the light reception section and the input node and transfers the charge generated by the light reception section to the input node, wherein a gate insulating film of at least one transistor included in the feedback circuit is thicker than a gate insulating film of the first transfer transistor.

11. The light detection element according to claim 10, further comprising:

a charge accumulation section that stores a charge; and a second transfer transistor that is connected between the light reception section and the charge accumulation section and transfers the charge generated by the light reception section to the charge accumulation section, wherein a gate insulating film of at least one transistor included in the feedback circuit is thicker than a gate insulating film of the second transfer transistor.

12. The light detection element according to claim 1, wherein the amplification circuit includes:

a second transistor connected between the output node and a first reference voltage node and including a gate electrically connected to the input node; and a current source connected between the output node and a second reference voltage node different from the first reference voltage node, and a gate insulating film of the second transistor is thicker than gate insulating films of transistors included in the signal amplification section and the comparison section.

13. The light detection element according to claim 1, wherein an end portion on a substrate side of the gate insulating film of at least one transistor included in the feedback circuit is located closer to the substrate side than an end portion on the substrate side of a gate insulating film of a transistor included in the amplification circuit.

14. The light detection element according to claim 1, wherein the amplification circuit includes:

a second transistor connected between the output node and a first reference voltage node and including a gate electrically connected to the input node; and a current source connected between the output node and a second reference voltage node different from the first reference voltage node, and the light detection element further includes:

a first semiconductor chip on which the light reception section, the feedback circuit, and the second transistor are disposed; and a second semiconductor chip stacked on the first semiconductor chip and on which the current source, the signal amplification section, and the comparison section are disposed.

15. The light detection element according to claim 1, wherein a thickness of the gate insulating film of at least one transistor included in the feedback circuit is 5 nm or more.

16. The light detection element according to claim 1, wherein a threshold slope of at least one transistor included in the feedback circuit is 100 mV/decade or more.

17. An electronic device comprising the light detection element according to claim 1.

18. A manufacturing method of a light detection element including:

a light reception section that generates a charge according to an amount of received light;

a voltage conversion section that acquires the charge generated in the light reception section via an input node, converts the charge into a voltage signal, and outputs the voltage signal from an output node;

a signal amplification section that amplifies the voltage signal; and a comparison section that compares a voltage of the voltage signal amplified by the signal amplification section with a predetermined voltage, the voltage conversion section including:

an amplification circuit connected between the input node and the output node; and a feedback circuit connected between the input node and the output node, and a gate insulating film of at least one transistor included in the feedback circuit being thicker than gate insulating films of transistors included in the signal amplification section and the comparison section, the manufacturing method comprising forming the gate insulating film of at least one transistor included in the feedback circuit by local oxidation of silicon (LOCOS).

* * * * *